US009972629B2

(12) United States Patent
Nii

(10) Patent No.: US 9,972,629 B2
(45) Date of Patent: May 15, 2018

(54) SEMICONDUCTOR INTEGRATED CIRCUIT DEVICE

(71) Applicant: Renesas Electronics Corporation, Koutou-ku, Tokyo (JP)

(72) Inventor: Koji Nii, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/635,970

(22) Filed: Jun. 28, 2017

(65) Prior Publication Data

US 2017/0301678 A1    Oct. 19, 2017

Related U.S. Application Data

(63) Continuation of application No. 15/338,390, filed on Oct. 30, 2016, now Pat. No. 9,711,512, which is a (Continued)

(51) Int. Cl.
| | |
|---|---|
| *H01L 21/00* | (2006.01) |
| *H01L 27/11* | (2006.01) |
| *H01L 23/528* | (2006.01) |
| *H01L 29/78* | (2006.01) |
| *G11C 11/412* | (2006.01) |

(52) U.S. Cl.
CPC ........ *H01L 27/1104* (2013.01); *G11C 11/412* (2013.01); *H01L 23/528* (2013.01); *H01L 27/1116* (2013.01); *H01L 29/7851* (2013.01)

(58) Field of Classification Search
CPC ............. H01L 27/1104; H01L 29/7851; H01L 23/528; G11C 11/412
See application file for complete search history.

(56) References Cited

U.S. PATENT DOCUMENTS

| | | | |
|---|---|---|---|
| 4,616,347 A | 10/1986 | Bernstein | |
| 5,235,543 A * | 8/1993 | Rosen | G11C 8/16 365/154 |
| 6,493,256 B1 * | 12/2002 | Nii | G11C 11/412 365/154 |
| 6,535,453 B2 * | 3/2003 | Nii | G11C 7/18 257/E27.099 |

(Continued)

FOREIGN PATENT DOCUMENTS

| | | | | |
|---|---|---|---|---|
| EP | 3032540 A1 * | 6/2016 | .......... | H01L 27/1104 |
| EP | 3032540 A4 * | 3/2017 | .......... | H01L 27/1104 |

(Continued)

OTHER PUBLICATIONS

Office Action, dated Sep. 8, 2016, in Japanese Application No. 2015-530577.

(Continued)

*Primary Examiner* — Laura Menz
(74) *Attorney, Agent, or Firm* — Shapiro, Gabor and Rosenberger, PLLC

(57) ABSTRACT

In an image information chip or the like, a multi-port SRAM is embedded with a logic circuit. When the 3 port is used, the 1 port may serve as a differential write and readout port, and the 2 port may serve as a single ended readout dedicated port. While the occupied area of an embedded SRAM can be reduced, the number of write and readout ports is limited to only one, and readout characteristics as fast as differential readout cannot be expected in single ended readout. A new arrangement is therefore provided in which three differential write and readout ports are included in a memory cell structure of the embedded SRAM, an N-well region, for example, is arranged at the center of a cell, and a P-well region is arranged on both sides thereof.

7 Claims, 38 Drawing Sheets

Related U.S. Application Data continuation of application No. 14/909,135, filed as application No. PCT/JP2013/071213 on Aug. 6, 2013, now Pat. No. 9,515,076.

(56) References Cited

U.S. PATENT DOCUMENTS

| | | | | |
|---|---|---|---|---|
| 6,643,167 B2* | 11/2003 | Nii | G11C 5/005 | 365/154 |
| 6,710,412 B2* | 3/2004 | Tsukamoto | G11C 8/16 | 257/368 |
| 6,741,492 B2* | 5/2004 | Nii | G11C 11/4125 | 257/E27.099 |
| 6,791,200 B2* | 9/2004 | Nii | H01L 27/1104 | 257/206 |
| 6,807,081 B2* | 10/2004 | Nii | G11C 11/412 | 365/145 |
| 6,822,300 B2* | 11/2004 | Nii | G11C 15/04 | 257/390 |
| 7,269,056 B1* | 9/2007 | Liaw | G11C 5/063 | 257/903 |
| 7,271,454 B2* | 9/2007 | Hirano | H01L 21/84 | 257/379 |
| 7,382,026 B2* | 6/2008 | Hirano | H01L 21/84 | 257/368 |
| 7,471,545 B2* | 12/2008 | Nii | G11C 5/14 | 257/E21.661 |
| 7,599,214 B2* | 10/2009 | Nii | G11C 5/14 | 365/154 |
| 7,675,122 B2* | 3/2010 | Hirano | H01L 21/84 | 257/379 |
| 7,715,223 B2* | 5/2010 | Maeda | G11C 5/063 | 365/154 |
| RE41,638 E * | 9/2010 | Nii | G11C 11/4125 | 365/154 |
| 7,839,697 B2* | 11/2010 | Ishikura | G11C 7/065 | 365/154 |
| 7,969,766 B2* | 6/2011 | Nii | G11C 8/16 | 257/390 |
| 7,969,811 B2* | 6/2011 | Nii | G11C 7/18 | 365/230.03 |
| 7,999,385 B2* | 8/2011 | Ooka | H01L 27/0207 | 257/758 |
| 8,009,463 B2* | 8/2011 | Liaw | G11C 11/412 | 365/154 |
| 8,189,368 B2* | 5/2012 | Liaw | G11C 11/412 | 365/154 |
| 8,238,142 B2* | 8/2012 | Nii | G11C 8/16 | 257/390 |
| 8,305,836 B2* | 11/2012 | Nii | G11C 7/18 | 365/230.03 |
| 8,397,034 B1* | 3/2013 | Rezeanu | G11C 7/1075 | 711/152 |
| RE44,242 E * | 5/2013 | Nii | G11C 11/4125 | 365/154 |
| 8,576,655 B2* | 11/2013 | Chan | G11C 11/412 | 365/154 |
| 8,675,397 B2* | 3/2014 | Liaw | G11C 8/16 | 365/154 |
| 8,942,030 B2* | 1/2015 | Liaw | H01L 27/11 | 365/154 |
| 9,202,537 B2* | 12/2015 | Takahashi | G11C 7/065 | |
| 9,269,408 B2* | 2/2016 | Yamaki | G11C 5/148 | |
| 9,515,076 B2* | 12/2016 | Nii | H01L 27/1104 | |
| 9,711,512 B2* | 7/2017 | Nii | H01L 27/1104 | |
| 2001/0043487 A1 | 11/2001 | Nii et al. | | |
| 2002/0067637 A1* | 6/2002 | Nii | G11C 5/005 | 365/156 |
| 2002/0181274 A1* | 12/2002 | Nii | G11C 11/412 | 365/154 |
| 2003/0076731 A1* | 4/2003 | Terada | G11C 8/16 | 365/230.05 |
| 2003/0090924 A1* | 5/2003 | Nii | G11C 15/04 | 365/102 |
| 2003/0107913 A1* | 6/2003 | Nii | G11C 11/4125 | 365/154 |
| 2003/0112653 A1* | 6/2003 | Nii | G11C 5/005 | 365/154 |
| 2003/0230815 A1* | 12/2003 | Nii | H01L 27/1104 | 257/314 |
| 2004/0036088 A1* | 2/2004 | Tsukamoto | G11C 8/16 | 257/204 |
| 2005/0078546 A1* | 4/2005 | Hirano | H01L 21/84 | 365/232 |
| 2006/0262628 A1* | 11/2006 | Nii | G11C 5/063 | 365/226 |
| 2006/0289945 A1* | 12/2006 | Nii | G11C 5/14 | 257/393 |
| 2007/0257277 A1 | 11/2007 | Takeda et al. | | |
| 2008/0001226 A1* | 1/2008 | Hirano | H01L 21/84 | 257/351 |
| 2008/0013383 A1 | 1/2008 | Venkatraman et al. | | |
| 2008/0211035 A1* | 9/2008 | Hirano | H01L 21/84 | 257/379 |
| 2008/0212392 A1 | 9/2008 | Bauer | | |
| 2008/0308848 A1 | 12/2008 | Inaba | | |
| 2009/0091970 A1* | 4/2009 | Nii | G11C 5/14 | 365/154 |
| 2009/0116279 A1* | 5/2009 | Maeda | G11C 5/063 | 365/154 |
| 2009/0244950 A1* | 10/2009 | Nii | G11C 7/18 | 365/63 |
| 2011/0026289 A1 | 2/2011 | Liaw | | |
| 2011/0216615 A1* | 9/2011 | Nii | G11C 7/18 | 365/203 |
| 2011/0221007 A1* | 9/2011 | Nii | G11C 8/16 | 257/390 |
| 2012/0147662 A1* | 6/2012 | Yamaoka | G11C 11/417 | 365/156 |
| 2013/0326243 A1* | 12/2013 | Isoda | G06F 1/26 | 713/300 |
| 2014/0191338 A1* | 7/2014 | Nii | H01L 27/0207 | 257/401 |
| 2015/0035032 A1* | 2/2015 | Kang | H01L 27/228 | 257/295 |
| 2016/0181255 A1* | 6/2016 | Nii | H01L 27/1104 | 257/369 |
| 2017/0047332 A1* | 2/2017 | Nii | H01L 27/1104 | |
| 2017/0301678 A1* | 10/2017 | Nii | H01L 27/1104 | |

FOREIGN PATENT DOCUMENTS

| | | |
|---|---|---|
| JP | S59-231792 A | 12/1984 |
| JP | H04-345991 A | 12/1992 |
| JP | 2002-043441 A | 2/2002 |
| JP | 2003-132684 A | 5/2003 |
| JP | 2003-297953 A | 10/2003 |
| JP | 2008-176910 A | 7/2008 |
| JP | 2008-211077 A | 9/2008 |
| JP | 2008-288272 A | 11/2008 |
| JP | 2009-238332 A | 10/2009 |
| JP | 2011-035398 A | 2/2011 |
| JP | 2011-171753 A | 9/2011 |
| WO | WO 2005/119763 A1 | 12/2005 |
| WO | WO 2015019411 A1 * | 2/2015 .......... H01L 27/1104 |

OTHER PUBLICATIONS

International Search Report from International Patent Application No. PCT/JP2013/071213, dated Sep. 10, 2013.

Extended European search report for European Patent Application No. 13891121.9, dated Feb. 15, 2017.

* cited by examiner

SEMICONDUCTOR INTEGRATED CIRCUIT DEVICE

TECHNICAL FIELD

The present application relates to a semiconductor integrated circuit device (or semiconductor device), and can be applied to, for example, a static random access memory (SRAM) circuit and a device including the circuit.

BACKGROUND ART

JP-A-2011-171753 (PTL 1), U.S. Pat. No. 6,535,453 (PTL 2) corresponding thereto, JP-A-2003-297953 (PTL 3), U.S. Pat. No. 8,238,142 (PTL 4) corresponding thereto, or JP-A-2002-43441 (PTL 5) relates to a multi-port SRAM. The above documents disclose an SRAM circuit having a differential dual port or a triple port having two isolated single ended read ports, an SRAM layout in which the central portion of a cell is formed as an N-type well region and a P-type well region is arranged on both sides thereof, and the like.

Similarly, JP-A-2008-211077 (PTL 6) relates to a multi-port SRAM. The above document discloses an SRAM circuit of various types of triple port, and a cell layout corresponding thereto.

Similarly, JP-A-2011-35398 (PTL 7) or U.S. Pat. No. 8,009,463 (PTL 8) corresponding thereto relates to a multi-port SRAM. As an example of the cell layout of a dual-port SRAM, the above documents disclose an example in which a grounding line is arranged between bit lines in parallel thereto.

CITATION LIST

Patent Literature

[PTL 1] JP-A-2011-171753
[PTL 2] U.S. Pat. No. 6,535,453
[PTL 3] JP-A-2003-297953
[PTL 4] U.S. Pat. No. 8,238,142
[PTL 5] JP-A-2002-43441
[PTL 6] JP-A-2008-211077
[PTL 7] JP-A-2011-35398
[PTL 8] U.S. Pat. No. 8,009,463

DISCLOSURE OF THE INVENTION

Problems that the Invention is to Solve

For example, in a chip that processes image information or the like, a multi-port SRAM is mixed together with a logic circuit such as a digital signal processing circuit. In that case, for example, in case that the 3 port is used, the 1 port may serve as a differential write and readout port, and the 2 port may serve as a single ended readout dedicated port. However, in this configuration, it is obvious that there is a problem, in that while the occupied area of an embedded SRAM is reduced, the number of write and readout ports is limited to only one, and readout characteristics as fast as differential readout cannot be expected in single ended readout.

Although means and the like for solving such problems will be described below, other problems and novel features will be made clearer from the description and the accompanying drawings of the present specification.

Means for Solving the Problems

The following is a brief description of the summary of the representative embodiments disclosed in the present application.

That is, the outline of an embodiment of the present application is that three differential write and readout ports (transmission gate base) are included in a memory cell structure of an embedded SRAM, an N-well region, for example, is arranged at the center of a cell, and a P-well region is arranged on both sides thereof.

Effects of the Invention

The following is a brief description of an effect obtained by the representative embodiments disclosed in the present application.

That is, according to an embodiment of the present application, it is possible to secure a plurality of fast write and readout ports without considerably increasing the occupied area of a cell.

DESCRIPTION OF EMBODIMENTS

Figure 1:
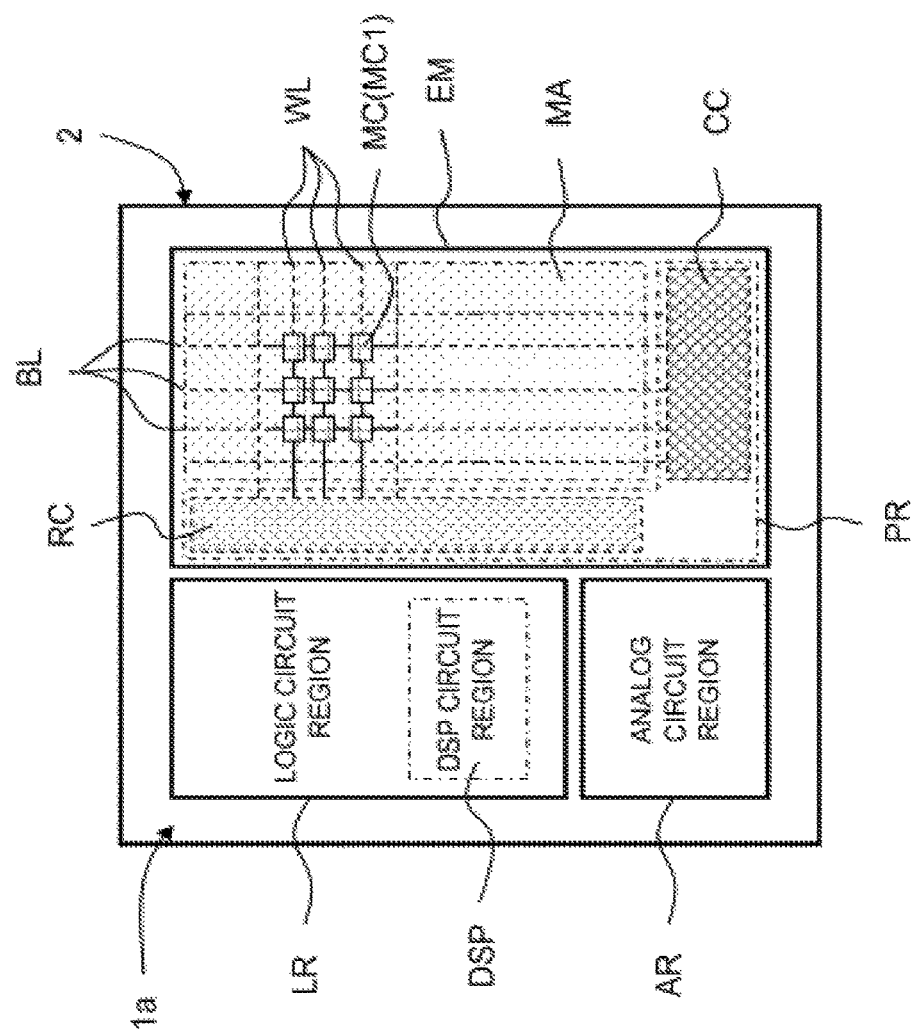
FIG. 1 is an overall diagram of a chip upper surface illustrating the outline of a layout of a memory mixed logic chip which is an example of a semiconductor chip in a semiconductor integrated circuit device of an embodiment of the present application.

1. Summary of the Embodiments and the Like 1-1. Summary of the Embodiments

First, summary of representative embodiments of the invention disclosed in the application will be described.
1. A semiconductor integrated circuit device including:
(a) a semiconductor substrate having a first main surface;
(b) an embedded SRAM region which is provided on the first main surface side of the semiconductor substrate;

(c) a memory cell arrangement region which is provided within the SRAM region; and (d) a large number of memory cell regions which are provided in a matrix within the memory cell arrangement region, wherein each memory cell region has a rectangular shape including a long side and a short side when seen in a plan view, each memory cell region including (d1) a first well region having a first conductivity type which is provided at a central portion, with respect to the long side, (d2) a second well region and a third well region having a second conductivity type which are provided on both sides of the first well region, with respect to the long side, (d3) a first bit line and a second bit line that extend in a direction perpendicular to the long side and form a mutually complementary pair, (d4) a third bit line and a fourth bit line that extend in a direction perpendicular to the long side and form a mutually complementary pair, and (d5) a fifth bit line and a sixth bit line that extend in a direction perpendicular to the long side and form a mutually complementary pair.

2. The semiconductor integrated circuit device according to item 1, wherein each memory cell region further includes:

(d6) a data storage unit;

(d7) a first storage node which is provided in the data storage unit;

(d8) a second storage node, provided in the data storage unit, which is complementary to the first storage node;

(d9) a first driver MISFET, provided in the data storage unit and the second well region, of which one of the source drain terminals thereof is connected to the first storage node;

(d10) a second driver MISFET, provided in the data storage unit and the third well region, of which one of the source drain terminals thereof is connected to the second storage node;

(d11) a first access MISFET, provided in the second well region, of which one of the source drain terminals thereof is connected to the first storage node and the other thereof is connected to the first bit line;

(d12) a second access MISFET, provided in the third well region, of which one of the source drain terminals thereof is connected to the second storage node and the other thereof is connected to the second bit line;

(d13) a third access MISFET, provided in the second well region, of which one of the source drain terminals thereof is connected to the first storage node and the other thereof is connected to the third bit line;

(d14) a fourth access MISFET, provided in the third well region, of which one of the source drain terminals thereof is connected to the second storage node and the other thereof is connected to the fourth bit line;

(d15) a fifth access MISFET, provided in the second well region, of which one of the source drain terminals thereof is connected to the first storage node and the other thereof is connected to the fifth bit line; and (d16) a sixth access MISFET, provided in the third well region, of which one of the source drain terminals thereof is connected to the second storage node and the other thereof is connected to the sixth bit line.

3. The semiconductor integrated circuit device according to item 2, wherein each memory cell region further includes:

(d17) a first active region that has the first driver MISFET and the first access MISFET formed therein, and has a rectangular shape extending into the second well region in a direction in which a longitudinal direction thereof is perpendicular to the long side;

(d18) a second active region that has the third access MISFET and the fifth access MISFET formed therein, and has a rectangular shape extending into the second well region in a direction in which a longitudinal direction thereof is perpendicular to the long side;

(d19) a third active region that has the second driver MISFET and the second access MISFET formed therein, and has a rectangular shape extending into the second well region in a direction in which a longitudinal direction thereof is perpendicular to the long side; and (d20) a fourth active region that has the fourth access MISFET and the sixth access MISFET formed therein, and has a rectangular shape extending into the second well region in a direction in which a longitudinal direction thereof is perpendicular to the long side.

4. The semiconductor integrated circuit device according to item 3, wherein each memory cell region further includes:

(d21) a first local interconnect that interconnects impurity regions of the first active region and the second active region; and (d22) a second local interconnect that interconnects impurity regions of the third active region and the fourth active region.

5. The semiconductor integrated circuit device according to item 3 or 4, wherein a width of the first active region is larger than a width of the second active region, and a width of the third active region is larger than a width of the fourth active region.

6. The semiconductor integrated circuit device according to any one of items 2 to 5, wherein the first driver MISFET, the second driver MISFET, the first access MISFET and the second access MISFET have threshold voltages higher than those of the third access MISFET, the fourth access MISFET, the fifth access MISFET and the sixth access MISFET.

7. The semiconductor integrated circuit device according to any one of items 2 to 6, wherein a planar positional relationship between the third access MISFET and the fifth access MISFET in a direction along the short side and a planar positional relationship between the fourth access MISFET and the sixth access MISFET in a direction along the short side are mutually reversed.

8. The semiconductor integrated circuit device according to any one of items 2 to 7, wherein each memory cell region further includes:

(d23) a first pull-up MISFET, provided in the data storage unit and the first well region, of which one of the source drain terminals thereof is connected to the first storage node;

(d24) a second pull-up MISFET, provided in the data storage unit and the first well region, of which one of the source drain terminals thereof is connected to the second storage node; and (d25) a power supply wiring which is connected to the other terminals of the first pull-up MISFET and the second pull-up MISFET, extends in a direction perpendicular to the long side, and is constituted by a first embedded wiring.

9. The semiconductor integrated circuit device according to any one of items 2 to 8, wherein each memory cell region further includes:

(d23) a first pull-up MISFET, provided in the data storage unit and the first well region, of which one of the source drain terminals thereof is connected to the first storage node; and (d24) a second pull-up MISFET, provided in the data storage unit and the first well region, of which one of the source drain terminals thereof is connected to the second storage node, and wherein all the MISFETs constituting each memory cell region are constituted by a fin type FET.

10. The semiconductor integrated circuit device according to item 9, wherein the first access MISFET and the second access MISFET are constituted by a fin type parallel FET.

11. The semiconductor integrated circuit device according to item 9, wherein the first driver MISFET, the second driver MISFET, the first access MISFET, and the second access MISFET are constituted by a fin type parallel FET.

12. The semiconductor integrated circuit device according to any one of items 1 to 11, wherein (x1) the third bit line and the fourth bit line of each memory cell region are different from the third bit line and the fourth bit line of a memory cell region adjacent to the memory cell region in a direction perpendicular to the long side, and (x2) the fifth bit line and the sixth bit line of each memory cell region are different from the fifth bit line and the sixth bit line of a memory cell region adjacent to the memory cell region in a direction perpendicular to the long side.

13. The semiconductor integrated circuit device according to item 12, wherein each memory cell region or any memory cell region which is vertically adjacent thereto further includes:

(d26) a first word line that extends in a direction parallel to the long side within the memory cell region, and controls the first access MISFET and the second access MISFET of the memory cell region;

(d27) a second word line that extends in a direction parallel to the long side within a memory cell region adjacent to a vertical direction of the memory cell region, and controls the third access MISFET and the fourth access MISFET of the adjacent memory cell region and the memory cell region; and (d28) a third word line that extends in a direction parallel to the long side within the memory cell region, and controls the fifth access MISFET and the sixth access MISFET of the memory cell region and a memory cell region which is vertically adjacent to the memory cell region.

14. The semiconductor integrated circuit device according to any one of items 3 to 13, wherein widths of the first active region, the second active region, the third active region and the fourth active region are equal to each other.

15. A semiconductor integrated circuit device including:

(a) a semiconductor substrate having a first main surface;

(b) an embedded SRAM region which is provided on the first main surface side of the semiconductor substrate;

(c) a memory cell arrangement region which is provided within the SRAM region; and (d) a large number of memory cell regions which are provided in a matrix within the memory cell arrangement region, wherein each memory cell region has a rectangular shape including a long side and a short side when seen in a plan view, each memory cell region including (d1) a first well region which is provided at a central portion with respect to the long side, (d2) a second well region and a third well region which are provided on both sides of the first well region with respect to the long side, (d3) a first bit line and a second bit line that extend in a direction perpendicular to the long side and form a mutually complementary pair, (d4) a third bit line and a fourth bit line that extend in a direction perpendicular to the long side and form a mutually complementary pair, and (d5) a fifth bit line and a sixth bit line that extend in a direction perpendicular to the long side, and do not form a mutually complementary pair.

16. The semiconductor integrated circuit device according to item 15, wherein each memory cell region further includes:

(d6) a data storage unit;

(d7) a first storage node which is provided in the data storage unit;

(d8) a second storage node, provided in the data storage unit, which is complementary to the first storage node;

(d9) a first driver MISFET, provided in the data storage unit and the second well region, of which one of the source drain terminals thereof is connected to the first storage node;

(d10) a second driver MISFET, provided in the data storage unit and the third well region, of which one of the source drain terminals thereof is connected to the second storage node;

(d11) a first access MISFET, provided in the second well region, of which one of the source drain terminals thereof is connected to the first storage node and the other thereof is connected to the first bit line;

(d12) a second access MISFET, provided in the third well region, of which one of the source drain terminals thereof is connected to the second storage node and the other thereof is connected to the second bit line;

(d13) a third access MISFET, provided in the second well region, of which one of the source drain terminals thereof is connected to the first storage node and the other thereof is connected to the third bit line;

(d14) a fourth access MISFET, provided in the third well region, of which one of the source drain terminals thereof is connected to the second storage node and the other thereof is connected to the fourth bit line;

(d15) a fifth access MISFET, provided in the second well region, of which one of the source drain terminals thereof is connected to the first storage node and the other thereof is connected to the fifth bit line; and (d16) a sixth access MISFET, provided in the third well region, of which one of the source drain terminals thereof is connected to the second storage node and the other thereof is connected to the sixth bit line.

17. The semiconductor integrated circuit device according to item 16, wherein each memory cell region further includes:

(d17) a first active region that has the first driver MISFET and the first access MISFET formed therein, and has a rectangular shape extending into the second well region in a direction in which a longitudinal direction thereof is perpendicular to the long side;

(d18) a second active region that has the third access MISFET and the fifth access MISFET formed therein, and has a rectangular shape extending into the second well region in a direction in which a longitudinal direction thereof is perpendicular to the long side;

(d19) a third active region that has the second driver MISFET and the second access MISFET formed therein, and has a rectangular shape extending into the second well region in a direction in which a longitudinal direction thereof is perpendicular to the long side; and (d20) a fourth active region that has the fourth access MISFET and the sixth access MISFET formed therein, and has a rectangular shape extending into the second well region in a direction in which a longitudinal direction thereof is perpendicular to the long side.

18. The semiconductor integrated circuit device according to item 17, wherein each memory cell region further includes:

(d21) a first local interconnect that interconnects impurity regions of the first active region and the second active region; and (d22) a second local interconnect that interconnects impurity regions of the third active region and the fourth active region.

19. The semiconductor integrated circuit device according to item 17 or 18, wherein a width of the first active region is larger than a width of the second active region, and a width of the third active region is larger than a width of the fourth active region.

20. The semiconductor integrated circuit device according to item 16, wherein each memory cell region or any memory cell region which is vertically adjacent thereto further includes:

(d23) a first word line that extends in a direction parallel to the long side within the memory cell region, and controls the first access MISFET and the second access MISFET of the memory cell region;

(d24) a second word line that extends in a direction parallel to the long side in a boundary region between the memory cell region and a vertical adjacent memory cell region or in the vicinity thereof, and controls the third access MISFET and the fourth access MISFET of these memory cell regions;

(d25) a third word line that extends in a direction parallel to the long side within the memory cell region, and controls the fifth access MISFET of the memory cell region and a vertical adjacent memory cell region; and (d26) a fourth word line that extends in a direction parallel to the long side within the memory cell region and a vertical adjacent memory cell region, and controls the sixth access MISFET of these memory cell regions.

1-2. Explanation of Description Form, Basic Terminology, and Use Thereof in the Present Application 1. In the present application, the description of an embodiment may be such that the embodiment is divided into a plurality of sections, if necessary, in the description thereof for the sake of convenience. However, they are by no means independent of or distinct from each other unless particularly explicitly described otherwise, and one of the individual parts of a single example is details, variations, and so forth of part or the whole of the others. In principle, the repetition of like portions will be omitted. Each component in the embodiment is not indispensable unless particularly explicitly described otherwise, unless the component is theoretically limited to a specific number, and unless it is obvious from the context that the component is indispensable.

Further, in case that the term "semiconductor device" or "semiconductor integrated circuit device" as used herein is mentioned in the present application, the device principally refers to a semiconductor device or semiconductor integrated circuit device in which, in addition to various single-element transistors (active elements) and various transistors which are main components, resistors, capacitors, and the like are integrated over a semiconductor chip or the like (such as, for example, a mono-crystalline silicon substrate), or in which a semiconductor chip or the like is packaged.

Here, as an exemplary representative of the various transistors, there can be illustrated a metal insulator semiconductor field effect transistor (MISFET) represented by a metal oxide semiconductor field effect transistor (MOSFET). At this time, as an exemplary representative of an integrated circuit structure, there can be illustrated a complementary metal insulator semiconductor (CMIS) integrated circuit represented by a complementary metal oxide semiconductor (CMOS) integrated circuit which is a combination of an N-channel type MISFET and a P-channel type MISFET.

It is considered that a wafer process for a present-day semiconductor integrated circuit device, that is, large scale integration (LSI) is normally divided into two processes. That is, the first process is a front end of line (FEOL) process from the loading of a silicon wafer as a raw material to a premetal process (process including the formation of an interlayer insulating film or the like between the lower end of an M1 wiring layer and a gate electrode structure, the formation of a contact hole, tungsten plug, burial, and the like). The second process is a back end of line (BEOL) process starting from the formation of the M1 wiring layer, and ending at the formation of a pad opening in a final passivation film on an aluminum-based pad electrode (the above process is also included in a wafer level packaging process).

Meanwhile, in the present application, for the sake of convenience, focusing on the layer of an interlayer insulating film, a wiring and a via belonging to the same interlayer insulating film are denoted by the same layer name. That is, the via between a first-layer embedded wiring and a second-layer embedded wiring is a second-layer via.

2. Likewise, even in case that such wording as "X constituted by A" is used in association with a material, a composition, or the like in the description of the embodiment or the like, it does not exclude a material, a composition, or the like which contains an element other than A as one of the main components thereof unless particularly explicitly described otherwise, and unless it is obvious from the context that it excludes such a material, a composition, or the like. For example, in case that a component is mentioned, the wording means "X containing A as a main component" or the like. It goes without saying that, even in case that "silicon member" or the like is mentioned, it is not limited to pure silicon, and a member containing a SiGe alloy, another multi-element alloy containing silicon as a main component, another additive, or the like is also included.

Likewise, even in case that a "silicon oxide film", a "silicon oxide-based insulating film", or the like is mentioned, it includes not only a relatively pure undoped silicon oxide (Undoped Silicon Dioxide), but also an insulating film containing other silicon oxides as a main component. For example, an impurity-doped silicon oxide-based insulating film such as a TEOS-based silicon oxide, phosphorus silicate glass (PSG), or borophosphosilicate glass (BPSG) is also a silicon oxide film. Further, in addition to a thermal oxide film and a CVD oxide film, a coated film such as spin on glass (SOG) or nano-clustering silica (NSC) is also a silicon oxide film or a silicon oxide-based insulating film. Besides, a Low-k insulating film such as fluorosilicate glass (FSG), silicon oxicarbide (SiOC), a carbon-doped silicon oxide, or organosilicate glass (OSG) is also a silicon oxide film or a silicon oxide-based insulating film. Further, a silica-based Low-k insulating film (porous insulating film, including a molecular porous medium in case that "porous" is mentioned) obtained by introducing voids into the same member as mentioned above is also a silicon oxide film or a silicon oxide-based insulating film.

In addition, as a silicon-based insulating film which is commonly used in a semiconductor field along with a silicon oxide-based insulating film, there is a silicon nitride-based insulating film. Materials belonging to this group include SiN, SiCN, SiNH, SiCNH, and the like. Here, in case that "silicon nitride" is mentioned, it includes both of SiN and SiNH unless particularly explicitly described otherwise. Likewise, in case that "SiCN" is mentioned, it includes both of SiCN and SiCNH unless particularly explicitly described otherwise.

Meanwhile, SiC has properties similar to those of SiN, but SiON, in most cases, should rather be categorized as a silicon oxide-based insulating film, while the compound is close to SiC, SiN or the like in case that it is used as an etching stop film.

A silicon nitride film is frequently used as an etching stop film, that is, a contact etch-stop layer (CESL) in a self-aligned contact (SAC) technique, and is also used as a stress applying film in a stress memorization technique (SMT).

3. When the term "wafer" as used herein is mentioned, it typically refers to a mono-crystalline silicon wafer on which a semiconductor integrated circuit device (the same is true of a semiconductor device or an electronic device) is formed, but it goes without saying that the "wafer" also includes a composite wafer of an insulating substrate and a semiconductor layer or the like, such as an epitaxial wafer, a SOI substrate, or an LCD glass substrate.

4. It goes without saying that, although a preferred example is illustrated in association with a graphical figure, a position, an attribute, or the like, the graphical figure, position, or attribute is not strictly limited thereto unless particularly explicitly described otherwise, and unless it is obvious from the context that the graphical figure, position, or attribute is strictly limited thereto. Therefore, for example, "square" includes substantially square (the same is true of "rectangular"), "orthogonal" includes substantially orthogonal, and "coincident" includes substantially coincident. This is also the same as in "parallel" and "right-angled". Therefore, for example, deviation of approximately 10 degrees from completely parallel belongs to parallel.

In addition, regarding a certain region, in case that "whole", "entire", "whole area", and the like are mentioned, such terms include "substantially whole", "substantially entire", "substantially whole area", and the like. Therefore, for example, more than 80% of a certain region can be referred to as "whole", "entire", and "whole area". This is also the same as in "entire circumference", "entire length", and the like.

Further, regarding an existing shape, in case that "rectangular" is mentioned, such a term includes "substantially rectangular". Therefore, for example, in case that the area of a portion different from a rectangular shape is less than approximately 20% of the entirety, such a shape can be termed rectangular. In this case, this is also the same as in "annular" or the like. In this instance, in case that an annular body is split, a part into which a spilt elemental part is inner-inserted or outer-inserted is a portion of the annular body.

In addition, regarding periodicity, "periodic" includes substantially periodic. In case that the deviation of a period is less than approximately 20%, for example, with respect to individual elements, the individual elements can be said to be "periodic". Further, in case of elements falling out of this range are, for example, less than approximately 20% of all the subject elements for the periodicity, they can be said to be "periodic" as a whole.

Meanwhile, the definitions of this section are general. In case that there are different definitions in the following individual descriptions, the parts herein have priority to the individual descriptions. However, unless parts which are not specified in the individual descriptions are explicitly contradicted, the definitions, regulations and the like of this section are effective.

5. Further, in case that a specific numerical value or numerical amount is mentioned, it may be either more or less than the specific numerical value unless particularly explicitly described otherwise, unless the numerical value is theoretically limited to such a number, and unless it is obvious from the context that the numerical value is limited to such a number.

6. In the present application, a "data storage unit (regarding a memory cell)" refers to a portion that holds data within an SRAM memory cell, and a portion except for an access MISFET, a word line, a bit line, and the like.

In addition, a "local interconnect" refers to an interconnect which is obtained by arranging a tungsten plug for a normal contact or the like so as to be relatively long, and is used as an interconnection wiring (so-called, zeroth layer wiring) or the like between two or more impurity regions on a semiconductor substrate.

Further, a "width (regarding rectangular)" refers to a width in a short side direction, that is, a width perpendicular to a long side (longitudinal direction). Normally, the width is equal to a length of a short side.

In addition, a "height (regarding a memory cell)" refers to a length of a short side in a case of a substantially rectangular memory cell. Specifically, the height is a width of a memory cell measured along the extending direction of a bit line.

An "up-and-down direction (regarding a memory cell)" is an extending direction of a bit line.

"High or low (regarding a threshold voltage)" means "high" in case that the absolute value thereof is large and is "low" on the contrary, assuming that the signs of the value are the same as each other.

Unlike a "planar gate type MISFET", MISFETs having a three-dimensional channel structure are also called a "fin type MISFET" or the like, but there are similar structures, and there is also a variety of classification. Therefore, in the present application, these are assumed to be called a "fin type MISFET" in a broad sense, inclusive of a fin type, a pi-gate type, a Ω-gate type, a tri-gate type, a gate-all-around type, and the like in a narrow sense.

Regarding this, a "fin type parallel MISFET" means that a plurality of fin type MISFETs are connected in parallel to each other, and are used like one MISFET. Particularly, a case of distinction from a non-parallel configuration, this is referred to as a "fin type non-parallel MISFET".

2. Further Detailed Description of the Embodiments

A further detailed description of the embodiments will be given. In each of the drawings, the same or similar portions are designated by the same or similar reference numerals or signs, and a description thereof will not be repeated in principle.

In addition, in the accompanying drawings, hatching or the like may be omitted even in a cross section in case that hatching or the like results in complicated illustration or in case that the distinction between the section to be hatched and a vacant space is distinct. In this connection, even a two-dimensionally closed hole may have a background outline thereof omitted in case that it is obvious from the description or the like that the hole is two-dimensionally closed and so on. Further, even a portion other than a cross section may be hatched to clearly show that the hatched portion is not a vacant space.

Meanwhile, regarding the designation in a case of a choice between the two, in case that one side is called "first" or the like, and the other side is called "second" or the like, they are illustrated correspondingly according to a representative embodiment. For example, it goes without saying that even in a case of "first", this is not limited to the illustrated choice.

2-1. Description of Memory Mixed Logic Chip or the Like which is an Example of Semiconductor Chip in Semiconductor Integrated Circuit Device According to an Embodiment of the Present Application (Mainly FIGS. 1 and 2)

It goes without saying that a chip layout shown in this section is an example of a semiconductor integrated circuit device to which a cell layout described in Section (2-2) is applied, and can also be used variously in forms other than this. Hereinafter, an embedded SRAM will be specifically described mainly byway of example, but it goes without saying that the following various types of example can also be applied to a general-purpose SRAM, that is, a non-embedded SRAM such as a dedicated SRAM.

In addition, the chip layout or the like serves as a basis for the following all basic examples and modification examples, and thus in the following modification examples or the like, the description thereof will be not repeated in principle.

Hereinafter, a multi-port memory cell having a transmission gate based access MISFET configuration, that is, a non-isolated multi-port memory cell will be specifically described by way of example. However, it goes without saying that the memory cell can also be applied to a multi-port memory cell having an isolated read-port or the like. This multi-port memory cell having a transmission gate based access MISFET configuration has an advantage capable of using any port (regarding a differential port) in a write operation. On the other hand, provision with an isolated read-port gives rise to the possibility of simultaneous access to the same cell for the purpose of write and readout, in addition to the degree of integration being high.

Figure 2:
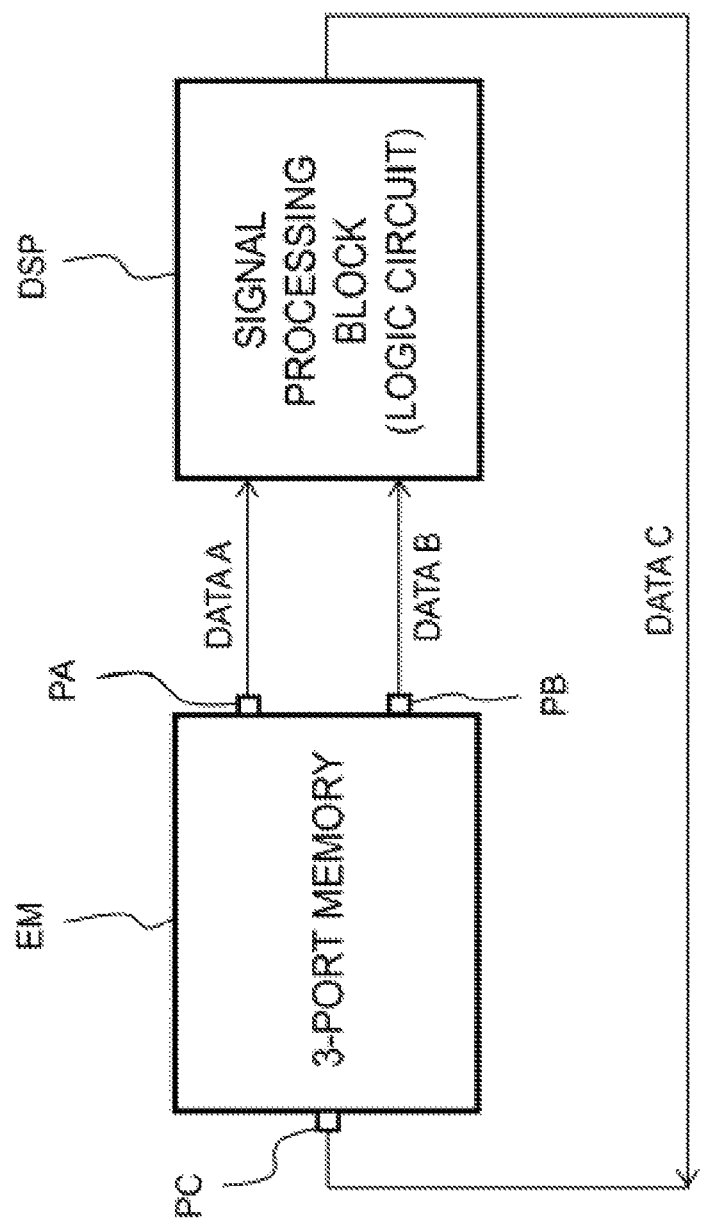
FIG. 2 is a circuit block diagram illustrating an example of a relationship between an embedded SRAM region EM and a digital signal processing circuit region DSP which are shown in FIG. 1.

FIG. 1 is an overall diagram of a chip upper surface illustrating the outline of a layout of a memory mixed logic chip which is an example of a semiconductor chip in a semiconductor integrated circuit device of an embodiment of the present application. FIG. 2 is a circuit block diagram illustrating an example of a relationship between an embedded SRAM region EM and a digital signal processing circuit region DSP shown in FIG. 1. The memory mixed logic chip or the like which is an example of the semiconductor chip in the semiconductor integrated circuit device of an embodiment of the present application will be described with reference to these drawings.

As shown in FIG. 1, for example, an analog circuit region AR for processing an analog signal regarding an image or the like is provided on a first main surface 1a or a surface (device surface) of an SRAM mixed logic chip 2 (semiconductor substrate). Similarly, a logic circuit region LR for performing digital logic processing is provided on the first main surface 1a of the chip 2. For example, a digital signal processing circuit region DSP for processing a digital signal is provided within the logic circuit region LR. Further, the embedded SRAM region EM for receiving a static random access memory (SRAM) circuit is provided on the first main surface 1a of the chip 2. In this example, a SRAM circuit having a 3-port configuration (referred to as a "3-port SRAM circuit") is received in the SRAM region EM.

The embedded SRAM region EM can be divided into a memory array region MA and a memory peripheral circuit region PR. A large number of memory cell regions MC (MC1) are arrayed in a matrix in the memory array region MA (memory cell arrangement region). Further, in the memory array region MA, a large number of word lines WL for controlling each of the memory cell regions MC in a traverse direction are traversed, and a large number of bit lines BL for readout or write of data are cut longitudinally in a vertical direction.

The memory peripheral circuit region PR is provided with a row control circuit RC that controls the word line WL or the like and a column control circuit region CC that controls readout or write of data through the bit line BL.

Next, FIG. 2 illustrates an example of a relationship between the digital signal processing circuit region DSP and the 3-port SRAM circuit EM in FIG. 1. As shown in FIG. 2, for example, data A received in the 3-port SRAM circuit EM is read out through an A port PA, data B which is then read out through a B port PB is processed in a digital operation manner in the digital signal processing circuit region DSP and serves as data C, and this data is received in the 3-port SRAM circuit EM in a C port PC. Normally, in image processing or the like, such a series of processes are repeated at high speed.

2-2. Description of Basic Cell Layout (Full Complementary Bit Line Configuration 3 Ports) of Embedded SRAM in Semiconductor Integrated Circuit Device of the Embodiment of the Present Application (Mainly FIGS. 3 to 6)

In this section, the cell layout of a full complementary bit line configuration 3-port SRAM serving as a basis for modification examples described in Section (2-3) and subsequent sections will be described in light of those described in Section (2-1).

In addition, here, a description will be given of a (transfer gate based multi-port) 3-port embedded SRAM having the number of ports increased in which a full complementary metal insulator semiconductor (CMIS)-type standard 6-transistor SRAM memory cell serves as a basis, and a transfer MISFET is added to such a memory cell as an access transistor. However, it goes without saying that the memory cell may be other types of SRAM cell. In addition, the number of ports may be four or more without being limited to three, and may be two.

Meanwhile, basically all the MISFETs used with the exception of Sections (2-10) to (2-12) may be planar gate types, but it goes without saying that fin type MISFETs may be used in some or all thereof.

Hereinafter, in order to clarify description, regarding the embedded memory region, a three-layer metal wiring structure will be specifically described by way of example, but the total number of interconnect layers may be four or more, and may be a number other than four. Meanwhile, in the following example, an embedded wiring is a copper-based embedded wiring based on a damascene method or the like, but may be a silver-based wiring or other embedded wirings without being limited to the copper-based embedded wiring.

In addition, the wiring base is not limited to the embedded wiring, and may be a non-embedded wiring like an aluminum-based wiring.

Figure 3:
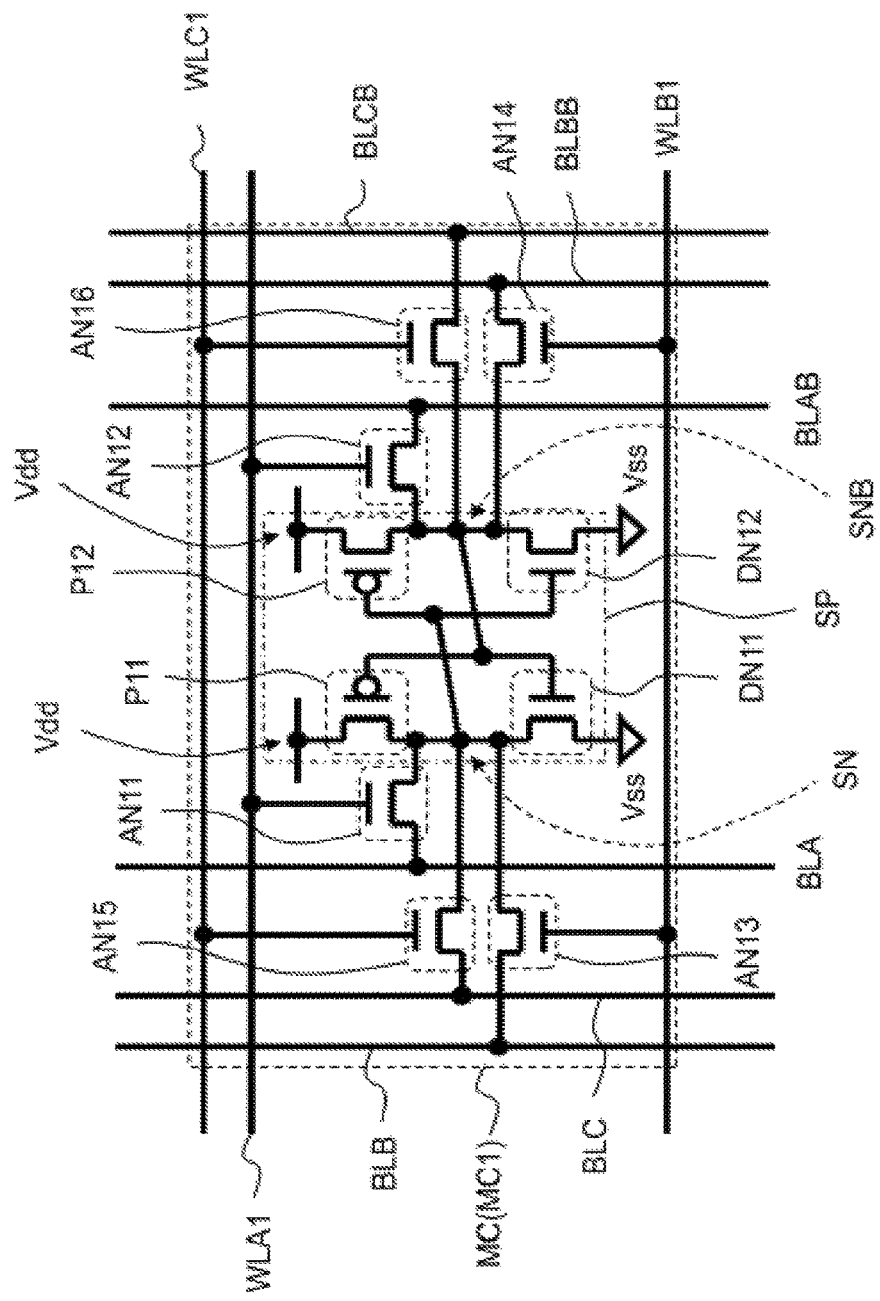
FIG. 3 is a schematic circuit diagram of a memory cell region MC of FIG. 1 illustrating a basic cell layout (full complementary bit line configuration 3 port) of the embedded SRAM in the semiconductor integrated circuit device of the embodiment of the present application.
Figure 4:
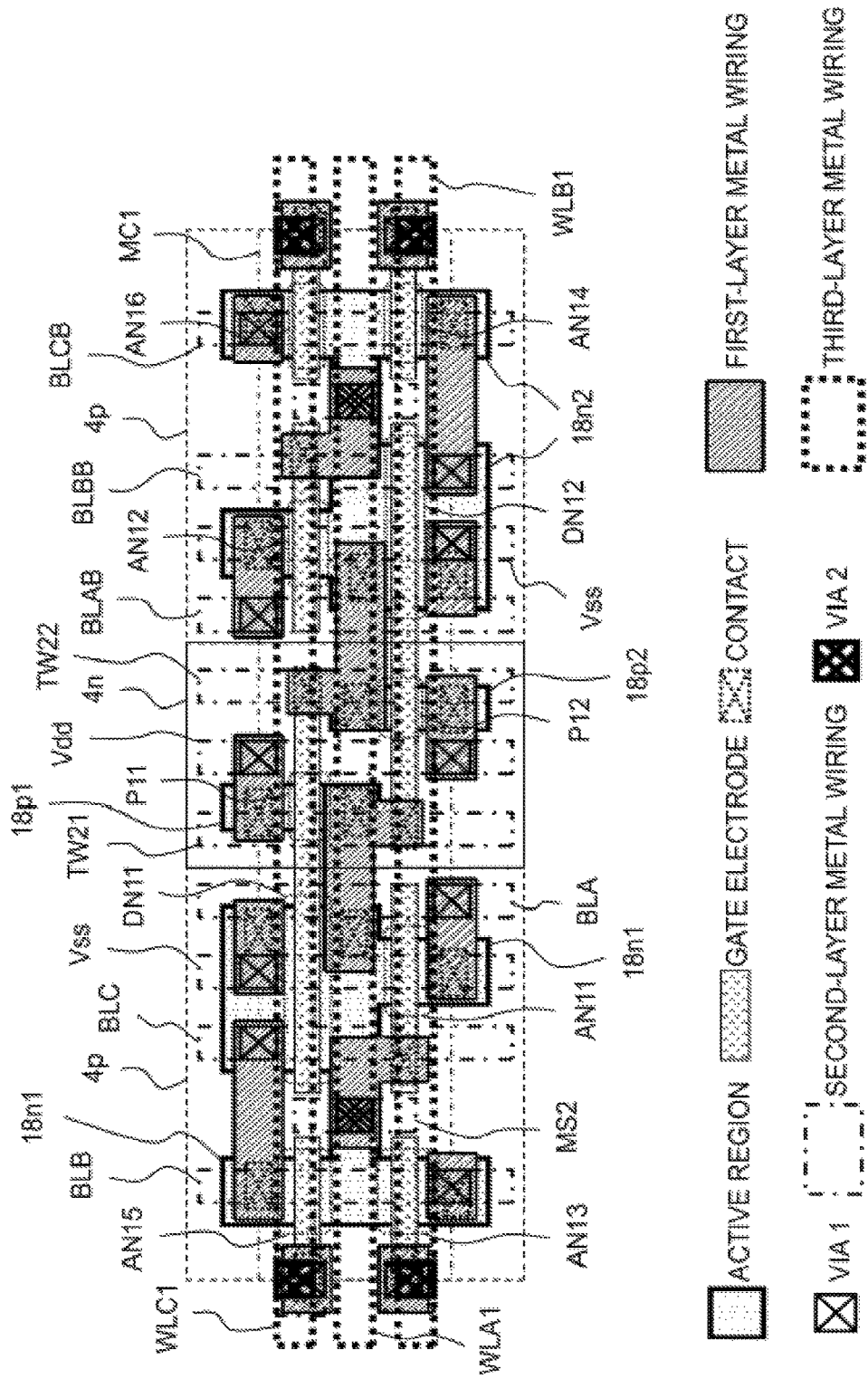
FIG. 4 is an enlarged planar layout diagram (displaying up to a third-layer embedded wiring) of the memory cell region MC of FIG. 1 corresponding to FIG. 3.
Figure 5:
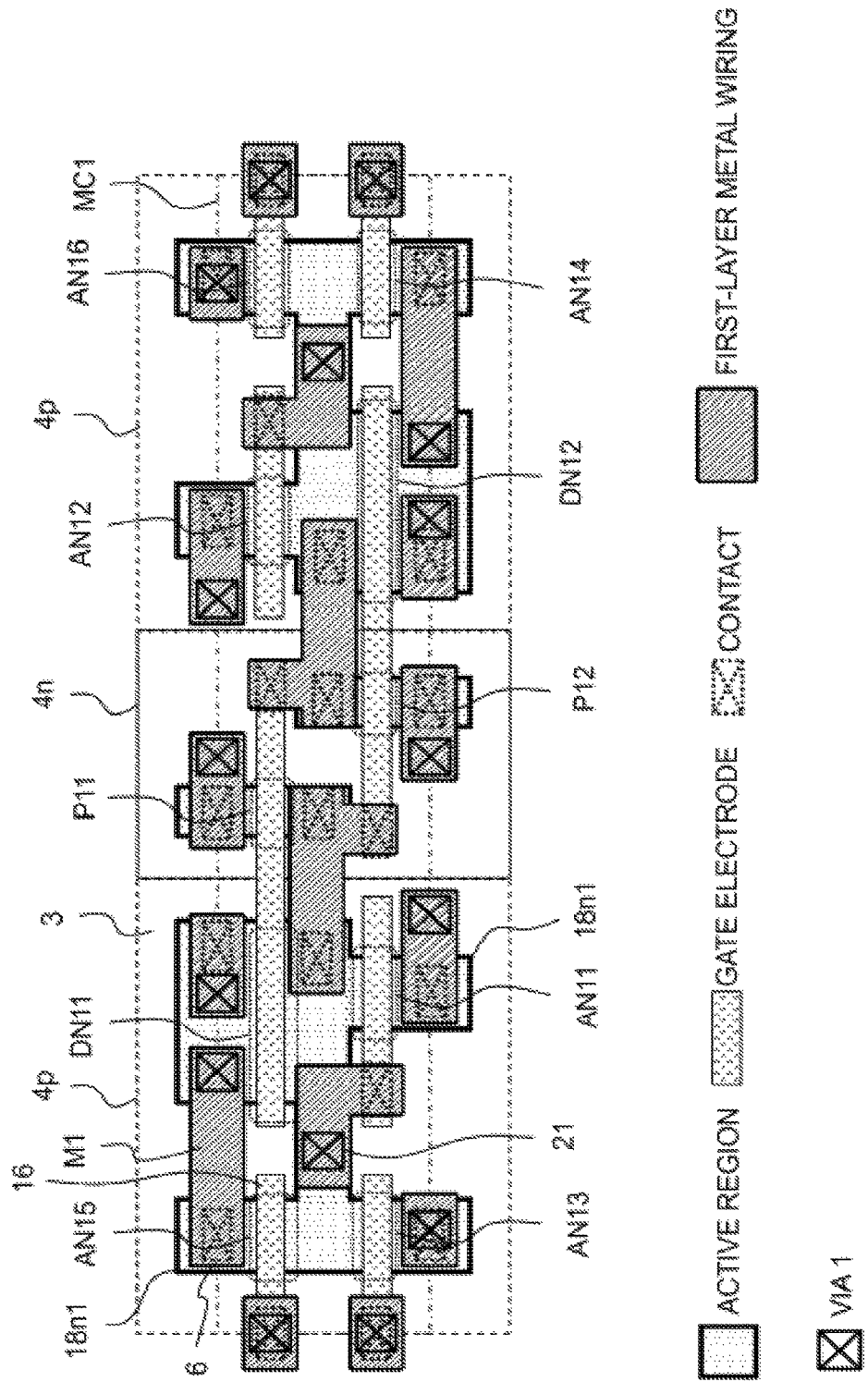
FIG. 5 is an enlarged planar layout diagram (displaying up to a 1-2 interlayer via 21) of the memory cell region MC of FIG. 1 corresponding to FIG. 4.
Figure 6:
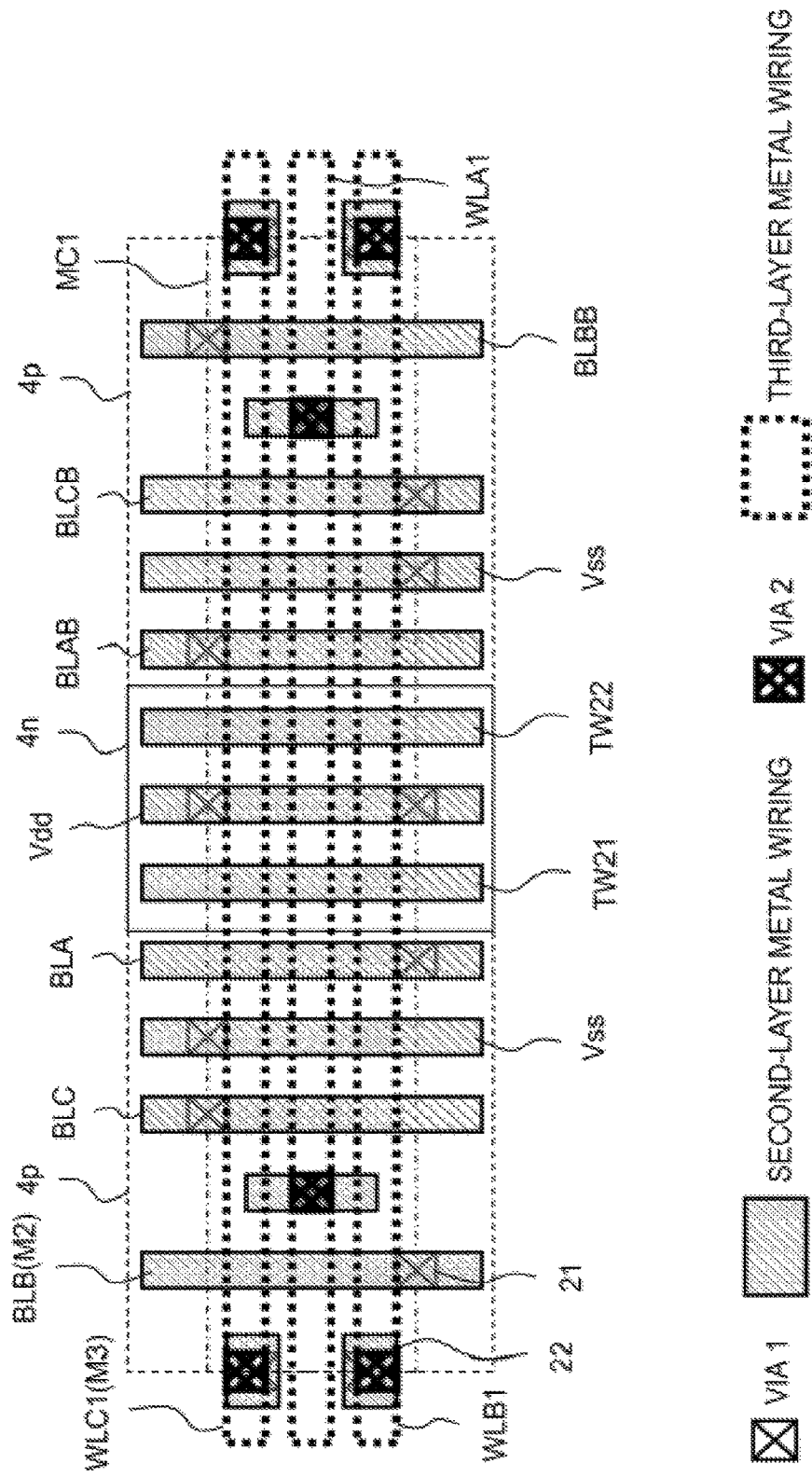
FIG. 6 is an enlarged planar layout diagram (mainly displays a second-layer embedded wiring M2 and a third-layer embedded wiring M3) of the memory cell region MC of FIG. 1 corresponding to FIG. 4.

FIG. 3 is a schematic circuit diagram of the memory cell region MC of FIG. 1 illustrating a basic cell layout (full complementary bit line configuration 3 port) of the embedded SRAM in the semiconductor integrated circuit device of the embodiment of the present application. FIG. 4 is an enlarged planar layout diagram (displaying up to a third-layer embedded wiring) of the memory cell region MC of FIG. 1 corresponding to FIG. 3. FIG. 5 is an enlarged planar layout diagram (displaying up to a 1-2 interlayer via 21) of the memory cell region MC of FIG. 1 corresponding to FIG. 4. FIG. 6 is an enlarged planar layout diagram (mainly displaying a second-layer embedded wiring M2 and a third-layer embedded wiring M3) of the memory cell region MC of FIG. 1 corresponding to FIG. 4. The basic cell layout (full complementary bit line configuration 3 port) of the embedded SRAM in the semiconductor integrated circuit device of the embodiment of the present application will be described with reference to these drawings.

First, the circuit configuration of the memory cell MC will be described with reference to FIG. 3 (this memory cell is generally called a "full CMOS cell" or the like). As shown in FIG. 3, a data storage unit SP of the memory cell region MC (MC1) is provided with P-channel type pull-up MISFETs (P11, P12). One of the source drain terminals thereof is connected to a power supply wiring Vdd, and the other thereof is connected to a true storage node SN and a complementary storage node SNB. One of the source drain terminals of a first driver MISFET, that is, an N-channel type driver MISFET (DN11) is connected to the true storage node SN, and the other thereof is connected to a ground wiring Vss. On the other hand, one of the source drain terminals of a second driver MISFET, that is, an N-channel type driver MISFET (DN12) is connected to the complementary storage node SNB, and the other thereof is connected to the ground wiring Vss. Here, the gate electrodes of the P-channel type pull-up MISFET (P11) and the N-channel type driver MISFET (DN11) are connected to the complementary storage node SNB, and the gate electrodes of the P-channel type pull-up MISFET (P12) and the N-channel type driver MISFET (DN12) are connected to the true storage node SN.

An A port word line WLA1, a B port word line WLB1 and a C port word line WLC1 are provided within the memory cell region MC in a row direction (X-axis direction or traverse direction). The gate electrodes of first and second access MISFETs, that is, N-channel type access MISFETs (AN11, AN12) are connected to the A port word line WLA1. Similarly, the gate electrodes of third and fourth access MISFETs, that is, N-channel type access MISFETs (AN13, AN14) are connected to the B port word line WLB1. Further, the gate electrodes of fifth and sixth access MISFETs, that is, N-channel type access MISFETs (AN15, AN16) are connected to the C port word line WLC1.

On the other hand, an A port true bit line BLA (first bit line) and an A port complementary bit line BLAB (second bit line) forming a pair complementary thereto are provided within the memory cell region MC in a column direction (Y-axis direction, vertical direction or up-and-down direction). One of the source drain terminals of the N-channel type access MISFET (AN11) is connected to the A port true bit line BLA, and the other thereof is connected to the true storage node SN (first storage node). On the other hand, one of the source drain terminals of the N-channel type access MISFET (AN12) is connected to the A port complementary bit line BLAB, and the other thereof is connected to the complementary storage node SNB (second storage node), to thereby form a complementary A port (complementary write and readout port).

In addition, a B port true bit line BLB (third bit line) and a B port complementary bit line BLBB (fourth bit line) forming a pair complementary thereto are provided within the memory cell region MC in the column direction. One of the source drain terminals of the N-channel type access MISFET (AN13) is connected to the B port true bit line BLB, and the other thereof is connected to the true storage node SN. On the other hand, one of the source drain terminals of the N-channel type access MISFET (AN14) is connected to the B port complementary bit line BLBB, and the other thereof is connected to the complementary storage node SNB, to thereby form a complementary B port (complementary write and readout port).

Further, a C port true bit line BLC (fifth bit line) and a C port complementary bit line BLCB (sixth bit line) forming a pair complementary thereto are provided within the memory cell region MC in the column direction. One of the source drain terminals of the N-channel type access MISFET (AN15) is connected to the C port true bit line BLC, and the other thereof is connected to the true storage node SN. On the other hand, one of the source drain terminals of the N-channel type access MISFET (AN16) is connected to the C port complementary bit line BLCB, and the other thereof is connected to the complementary storage node SNB, to thereby form a complementary C port (complementary write and readout port).

Next, an example of a specific planar layout corresponding to FIG. 3 will be described with reference to FIGS. 4, 5 and 6. As shown in FIGS. 4, 5 and 6, in this example, the memory array region MA (FIG. 1) has a structure in which the horizontally-long rectangular memory cell regions MC1 (MC) are arranged periodically in a matrix (an operation such as reversion may be performed on a portion thereof depending on the circumstances of the layout). Hereinafter, the basic concept of the layout is summarized as follows. That is, (1) An N-type well region 4n (first well region of a first conductivity type) for forming the first and second pull-up MISFETs, that is, the P-channel type pull-up MISFETs (P11, P12) is arranged at the central portion of the memory cell region MC1. In this example, a P-type well region 4p (second well region of a second conductivity type) for forming the N-channel type driver MISFET (DN11) and the N-channel type access MISFETs (AN11, AN13, AN15) is arranged on the left side of the N-type well region 4n. Similarly, another P-type well region 4p (third well region of the second conductivity type) for forming the N-channel type driver MISFET (DN12) and the N-channel type access MISFETs (AN12, AN14, AN16) is arranged on the right side of the N-type well region 4n. Meanwhile, the right and left P-type well regions 4p may be connected to each other.

(2) In this example, active regions 18p1 and 18p2 having a P-type source drain region and the like formed therein have vertically-long rectangular shapes, respectively, are geometrically isolated from each other by an STI region 3 (element isolation region), and are arranged within the N-type well region 4n. In this example, within active regions 18n1 and 18n2 having an N-type source drain region and the like formed therein, the active region 18n1 for forming the N-channel type driver MISFET (DN11) and the N-channel type access MISFETs (AN11, AN13, AN15) has a complex polygonal shape including an integral concave portion, and is provided in the left P-type well region 4p. On the other hand, in this example, the active region 18n2 for forming the N-channel type driver MISFET (DN12) and the N-channel type access MISFETs (AN12, AN14, AN16) has a complex polygonal shape including an integral concave portion, and is provided in the right P-type well region 4p.

(3) Respective gate electrodes 16 extend in a traverse direction so as to traverse the corresponding active regions 18n1, 18n2, 18p1, and 18p2.

(4) In this example, relatively short interconnection within the memory cell region MC1 is mainly formed in a first embedded wiring M1. The first embedded wiring M1 is formed by, for example, a single damascene method. In addition, in this example, the first embedded wiring M1 is also used as an intermediate metal layer between upper and lower conductive layers.

(5) Contacts between the respective gate electrodes 16, the first embedded wiring M1 and the like, and the corresponding active regions 18n1, 18n2, 18p1, and 18p2 (source drain regions of the portions thereof) are placed with a contact portion 6 (specifically, for example, tungsten plug) interposed therebetween.

(6) In this example, relatively long wirings in the vertical direction such as second-layer through wirings TW21 and TW22 passing over the embedded SRAM region EM within the respective bit lines BLA, BLB, BLC, BLAB, BLBB, and BLCB, the power supply wiring Vdd, the ground wiring Vss, a signal wiring for, for example, a logic circuit, and the like are formed by the second-layer embedded wiring M2. The second-layer embedded wiring M2 is formed by, for example, a dual damascene method. In addition, in this example, the second-layer embedded wiring M2 is also used as an intermediate metal layer between upper and lower conductive layers.

In addition, in this example, the above embedded wiring is arranged between the bit lines brought close to the ground wiring Vss by the second-layer embedded wiring M2, which leads to a shielding effect.

Further, in this example, on the N-type well region of the memory cell central portion, a second-layer through wiring such as a signal wiring which is not directly related to the SRAM region due to the second-layer embedded wiring M2 is cause to run in parallel to the power supply wiring. Thereby, there is an advantage capable of using a wiring located at a relatively low layer as a longitudinally-cut signal line.

(7) Each of the first embedded wirings M1 and the second-layer embedded wiring M2 are connected to each other by the 1-2 interlayer via 21.

(8) In this example, each of the word lines WLA1, WLB1, and WLC1 is formed by the third-layer embedded wiring M3. The third-layer embedded wiring M3 is formed by, for example, a dual damascene method.

(9) Each of the second-layer embedded wiring M2 and the third-layer embedded wiring M3 are connected to each other by a 2-3 interlayer via 22.

As described above, in the embedded 3-port SRAM, since an N-well region is arranged at the central portion of the horizontally-long rectangular memory cell region, a P-well region is arranged on both sides, and each port is formed as a differential bit line configuration, and thus it is possible to secure the characteristics of fast write and readout with respect to each port (transmission gate base) while keeping an increase in chip occupied area to a minimum.

2-3. Description of Modification Example 1 (Active Region Equi-Width Type 3 Ports) Relating to Cell Layout of Embedded SRAM in Semiconductor Integrated Circuit Device of the Embodiment of the Present Application (Mainly FIGS. 7 and 8)

In this section, a description will be given of a modification example relating to the cell layout of the example described in Sections (2-1) and (2-2).

The following example is basically the same as those described in FIGS. 1 to 6, and in principle, only different portions will be described below. This is also the same as in the following other modification examples.

This example can be combined with various types of example, but can be combined with, for example, one or a plurality of Sections (2-5) to (2-12).

Figure 7:
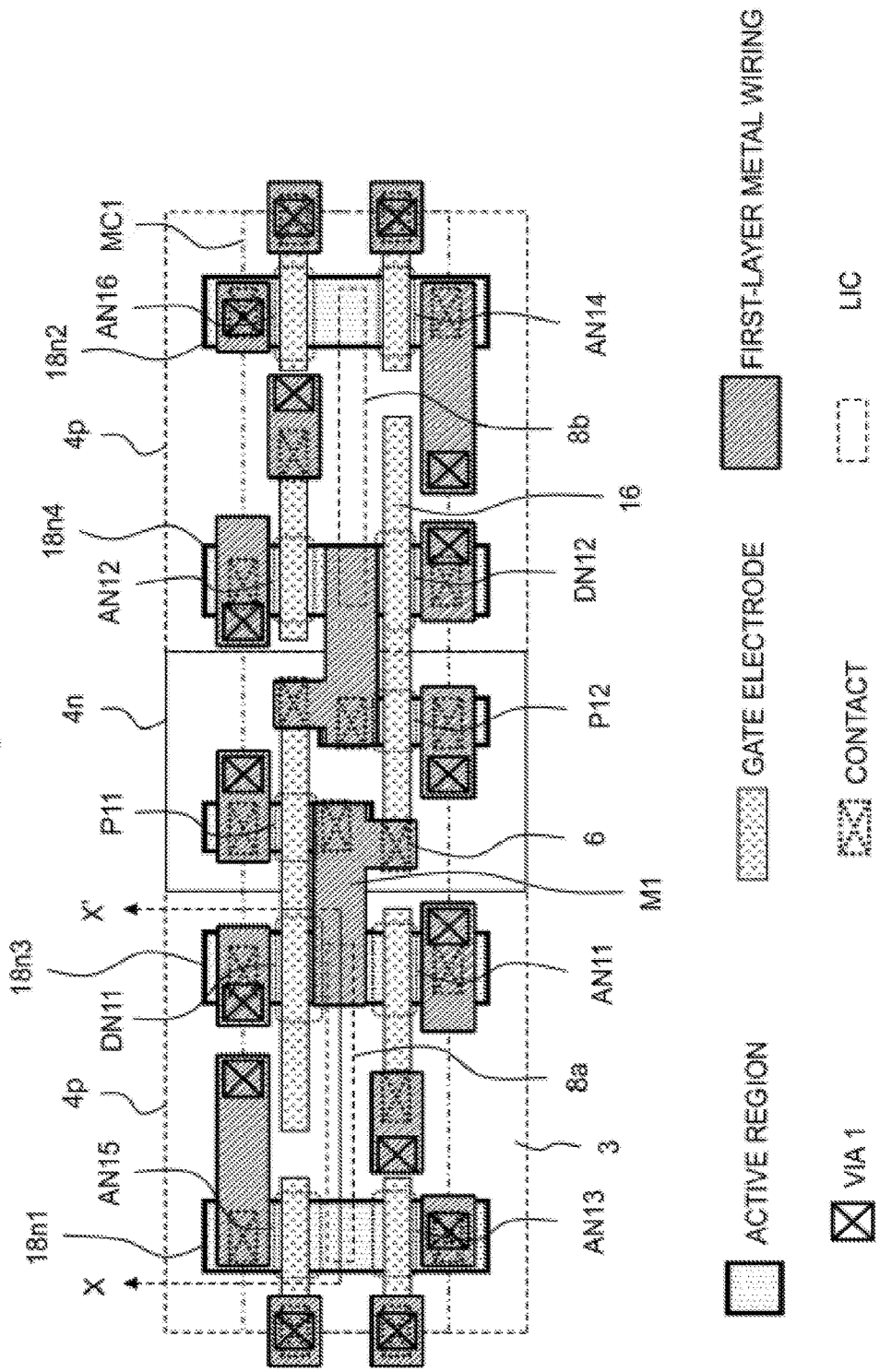
FIG. 7 is an enlarged planar layout diagram (displaying up to the 1-2 interlayer via 21) of the memory cell region MC of FIG. 1 corresponding to FIG. 5 for illustrating Modification Example 1 (active region equi-width type 3 port) relating to the cell layout of the embedded SRAM in the semiconductor integrated circuit device of the embodiment of the present application.
Figure 8:
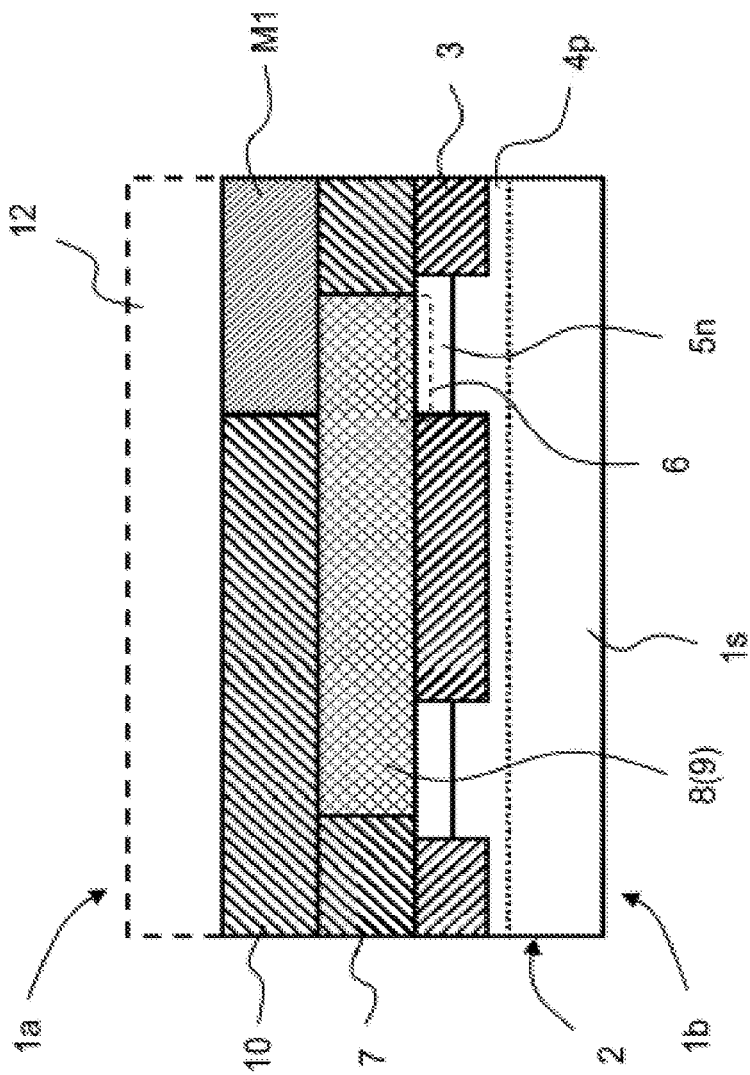
FIG. 8 is a device cross-sectional view corresponding to the X-X' cross-section of FIG. 7.

FIG. 7 is an enlarged planar layout diagram (displaying up to the 1-2 interlayer via 21) of the memory cell region MC of FIG. 1 corresponding to FIG. 5 for illustrating Modification Example 1 (active region equi-width type 3 port) relating to the cell layout of the embedded SRAM in the semiconductor integrated circuit device of the embodiment of the present application. FIG. 8 is a device cross-sectional view corresponding to the X-X' cross-section of FIG. 7. Modification Example 1 (active region equi-width type 3 port) relating to the cell layout of the embedded SRAM in the semiconductor integrated circuit device of the embodiment of the present application will be described with reference to these drawings.

This layout is basically the same as those illustrated in FIGS. 3 to 6, but is different therefrom, in that the shapes of the active region within the P-type well region 4p are different from each other as shown in FIGS. 7 and 8, and that a local interconnect (LIC) as described in detail in FIG. 8 is used. That is, (1) In this example, active regions 18n1, 18n2, 18n3, and 18n4 having the N-type source drain region and the like formed therein have vertically-long rectangular shapes, respectively, are geometrically isolated from each other by the STI region 3 (element isolation region), and are arranged vertically long within the P-type well region 4p. In this example, the widths of the respective active regions 18n1, 18n2, 18n3, and 18n4 (second active region, fourth active region, first active region, and third active region) become equal to each other. Thereby, lithography is facilitated.

(2) As a result of the active regions 18n1 and 18n3 and the active regions 18n2 and 18n4 being isolated from each other, these active regions are interconnected to each other, and LICs, that is, local interconnects 8a and 8b (first local interconnect and second local interconnect) are used.

Next, the X-X' cross-section of FIG. 7 is shown in FIG. 8. As shown in FIG. 8, the chip 2 (FIG. 1) is formed on, for example, a P-type single crystal silicon semiconductor substrate is. For example, the P-type well region 4p is provided thereon, and a shallow trench isolation (STI) region 3 is provided on the surface thereof. The surface of the semiconductor substrate is having no STI region 3 is formed as an active region, and a portion thereof is provided with a high-concentration N-type source drain region 5n.

A premetal insulating film 7 constituted by, for example, a silicon oxide-based insulating film or the like is formed on the surface 1a (opposite surface to a rear surface 1b) of the semiconductor substrate 1s, and a local interconnect 8, that is, a tungsten plug 9 is buried therein. A first-layer interlayer insulating film 10 constituted by, for example, a silicon oxide-based insulating film or the like (for example, non-porous-based Low-k insulating film) is formed on the premetal insulating film 7 and the local interconnect 8, and the copper-based first embedded wiring M1, for example, is buried therein. Meanwhile, the local interconnect 8 (tungsten plug 9) and the high-concentration N-type source drain region 5n are electrically connected to each other in the contact portion 6 (with the substrate or the gate electrode). An upper multilayer interconnect layer 12 constituted by, for example, a silicon oxide-based insulating film or the like (for example, porous-based Low-k insulating film) is formed on the first-layer interlayer insulating film 10 and the first embedded wiring M1.

As described above, basically all the active regions for forming the N-channel type MISFET (planar gate type in this example) constituting each memory cell are formed in a vertically-long rectangular shape, and the widths thereof are made to be equal to each other, which leads to an advantage of fine processing being facilitated.

In addition, the local interconnect is used in the interconnection between a plurality of active regions, which leads to an advantage of the first embedded wiring or the like being cut by a separator.

Meanwhile, the width equalization of the active regions may be applied to not only the N-channel type MISFET, but also the P-channel type MISFET constituting each memory cell. That is, basically all the active regions for forming the P-channel type MISFET (planar gate type in this example) constituting each memory cell are formed in a vertically-long rectangular shape, and the widths thereof are made to be equal to the width of the active region for forming the N-channel type MISFET. This leads to an advantage of fine processing being further facilitated.

Meanwhile, as compared to the examples of FIG. 4 and the like, in the examples of FIG. 7 and the like, the active region within the P-type well region is formed relatively simply in a rectangular structure (independently of width or length), and thus is suitable to fine processing. In addition, the lengths (vertical directions) become the same as each other, and thus the active region is also suitable to fine processing in this point.

2-4. Description of Modification Example 2 (a Port-Based N-Channel Type MISFET Active Region Wide-Width Type Ports) Relating to Cell Layout of Embedded SRAM in Semiconductor Integrated Circuit Device of the Embodiment of the Present Application (Mainly FIG. 9)

The description in this section belongs to the modification example relating to the cell layout of the examples described in Sections (2-1) and (2-2), but can also be regarded as the modification example of the example described directly in Section (2-3). An example described herein is basically the same as the example described in Section (2-3), and thus in principle, only different portions will be described below.

This example can be combined with various types of example, but can be combined with, for example, one or a plurality of Sections (2-5) to (2-9).

Figure 9:
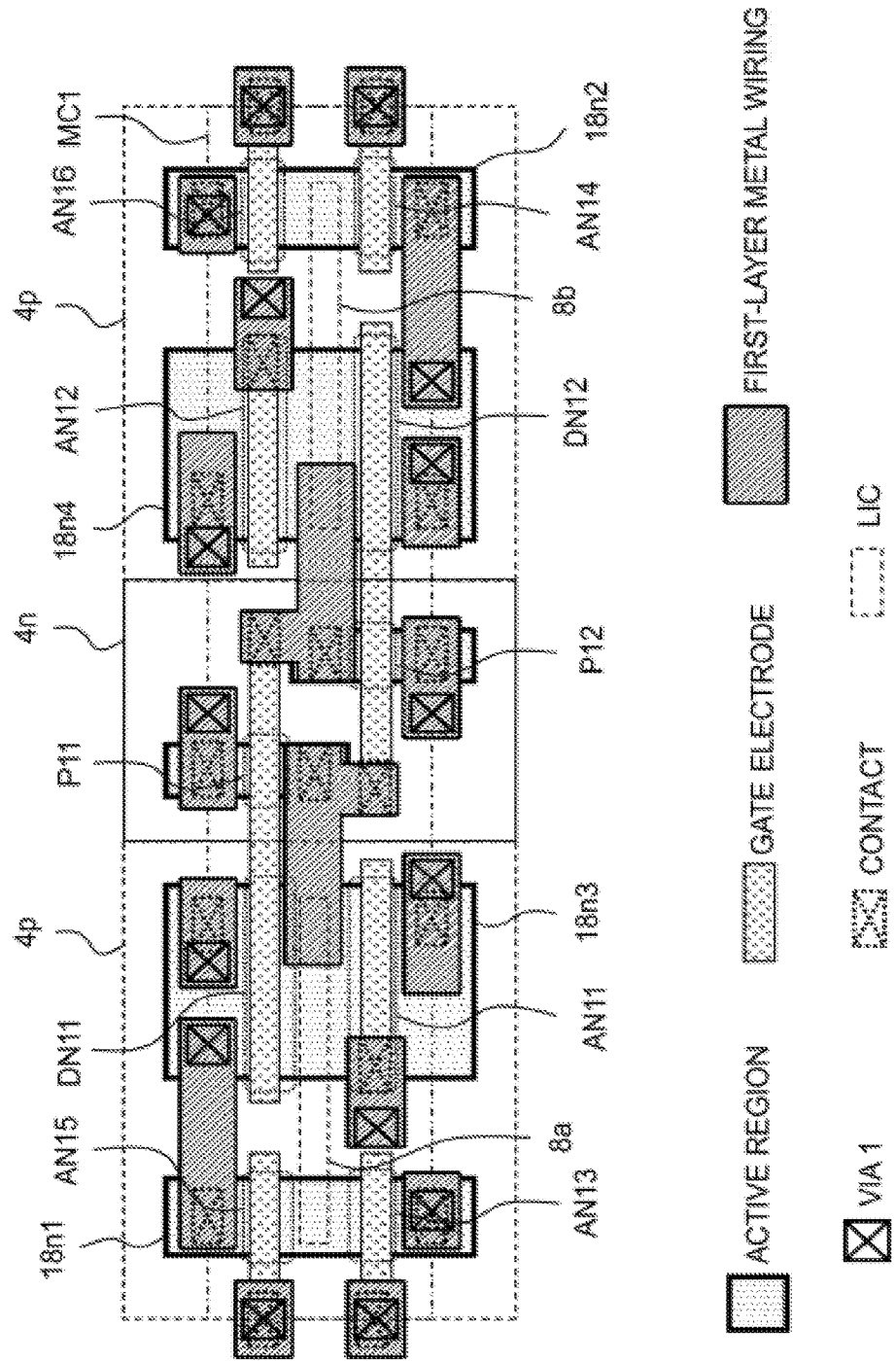
FIG. 9 is an enlarged planar layout diagram (displaying up to the 1-2 interlayer via 21) of the memory cell region MC of FIG. 1 corresponding to FIG. 7 for illustrating Modification Example 2 (A port-based N-channel type MISFET active region wide-width type 3 port) relating to the cell layout of the embedded SRAM in the semiconductor integrated circuit device of the embodiment of the present application.

FIG. 9 is an enlarged planar layout diagram (displaying up to the 1-2 interlayer via 21) of the memory cell region MC of FIG. 1 corresponding to FIG. 7 for illustrating Modification Example 2 (A port-based N-channel type MISFET active region wide-width type 3 port) relating to the cell layout of the embedded SRAM in the semiconductor integrated circuit device of the embodiment of the present application. Modification Example 2 (A port-based N-channel type MISFET active region wide-width type 3 port) relating to the cell layout of the embedded SRAM in the semiconductor integrated circuit device of the embodiment of the present application will be described with reference to this drawing.

This example is basically the same as those described in FIGS. 7 and 8. However, as shown in FIG. 9, this example is different therefrom, in that the widths of the active regions 18n3 and 18n4 for forming the N-channel type driver MISFETs (DN11, DN12) and the N-channel type access MISFETs (AN11, AN12) become larger than the widths of the active regions 18n1 and 18n2 for forming the N-channel type access MISFETs (AN13, AN14, AN15, AN16).

As described above, the width of the active region of the A port-based N-channel type MISFET constituting each memory cell is made to be larger than the width of the active region of the B and C port-based N-channel type MISFET, thereby allowing the drive capability of the A port-based driver transistor or the access transistor to be improved, which lead to an improvement in the speed of readout and write. In addition, it is possible to expect an improvement in the characteristics of a static noise margin (SNM).

2-5. Description of Modification Example 3 (a Port-Based High Vth-B&C Port-Based Low Vth Type 3 Ports) Relating to Cell Layout of Embedded SRAM in Semiconductor Integrated Circuit Device of the Embodiment of the Present Application (Mainly FIG. 10)

An example described in this section is a modification example relating to the cell layout of the examples described in Sections (2-1) and (2-2). The example described herein is basically the same as the examples described in Sections (2-1) and (2-2), and in principle, only different portions will be described below.

The feature of this example is in that a threshold voltage of a portion of a plurality of N-channel type MISFETs constituting a cell is made relatively high. On the other hand, in examples other than this, primarily, the threshold voltage of the plurality of N-channel type MISFETs constituting a cell is set to be at basically the same level. However, as in this example, a difference may be provided to the threshold voltage in various types of mode. Meanwhile, in this example, a specific description will be given of a mode in which the threshold voltages of the N-channel type driver MISFETs (DN11, DN12) and the N-channel type access MISFETs (AN11, AN12) are made relatively high, but it goes without saying that a mode may be used in which the threshold voltages are made relatively high by a combination of MISFETs other than that.

In addition, this example can be combined with various types of example, but can be combined with, for example, one or a plurality of Sections (2-2) to (2-4) and Sections (2-6) to (2-12).

Figure 10:
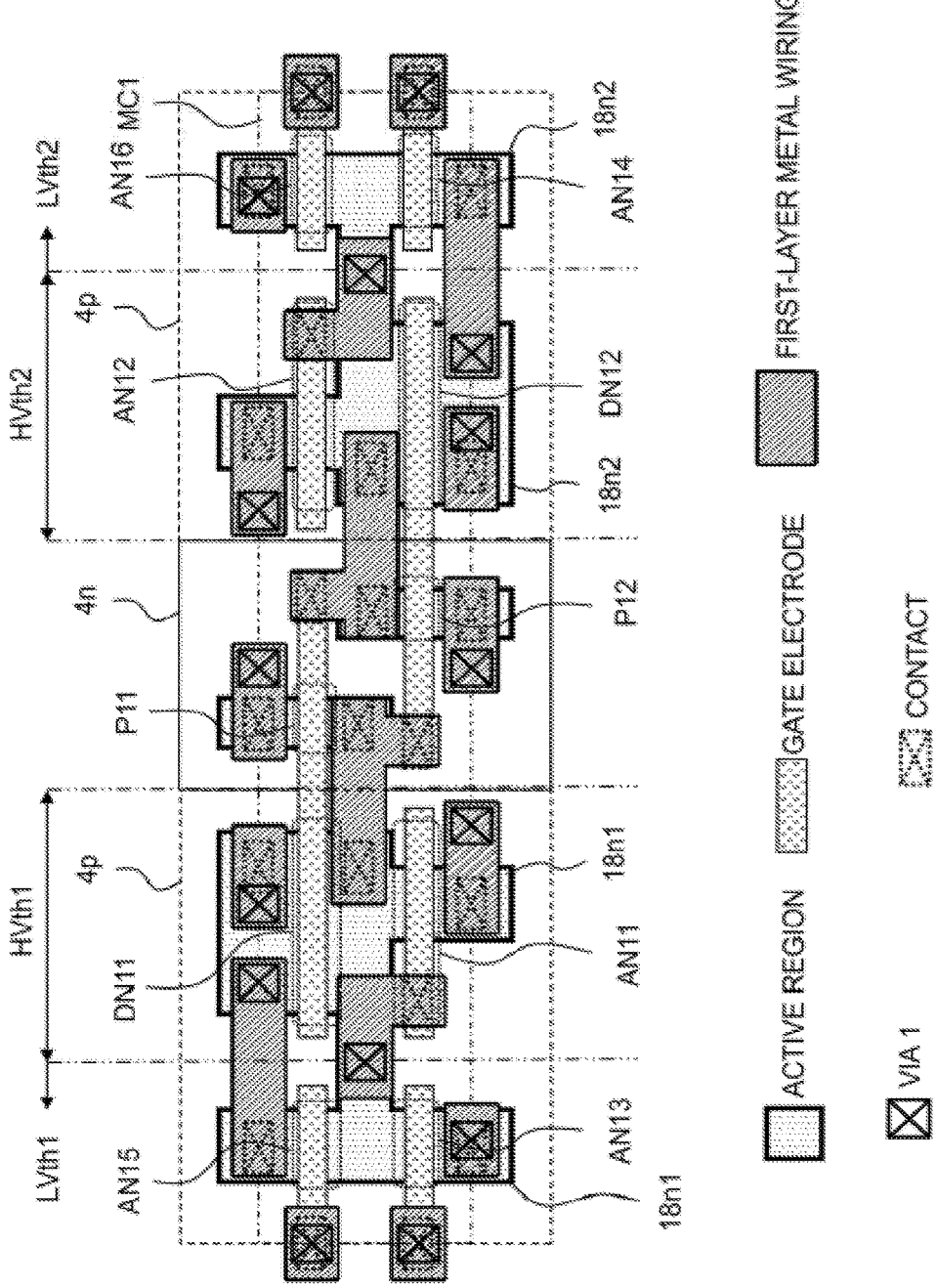
FIG. 10 is an enlarged planar layout diagram (displaying up to the 1-2 interlayer via 21) of the memory cell region MC of FIG. 1 corresponding to FIG. 5 for illustrating Modification Example 3 (A port-based high Vth-B&C port-based low Vth type 3 port) relating to the cell layout of the embedded SRAM in the semiconductor integrated circuit device of the embodiment of the present application.

FIG. 10 is an enlarged planar layout diagram (displaying up to the 1-2 interlayer via 21) of the memory cell region MC of FIG. 1 corresponding to FIG. 5 for illustrating Modification Example 3 (A port-based high Vth-B&C port-based low Vth type 3 port) relating to the cell layout of the embedded SRAM in the semiconductor integrated circuit device of the embodiment of the present application. Modification Example 3 (A port-based high Vth-B&C port-based low Vth type 3 port) relating to the cell layout of the embedded SRAM in the semiconductor integrated circuit device of the embodiment of the present application will be described with reference to this drawing.

This example is basically the same as those described in FIGS. 3 to 6, but is different therefrom, in that, as shown in FIG. 10, the P-type well region 4p is divided into high Vth regions HVth1 and HVth2 of which the threshold voltage is relatively high and low Vth regions LVth1 and LVth2 of which the threshold voltage is relatively low. That is, the threshold voltages of the N-channel type driver MISFETs (DN11, DN12) and the N-channel type access MISFETs (AN11, AN12) are made relatively high, and the threshold voltages of the N-channel type access MISFETs (AN13, AN14, AN15, AN16) are made relatively low.

As described above, the threshold voltage of the A port-based N-channel type MISFET constituting each memory cell is set to be relatively higher than the threshold voltage of the B and C port-based N-channel type MISFET, and thus it is possible to reduce an A port-based leakage current, and to perform relatively fast readout and fast write on the B and C port bases.

2-6. Description of Modification Example 4 (Low-Height Cell Structure 3 Ports) Relating to Cell Layout of Embedded SRAM in Semiconductor Integrated Circuit Device of the Embodiment of the Present Application (Mainly FIGS. 11 to 17)

The description in this section belongs to the modification example relating to the cell layout of the examples described in Sections (2-1) and (2-2), but can also be regarded as the modification example of the example described directly in Section (2-3).

An example described herein is basically the same as those described in FIGS. 7 and 8, and thus in principle, only different portions will be described below.

In addition, this example can be combined with various types of example, but can be combined with, for example, one or a plurality of Sections (2-2) to (2-5) and Sections (2-7) to (2-12).

Figure 11:
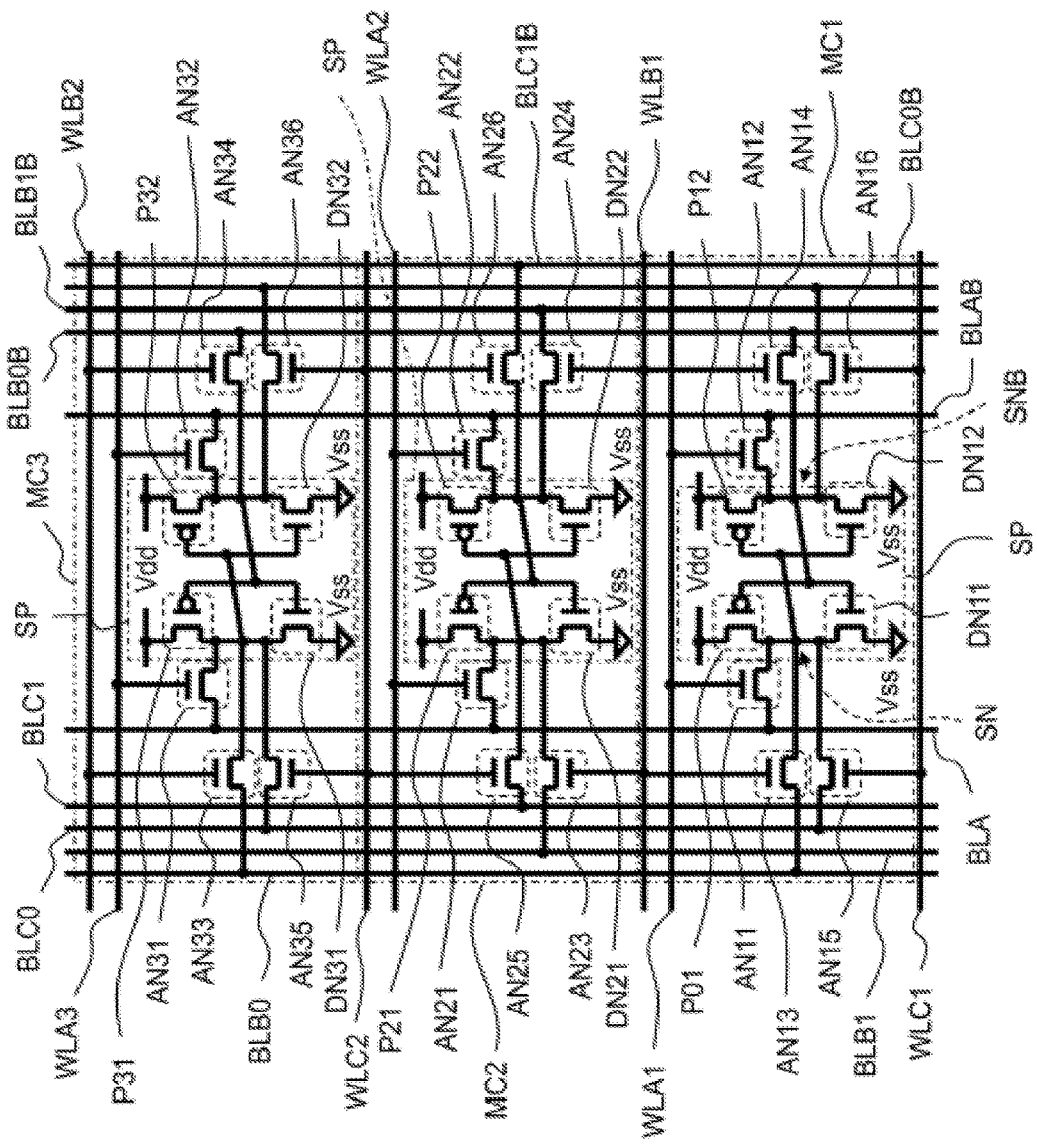
FIG. 11 is a schematic circuit diagram (displaying three cells in a vertical direction, that is, a bit line direction) of the memory cell region MC of FIG. 1 corresponding to FIG. 3 for illustrating Modification Example 4 (low-height cell structure 3 port) relating to the cell layout of the embedded SRAM in the semiconductor integrated circuit device of the embodiment of the present application.
Figure 12:
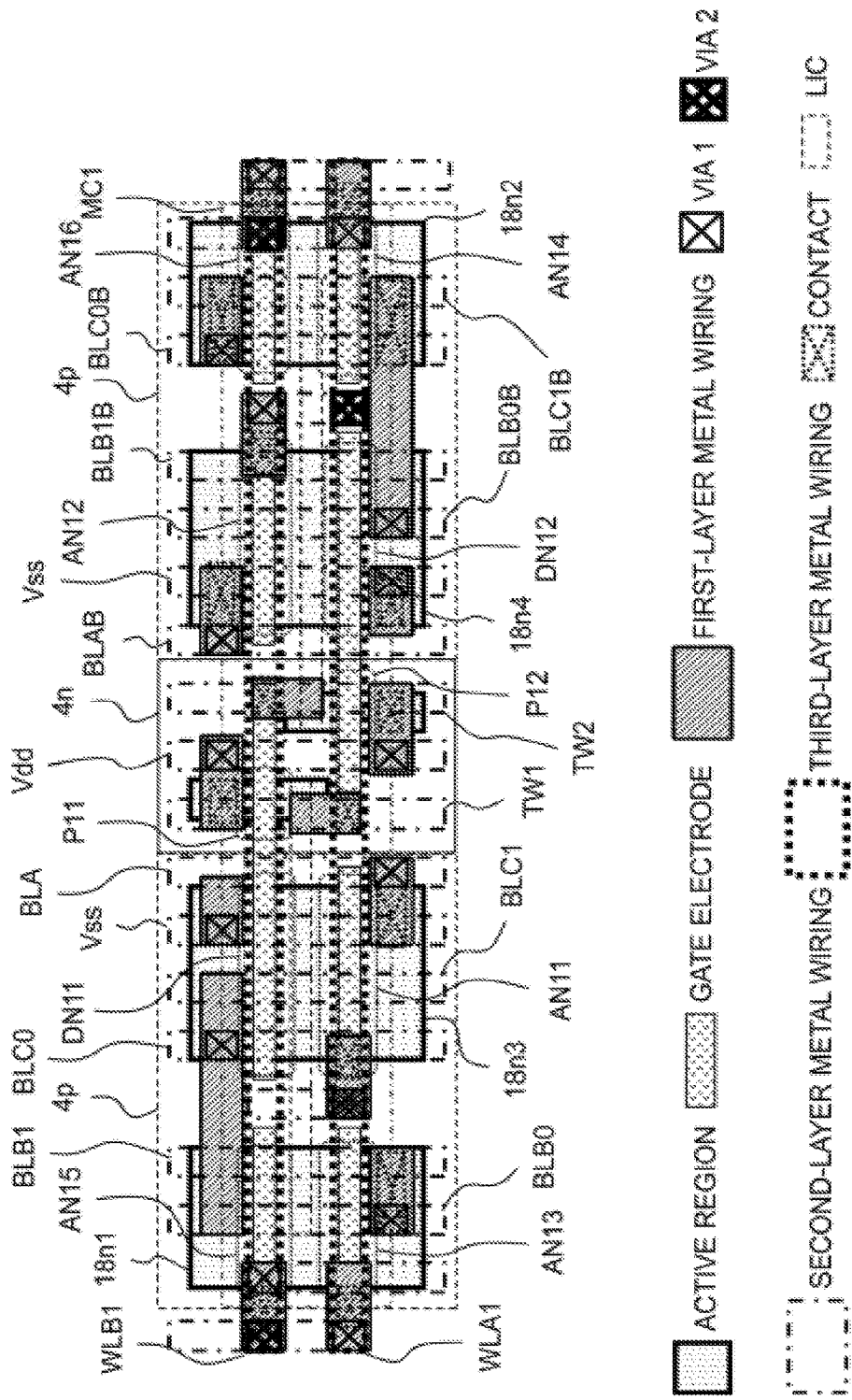
FIG. 12 is an enlarged planar layout diagram (displaying up to the third-layer embedded wiring) of a memory cell region MC1 of FIG. 11 and the periphery thereof.
Figure 13:
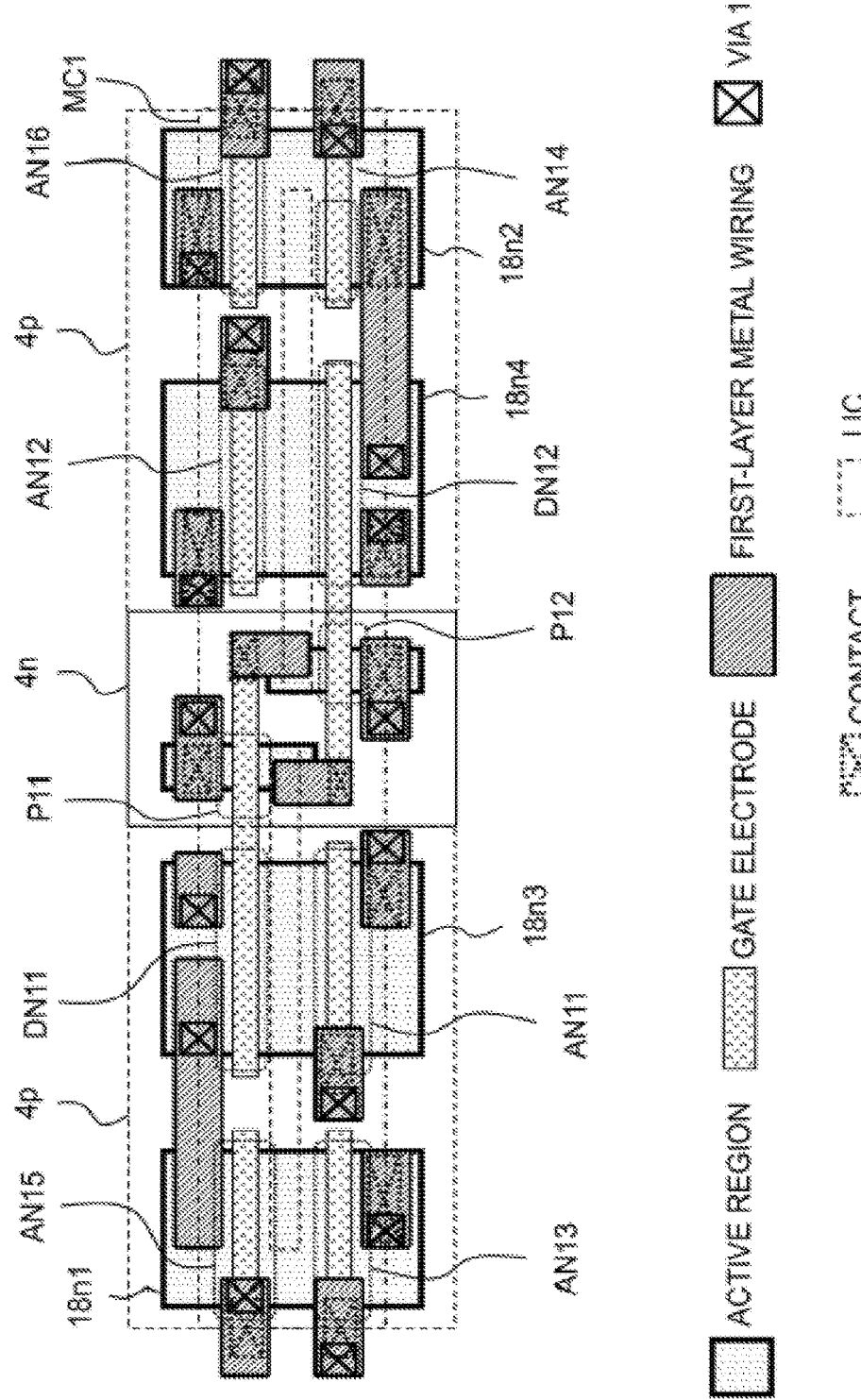
FIG. 13 is an enlarged planar layout diagram (displaying up to the 1-2 interlayer via 21) of the memory cell region MC of FIG. 1 corresponding to FIG. 12.
Figure 14:
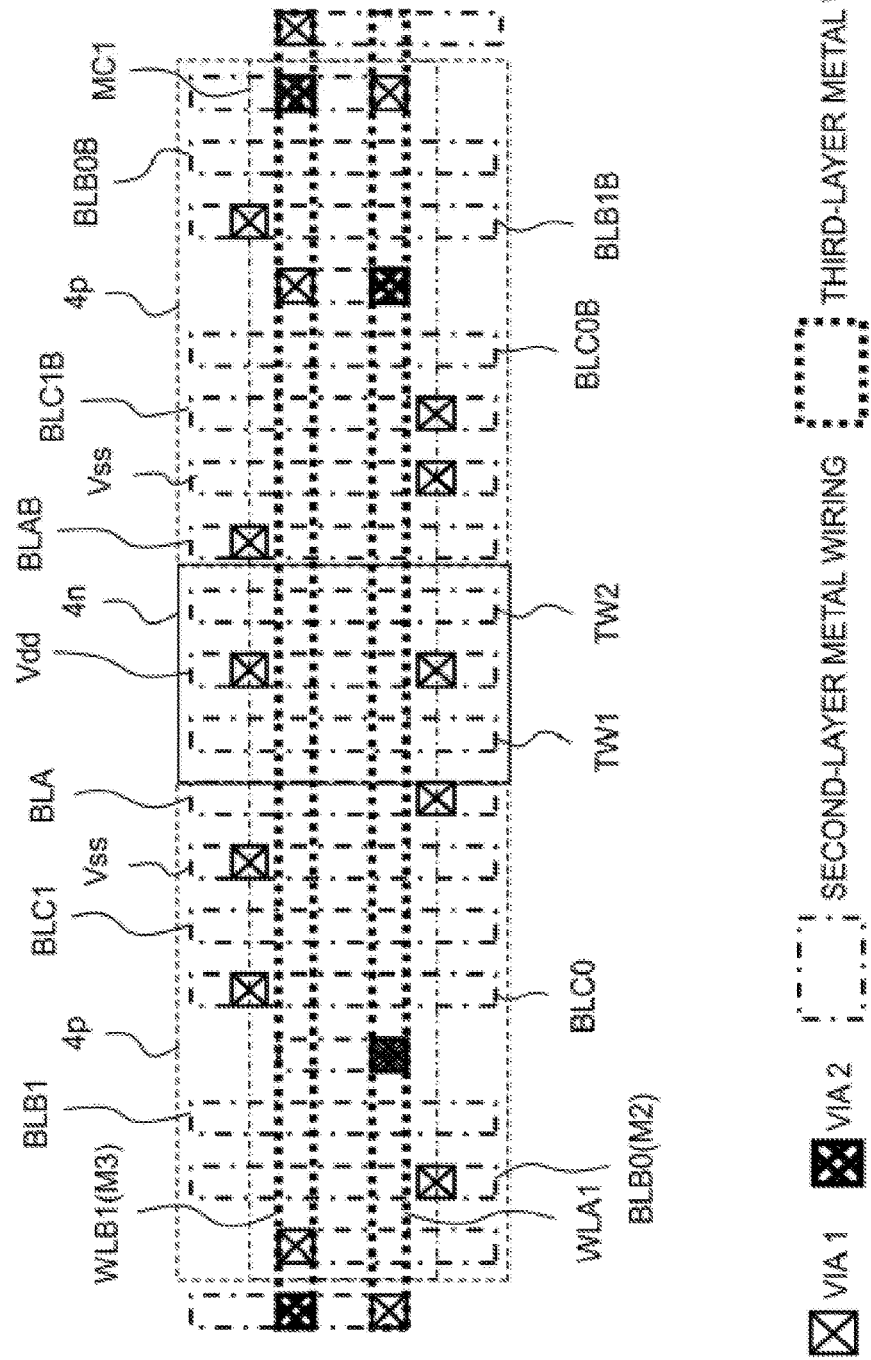
FIG. 14 is an enlarged planar layout diagram (mainly displaying the second-layer embedded wiring M2 and the third-layer embedded wiring M3) of the memory cell region MC of FIG. 1 corresponding to FIG. 12.
Figure 15:
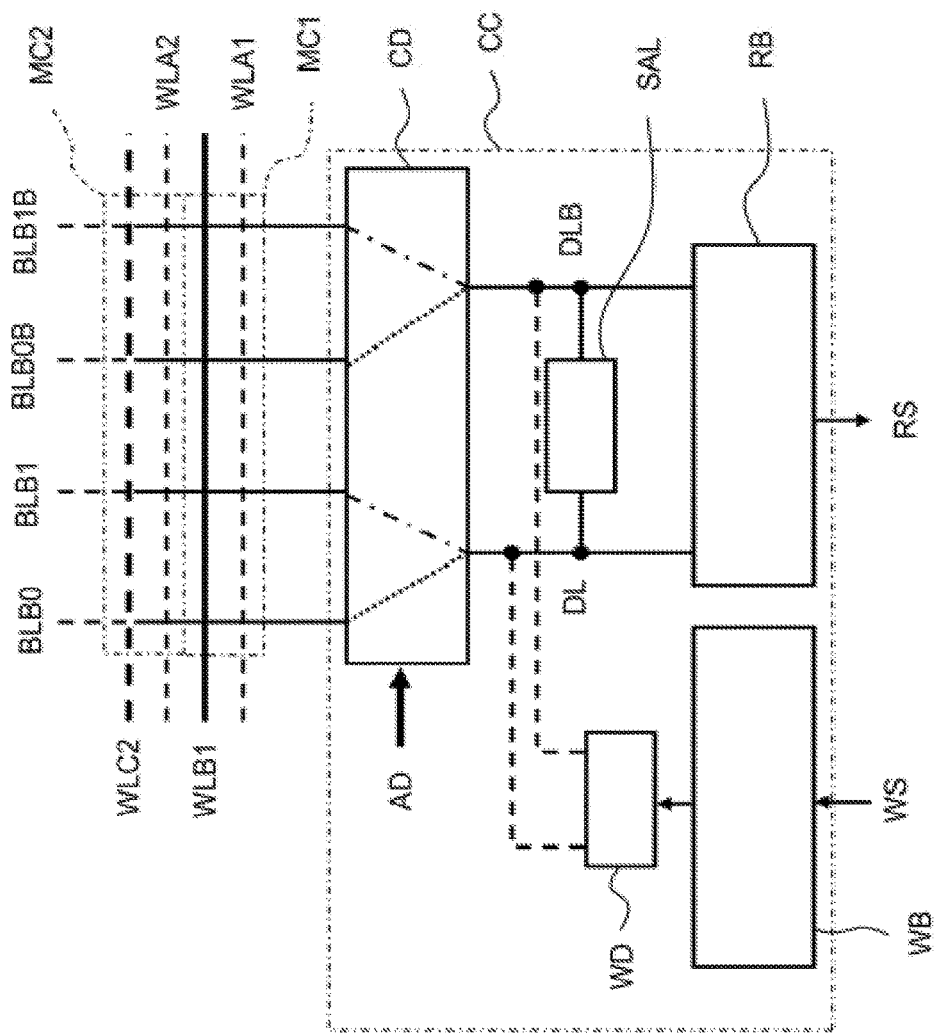
FIG. 15 is a schematic circuit diagram illustrating an example of a readout circuit (in which a write circuit is also shown) corresponding to FIG. 11.
Figure 16:
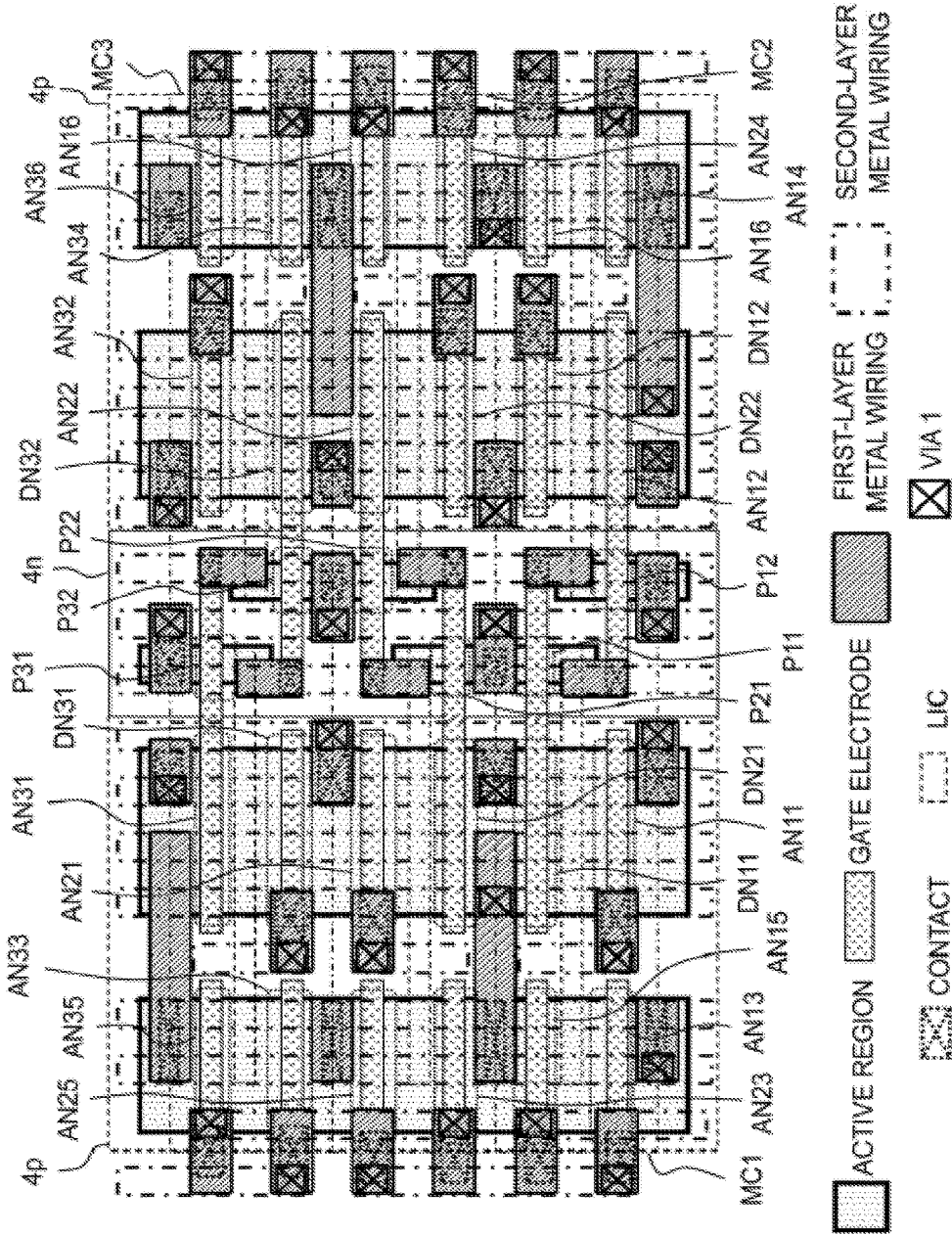
FIG. 16 is an enlarged planar layout diagram (however, displaying up to the second-layer embedded wiring) shown in a state where the range of FIG. 12 is expanded to three cells adjacent to each other in an upward direction.
Figure 17:
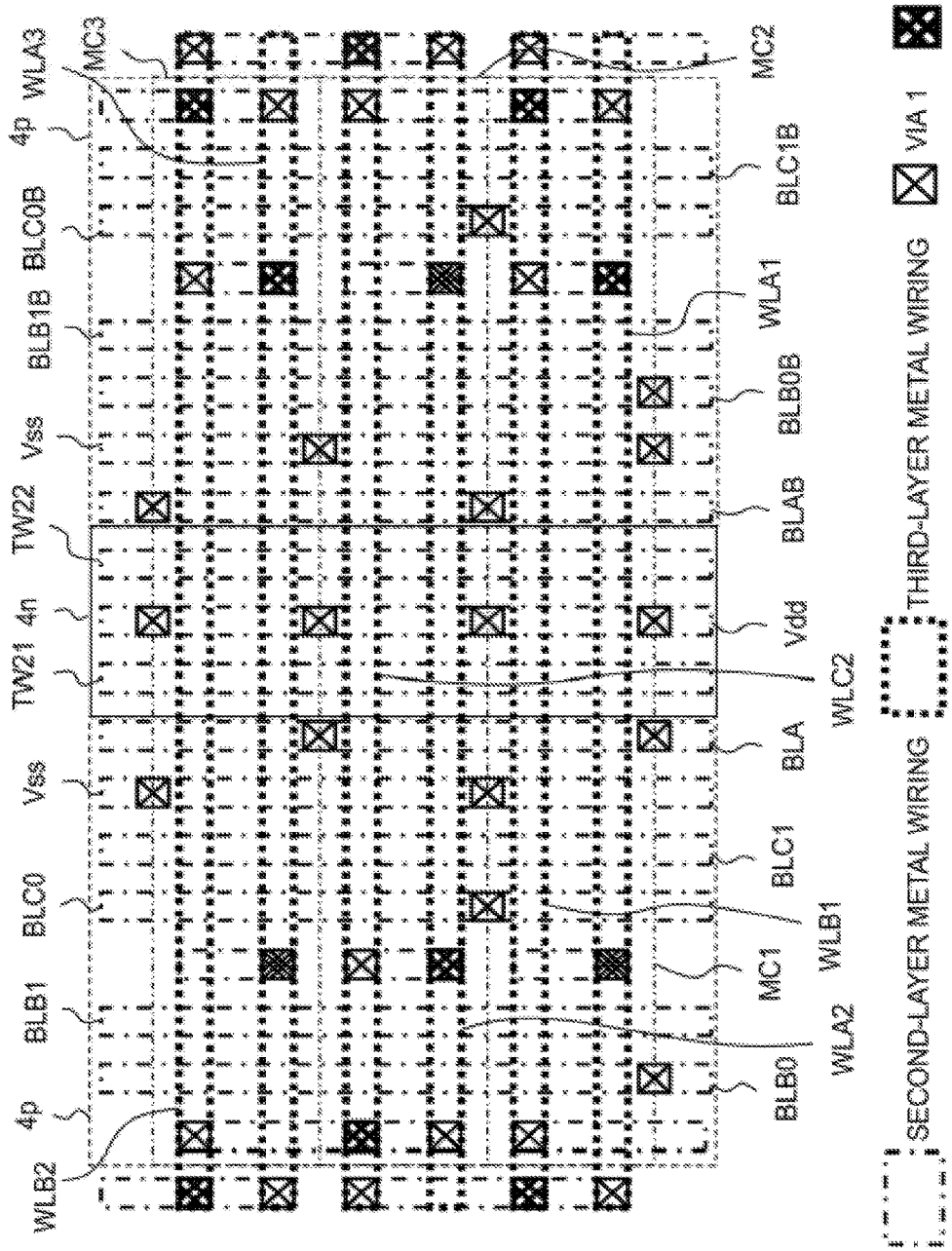
FIG. 17 is an enlarged planar layout diagram (mainly displaying the second-layer embedded wiring M2 and the third-layer embedded wiring M3) corresponding to FIG. 16.

FIG. 11 is a schematic circuit diagram of the memory cell region MC of FIG. 1 (displaying three cells in a vertical direction, that is, a bit line direction) corresponding to FIG. 3 for illustrating Modification Example 4 (low-height cell structure 3 port) relating to the cell layout of the embedded SRAM in the semiconductor integrated circuit device of the embodiment of the present application. FIG. 12 is an enlarged planar layout diagram (displaying up to the third-layer embedded wiring) of the memory cell region MC1 and the periphery thereof shown in FIG. 11. FIG. 13 is an enlarged planar layout diagram (displaying up to the 1-2 interlayer via 21) of the memory cell region MC of FIG. 1 corresponding to FIG. 12. FIG. 14 is an enlarged planar layout diagram (mainly displaying the second-layer embedded wiring M2 and the third-layer embedded wiring M3) of the memory cell region MC of FIG. 1 corresponding to FIG. 12. FIG. 15 is a schematic circuit diagram illustrating an example of a readout circuit (write circuit is also shown) corresponding to FIG. 11. FIG. 16 is an enlarged planar layout diagram (however, displaying up to the second-layer embedded wiring) shown in a state where the range of FIG. 12 is expanded to three cells adjacent to each other in an upward direction. FIG. 17 is an enlarged planar layout diagram (mainly displaying the second-layer embedded wiring M2 and the third-layer embedded wiring M3) corresponding to FIG. 16. Modification Example 4 (low-height cell structure 3 port) relating to the cell layout of the embedded SRAM in the semiconductor integrated circuit device of the embodiment of the present application will be described with reference to these drawings.

As shown in FIG. 11, in this example, two sets of B port-based and C port-based bit line pairs are wired per column of a cell, and a B port-based word line and a C port-based word line (which are respective second word lines) are wired one by one with respect to two rows of a cell. Interleaved connection therebetween is then performed. On the other hand, one A port-based word line (first word line) is wired independently with respect to one row of a cell, a set of A port-based bit line pair is formed with respect to each column. That is, one word line is reduced by increasing the B port-based and C port-based bit line pair two times. Considering a horizontally-long memory cell, this is because, for example, even in case that the bit line running vertically is considerably increased, a reduction in the word line running horizontally is advantageous in the point of an occupied area.

FIG. 11 is a diagram basically illustrating three circuits of FIG. 3 lined up in a vertical direction, but a portion of the circuits may be accompanied by a vertical or horizontal reverse operation in the viewpoint of the layout, routing of a wiring, and charging efficiency.

The description as in the case of FIG. 3 is as follows.

As shown in FIG. 11, the data storage unit SP of the memory cell region MC1 is provided with the P-channel type pull-up MISFETs (P11, P12). One of the source drain terminals thereof is connected to the power supply wiring Vdd, and the other thereof is connected to the true storage node SN and the complementary storage node SNB. One of the source drain terminals of the N-channel type driver MISFET (DN11) is connected to the true storage node SN, and the other thereof is connected to the ground wiring Vss. On the other hand, one of the source drain terminals of the N-channel type driver MISFET (DN12) is connected to the complementary storage node SNB, and the other thereof is connected to the ground wiring Vss. Here, the gate electrodes of the P-channel type pull-up MISFET (P11) and the N-channel type driver MISFET (DN11) are connected to the complementary storage node SNB, and the gate electrodes of the P-channel type pull-up MISFET (P12) and the N-channel type driver MISFET (DN12) are connected to the true storage node SN.

The A port word line WLA1 (first word line) and the B port word line WLB1 (second word line) are provided with the memory cell region MC1 in the row direction. The gate electrodes of the N-channel type access MISFETs (AN11, AN12) are connected to the A port word line WLA1. Similarly, the gate electrodes of the N-channel type access MISFETs (AN13, AN14) are connected to the B port word line WLB1. Further, the gate electrodes of the N-channel type access MISFETs (AN15, AN16) are connected to the C port word line WLC1 (third word line) provided within the lower memory cell region.

On the other hand, the A port true bit line BLA and the A port complementary bit line BLAB forming a pair complementary thereto are provided within the memory cell region MC1 in the column direction. One of the source drain terminals of the N-channel type access MISFET (AN11) is connected to the A port true bit line BLA, and the other thereof is connected to the true storage node SN. On the other hand, one of the source drain terminals of the N-channel type access MISFET (AN12) is connected to the A port complementary bit line BLAB, and the other thereof is connected to the complementary storage node SNB, to thereby form a complementary A port (complementary write and readout port).

In addition, a B port true bit line BLB0 and a B port complementary bit line BLB0B forming a pair complementary thereto are provided within the memory cell region MC1 in the column direction. One of the source drain terminals of the N-channel type access MISFET (AN13) is connected to the B port true bit line BLB, and the other thereof is connected to the true storage node SN. On the other hand, one of the source drain terminals of the N-channel type access MISFET (AN14) is connected to the B port complementary bit line BLB0B, and the other thereof is connected to the complementary storage node SNB, to thereby form a complementary B port (complementary write and readout port) with respect to this cell.

Further, a C port true bit line BLC0 and a C port complementary bit line BLC0B forming a pair complementary thereto are provided within the memory cell region MC1 in the column direction. One of the source drain terminals of the N-channel type access MISFET (AN15) is connected to the C port true bit line BLC0, and the other thereof is connected to the true storage node SN. On the other hand, one of the source drain terminals of the N-channel type access MISFET (AN16) is connected to the C port complementary bit line BLC0B, and the other thereof is connected to the complementary storage node SNB, to thereby form a complementary C port (complementary write and readout port) with respect to this cell.

Similarly, the data storage unit SP of a memory cell region MC2 is provided with P-channel type pull-up MISFETs (P21, P22). One of the source drain terminals thereof is connected to the power supply wiring Vdd, and the other thereof is connected to the true storage node SN and the complementary storage node SNB. One of the source drain terminals of an N-channel type driver MISFET (DN21) is connected to the true storage node SN, and the other thereof is connected to the ground wiring Vss. On the other hand, one of the source drain terminals of an N-channel type driver MISFET (DN22) is connected to the complementary storage node SNB, and the other thereof is connected to the ground wiring Vss. Here, the gate electrodes of the P-channel type pull-up MISFET (P21) and the N-channel type driver MISFET (DN21) are connected to the complementary storage node SNB, and the gate electrodes of the P-channel type pull-up MISFET (P22) and the N-channel type driver MISFET (DN22) are connected to the true storage node SN.

An A port word line WLA2 and a C port word line WLC2 are provided within the memory cell region MC2 in the row direction. The gate electrodes of N-channel type access MISFETs (AN21, AN22) are connected to the A port word line WLA2. Similarly, the gate electrodes of the N-channel type access MISFETs (AN25, AN26) are connected to the C port word line WLC2. Further, the gate electrodes of N-channel type access MISFETs (AN23, AN24) are connected to the B port word line WLB1 provided within the lower memory cell region MC1.

On the other hand, the A port true bit line BLA and the A port complementary bit line BLAB forming a pair complementary thereto are provided within the memory cell region MC2 in the column direction. One of the source drain terminals of the N-channel type access MISFET (AN21) is connected to the A port true bit line BLA, and the other thereof is connected to the true storage node SN. On the other hand, one of the source drain terminals of the N-channel type access MISFET (AN22) is connected to the A port complementary bit line BLAB, and the other thereof is connected to the complementary storage node SNB, to thereby form a complementary A port (complementary write and readout port).

In addition, a B port true bit line BLB1 and a B port complementary bit line BLB1B forming a pair complementary thereto are provided within the memory cell region MC2 in the column direction. One of the source drain terminals of the N-channel type access MISFET (AN23) is connected to the B port true bit line BLB1, and the other thereof is connected to the true storage node SN. On the other hand, one of the source drain terminals of the N-channel type access MISFET (AN24) is connected to the B port complementary bit line BLB1B, and the other thereof is connected to the complementary storage node SNB, to thereby form a complementary B port (complementary write and readout port) with respect to this cell.

Further, a C port true bit line BLC1 and a C port complementary bit line BLC1B forming a pair complementary thereto are provided within the memory cell region MC2 in the column direction. One of the source drain terminals of the N-channel type access MISFET (AN25) is connected to the C port true bit line BLC1, and the other thereof is connected to the true storage node SN. On the other hand, one of the source drain terminals of the N-channel type access MISFET (AN26) is connected to the C port complementary bit line BLC1B, and the other thereof is connected to the complementary storage node SNB, to thereby form a complementary C port (complementary write and readout port) with respect to this cell.

Similarly, the data storage unit SP of a memory cell region MC3 is provided with P-channel type pull-up MISFETs (P31, P32). One of the source drain terminals thereof is connected to the power supply wiring Vdd, and the other thereof is connected to the true storage node SN and the complementary storage node SNB. One of the source drain terminals of an N-channel type driver MISFET (DN31) is connected to the true storage node SN, and the other thereof is connected to the ground wiring Vss. On the other hand, one of the source drain terminals of an N-channel type driver MISFET (DN32) is connected to the complementary storage node SNB, and the other thereof is connected to the ground wiring Vss. Here, the gate electrodes of the P-channel type pull-up MISFET (P31) and the N-channel type driver MISFET (DN31) are connected to the complementary storage node SNB, and the gate electrodes of the P-channel type pull-up MISFET (P32) and the N-channel type driver MISFET (DN32) are connected to the true storage node SN.

An A port word line WLA3 and a B port word line WLB2 are provided within the memory cell region MC3 in the row direction. The gate electrodes of N-channel type access MISFETs (AN31, AN32) are connected to the A port word line WLA3. Similarly, the gate electrodes of N-channel type access MISFETs (AN33, AN34) are connected to the B port word line WLB2. Further, the gate electrodes of N-channel type access MISFETs (AN35, AN36) are connected to the C port word line WLC2 provided within the lower memory cell region MC21.

On the other hand, the A port true bit line BLA and the A port complementary bit line BLAB forming a pair complementary thereto are provided within the memory cell region MC3 in the column direction. One of the source drain terminals of the N-channel type access MISFET (AN31) is connected to the A port true bit line BLA, and the other thereof is connected to the true storage node SN. On the other hand, one of the source drain terminals of the N-channel type access MISFET (AN32) is connected to the A port complementary bit line BLAB, and the other thereof is connected to the complementary storage node SNB, to thereby form a complementary A port (complementary write and readout port).

In addition, the B port true bit line BLB0 and the B port complementary bit line BLB0B forming a pair complementary thereto are provided within the memory cell region MC3 in the column direction. One of the source drain terminals of the N-channel type access MISFET (AN33) is connected to the B port true bit line BLB0, and the other thereof is connected to the true storage node SN. On the other hand, one of the source drain terminals of the N-channel type access MISFET (AN34) is connected to the B port complementary bit line BLB0B, and the other thereof is connected to the complementary storage node SNB, to thereby form a complementary B port (complementary write and readout port) with respect to this cell.

Further, the C port true bit line BLC0 and the C port complementary bit line BLC0B forming a pair complementary thereto are provided within the memory cell region MC3 in the column direction. One of the source drain terminals of the N-channel type access MISFET (AN35) is connected to the C port true bit line BLC0, and the other thereof is connected to the true storage node SN. On the other hand, one of the source drain terminals of the N-channel type access MISFET (AN36) is connected to the C port complementary bit line BLC0B, and the other thereof is connected to the complementary storage node SNB, to thereby form a complementary C port (complementary write and readout port) with respect to this cell.

As described above, as for the B and C port bases, the respective bit line pairs are different from each other in the memory cells vertically adjacent to each other. In other words, the respective B and C port-based bit line pairs alternately become the same as each other with respect to the memory cell lined up in the vertical direction.

Correspondingly, one of the word lines provided in one memory cell is the A port-based word line, and the other thereof is configured such that the B port-based word line and the C port-based word line are alternately replaced with each other for each of the memory cells adjacent to each other in the vertical direction.

However, each memory cell is the same as those of other examples, in that the access MISFET relating to a port having the same system is controlled by the word line relating to a port having the same system.

This layout is basically the same as that illustrated in FIG. 7. However, as shown in FIGS. 12 to 14, in view of the memory cell region MC1, the word line and the bit line have different portions as follows. That is, (1) Each of the bit lines BLA, BLB0, BLB1, BLC0, BLC1, BLAB, BLB0B, BLB1B, BLC0B, and BLC1B, the power supply wiring Vdd, the ground wiring Vss, and the like are formed by the second-layer embedded wiring M2. Further, relatively long wirings in the vertical direction such as the second-layer through wirings TW21 and TW22 passing over the embedded SRAM region EM within a signal wiring for, for example, a logic circuit are formed by the second-layer embedded wiring M2. The second-layer embedded wiring M2 is formed by, for example, a dual damascene method. In addition, in this example, the second-layer embedded wiring M2 is also used as an intermediate metal layer between upper and lower conductive layers.

(2) In this example, each of the word lines WLA1 and WLB1 is formed by the third-layer embedded wiring M3. The third-layer embedded wiring M3 is formed by, for example, a dual damascene method.

Next, in order to assist in understanding the meaning of the cell layout of the SRAM in this example, a readout and write operation will be simply described by way of example of the B port (the C port is equivalent to the B port, and the A port is standard) with reference to FIG. 15. As shown in FIG. 15, in case of readout from the memory cell MC1, first, the B port word line WLB1 is set to be in an active state, and information of the memory cell MC1 is read out to the B port true bit line BLB0 and the B port complementary bit line BLB0B. A column decoder circuit CD is controlled by address data AD, and the information which is read out to the B port true bit line BLB0 and the B port complementary bit line BLB0B is transmitted to a true data line DL and a complementary data line DLB through the column decoder circuit CD. The information on the true data line DL and the complementary data line DLB is amplified by a sense amplifier SAL such as, for example, a latching sense amplifier. The information amplified by the sense amplifier SAL is changed to, for example, a single ended signal by a data output control circuit RB, and is output to the outside of the SRAM circuit EM, as a readout data signal RS.

In case of write in the memory cell MC1, first, the B port word line WLB1 is set to be in an active state, and single ended write information WS is input from the outside of the SRAM circuit EM and is supplied to a write drive circuit WD through a data input control circuit WB. The write drive circuit WD supplies the write information WS to the true data line DL and the complementary data line DLB as a full swing complementary write pair signal. This write signal is transmitted to the B port true bit line BLB0 and the B port complementary bit line BLB0B through the column decoder circuit CD, and is written in the memory cell MC1.

Similarly, in case of readout from the memory cell MC2, first, the B port word line WLB1 is set to be in an active state, and information of the memory cell MC2 is read out to the B port true bit line BLB1 and the B port complementary bit line BLB1B. The column decoder circuit CD is controlled by the address data AD, and the information which is read out to the B port true bit line BLB1 and the B port complementary bit line BLB1B is transmitted to the true data line DL and the complementary data line DLB through the column decoder circuit CD. The information on the true data line DL and the complementary data line DLB is amplified by the sense amplifier SAL such as, for example, a latching sense amplifier. The information amplified by the sense amplifier SAL is changed to, for example, a single ended signal by the data output control circuit RB, and is output to the outside of the SRAM circuit EM, as the readout data signal RS.

In case of write in the memory cell MC2, first, the B port word line WLB1 is set to be in an active state, and the single ended write information WS is input from the outside of the SRAM circuit EM and is supplied to the write drive circuit WD through the data input control circuit WB. The write drive circuit WD supplies the write information WS to the true data line DL and the complementary data line DLB as a full swing complementary write pair signal. This write signal is transmitted to the B port true bit line BLB1 and the B port complementary bit line BLB1B through the column decoder circuit CD, and is written in the memory cell MC2.

Next, a supplementary description of the layout described with reference to FIGS. 12 to 14 will be given with reference to FIGS. 16 and 17 which correspond to FIG. 11 and are planar layout diagrams relating to three memory cell regions MC1, MC2, and MC3 lined up in the vertical direction. As shown in FIGS. 16 and 17 (see FIG. 11), the basic concept of the layout is as follows. That is, (1) One of the word lines for controlling a certain memory cell is located at, for example, memory cells downward adjacent to each other, and thus requires a vertical wiring (second-layer embedded wiring M2 in this example) having substantially the same length as the width of the memory cell. Therefore, for example, in case that the memory cell region MC2 is described by way of example, the gate electrodes of the N-channel type access MISFETs (AN23, AN24) are, for example, connected to the B port word line WLB1 located at the memory cell region MC1 through the second-layer embedded wiring M2.

As described above, two sets of B port-based bit line pair and C port-based bit line pair are prepared, and the B port-based word line and the C port-based word line are prepared one by one with respect to two rows of the memory cell. Interleaved connection therebetween is then performed. Thereby, two metal word lines (third-layer embedded wirings) running in a traverse direction are formed per row, which leads to effectiveness in a reduction in cell height.

2-7. Description of Modification Example 5 (Partial Single Ended Bit Line Configuration 4 Ports) Relating to Cell Layout of Embedded SRAM in Semiconductor Integrated Circuit Device of the Embodiment of the Present Application (Mainly FIGS. 18 to 26)

The description in this section belongs to the modification example relating to the cell layout of the examples described in Sections (2-1) and (2-2), but can also be regarded as the modification example of the example described directly in Section (2-6).

This example is basically the same as that illustrated in Section (2-6), and thus in principle, only different portions will be described below.

This example can be combined with various examples, but can be combined with, for example, one or a plurality of respective examples of Sections (2-3) to (2-5), (2-8) and (2-10) to (2-12).

Figure 18:
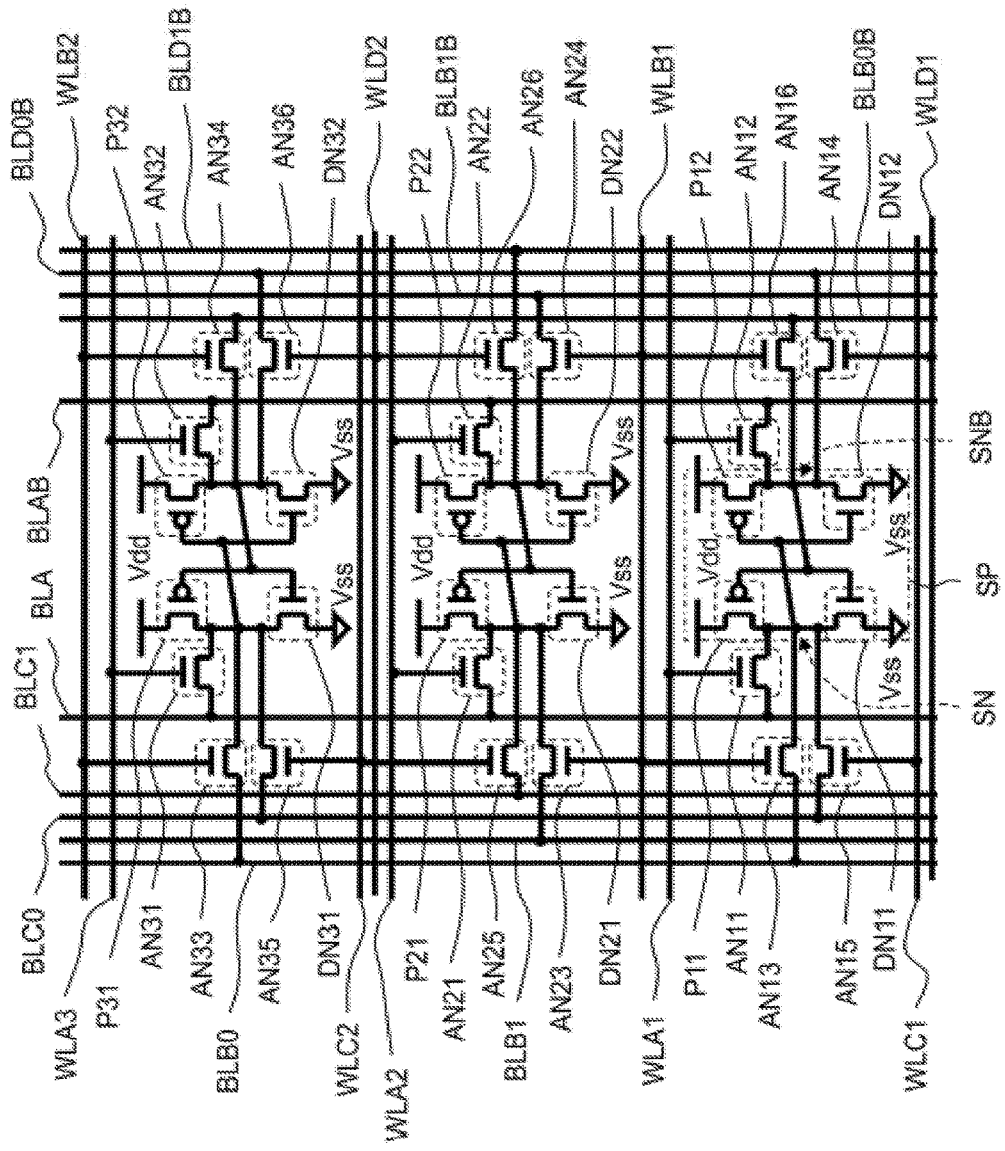
FIG. 18 is a schematic circuit diagram (displaying three cells in a vertical direction, that is, a bit line direction) of the memory cell region MC of FIG. 1 corresponding to FIG. 11 for illustrating Modification Example 5 (partial single ended bit line configuration 4 port) relating to the cell layout of the embedded SRAM in the semiconductor integrated circuit device of the embodiment of the present application.
Figure 19:
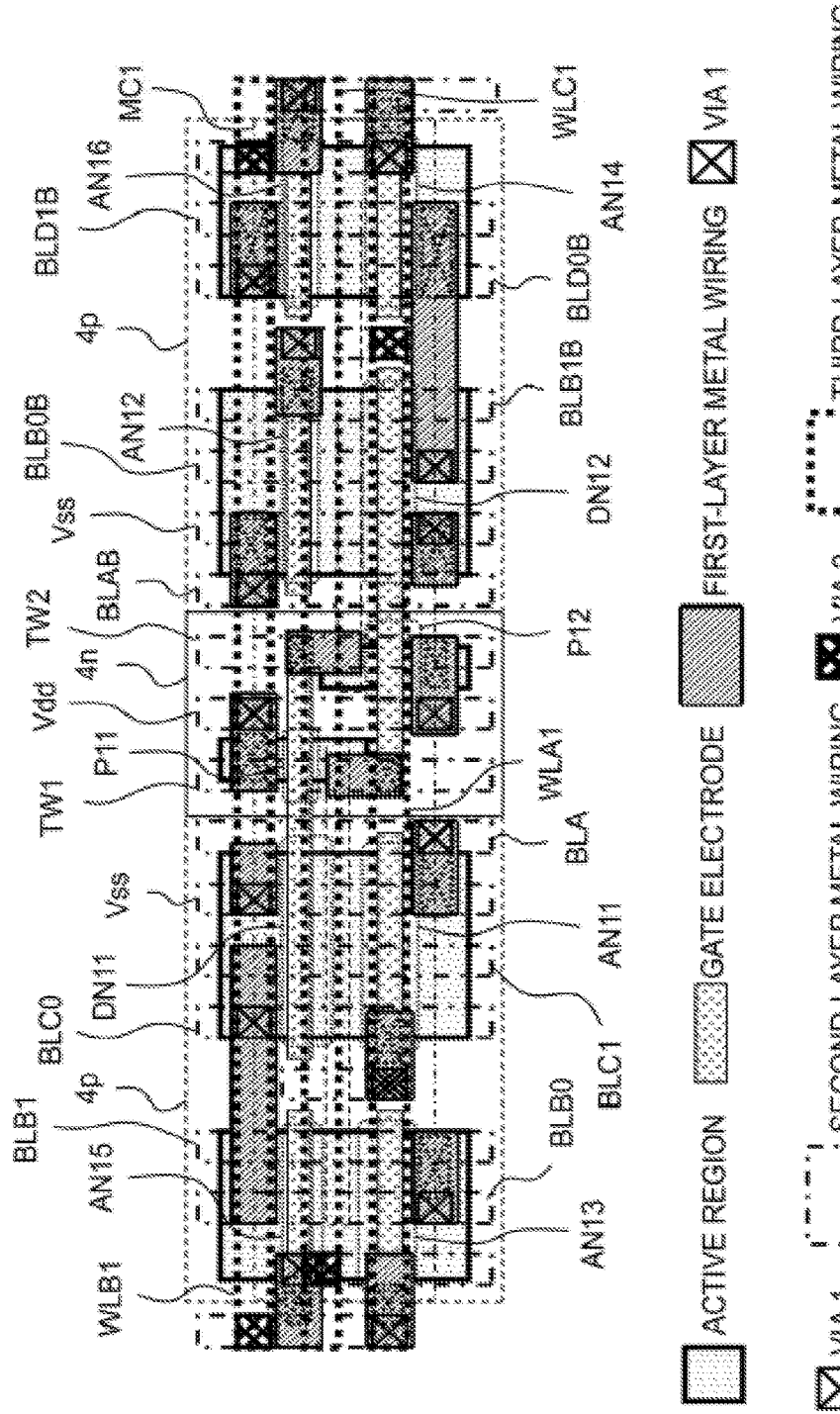
FIG. 19 is an enlarged planar layout diagram (displaying up to the third-layer embedded wiring) of the memory cell region MC1 of FIG. 18 and the periphery thereof.
Figure 20:
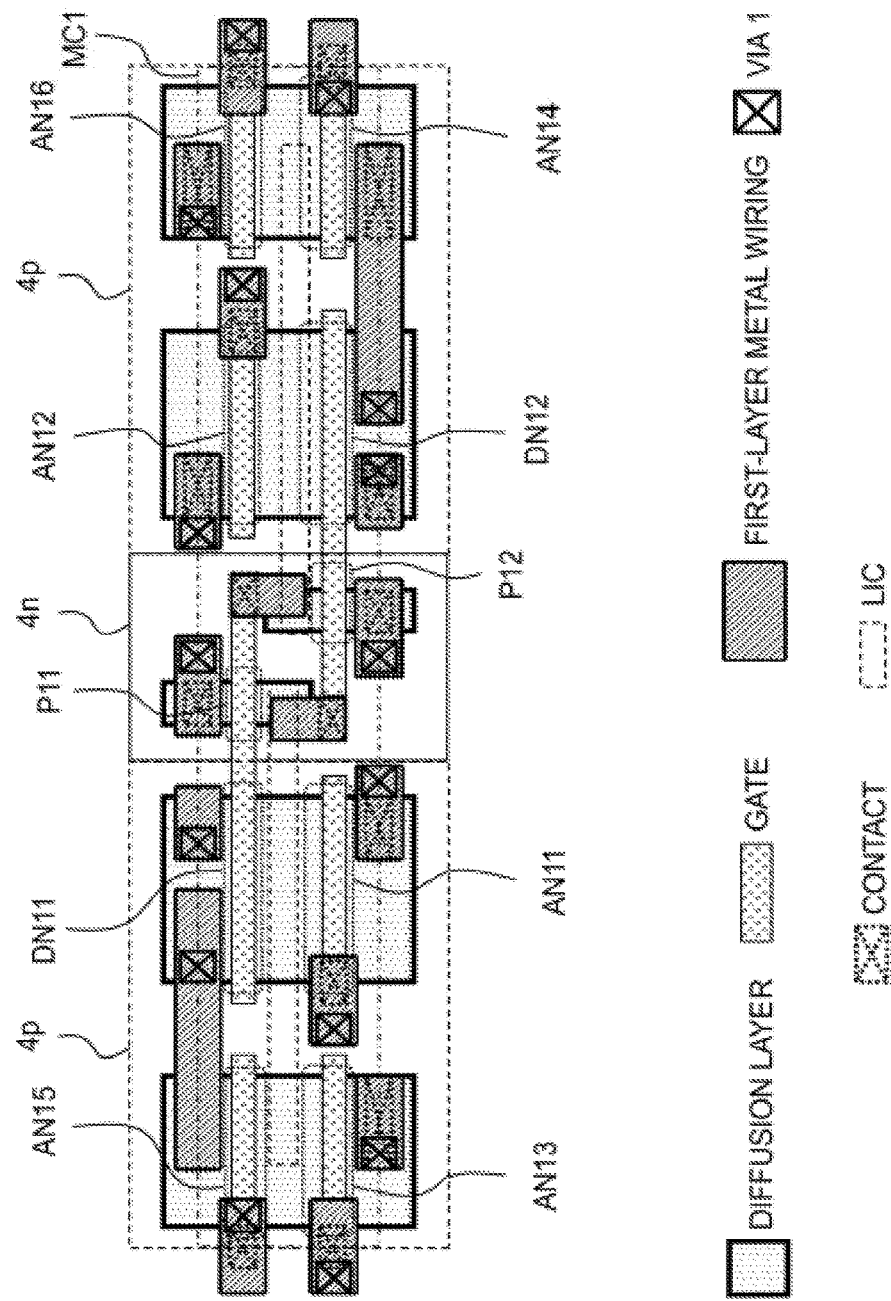
FIG. 20 is an enlarged planar layout diagram (displaying up to the 1-2 interlayer via 21) of the memory cell region MC of FIG. 1 corresponding to FIG. 19.
Figure 21:
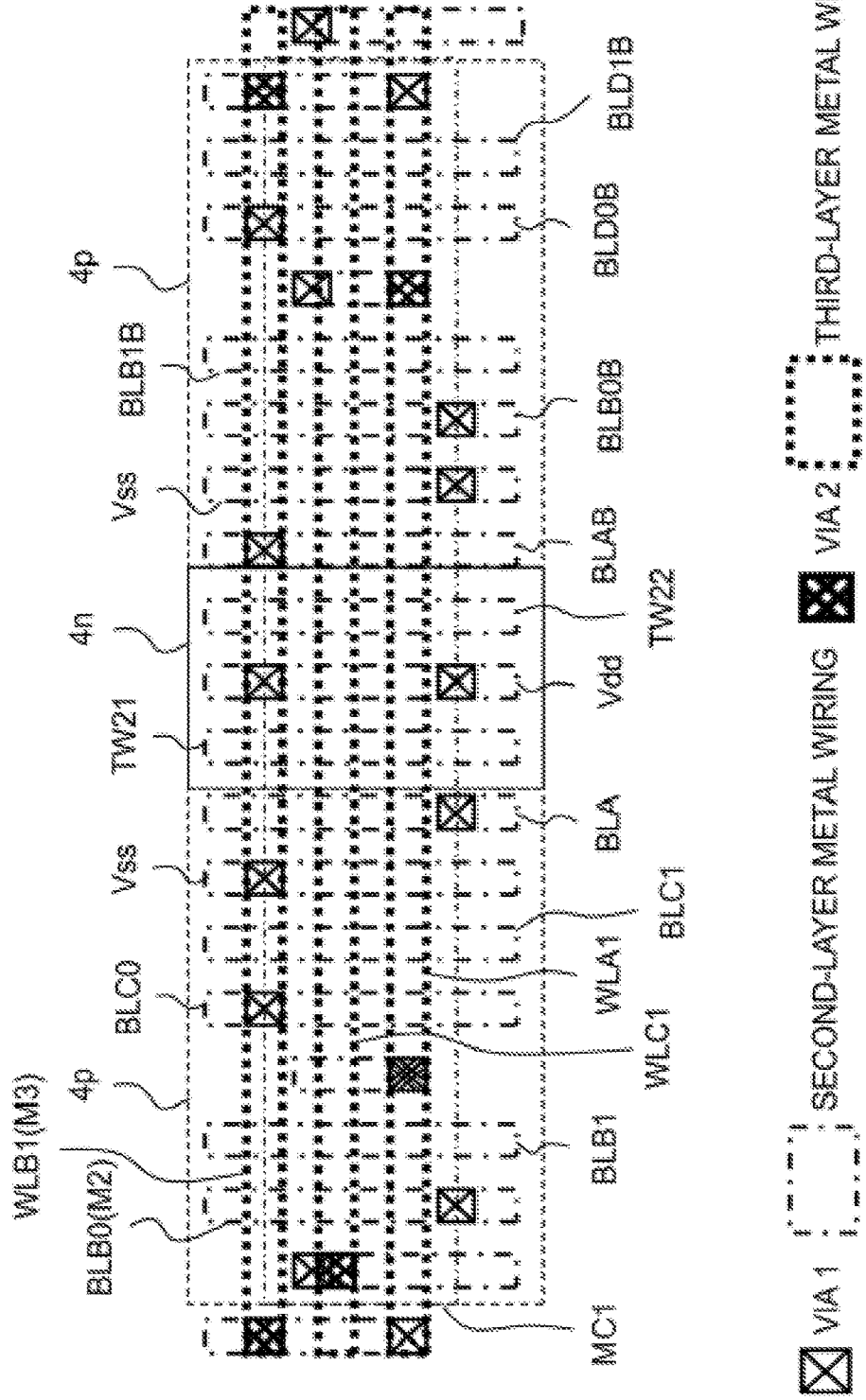
FIG. 21 is an enlarged planar layout diagram (mainly displaying the second-layer embedded wiring M2 and the third-layer embedded wiring M3) of the memory cell region MC of FIG. 1 corresponding to FIG. 19.
Figure 22:
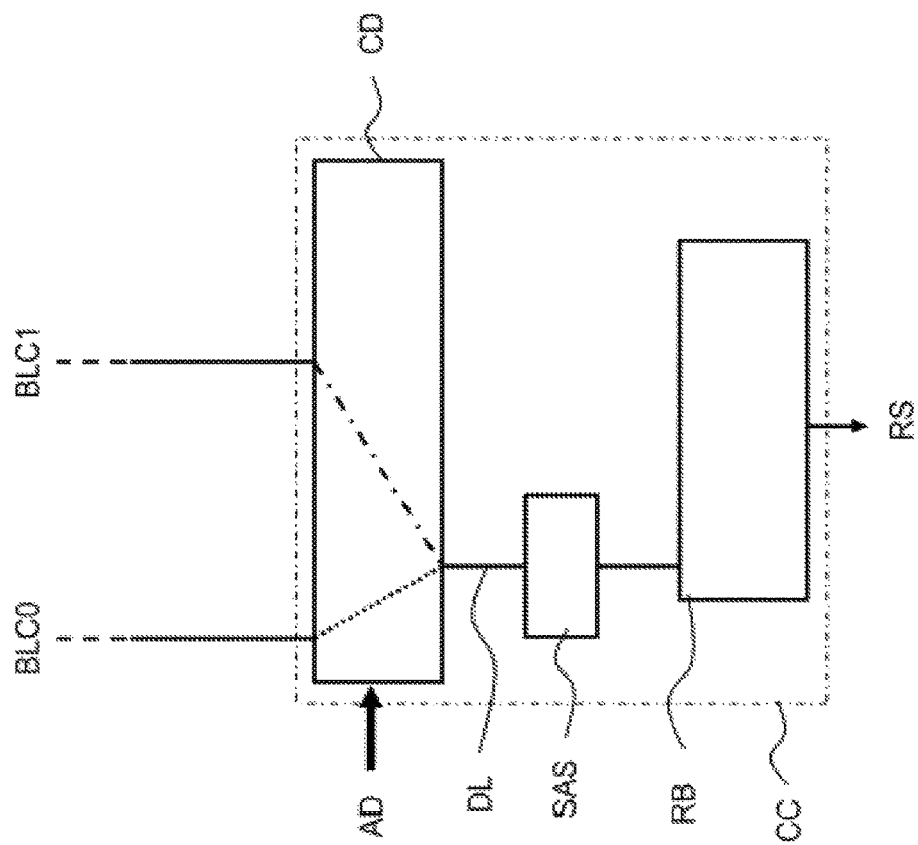
FIG. 22 is a schematic circuit diagram (C port-based single ended bit line) illustrating an example of a readout circuit corresponding to FIG. 18.
Figure 23:
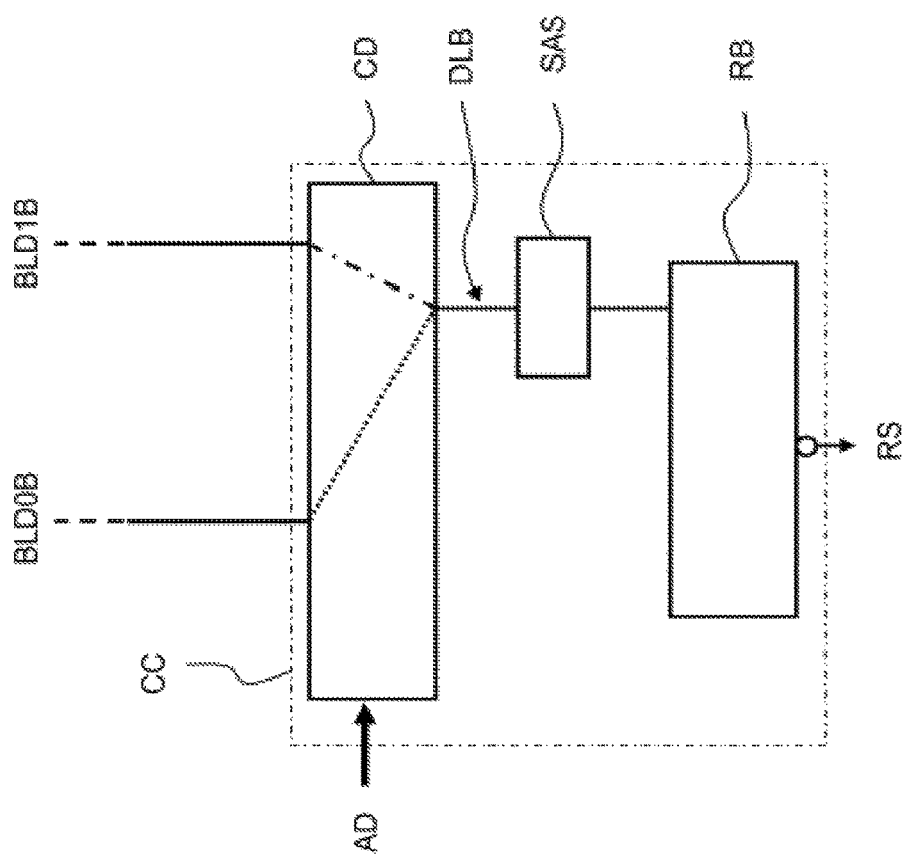
FIG. 23 is a schematic circuit diagram (D port-based single ended bit line) illustrating an example of the readout circuit corresponding to FIG. 18.
Figure 24:
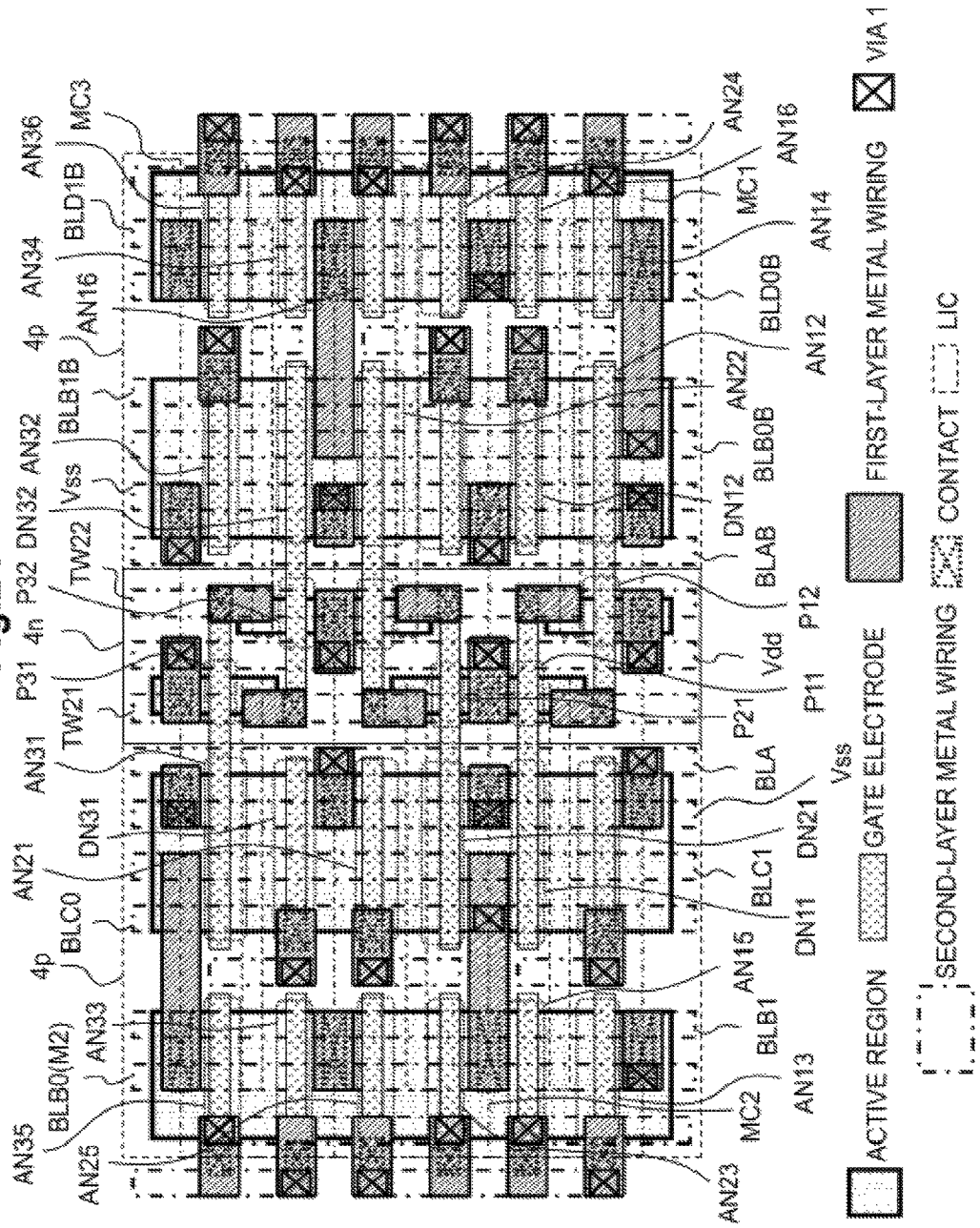
FIG. 24 is an enlarged planar layout diagram (however, displaying up to the second-layer embedded wiring) shown in a state where the range of FIG. 19 is expanded to three cells adjacent to each other in an upward direction.
Figure 25:
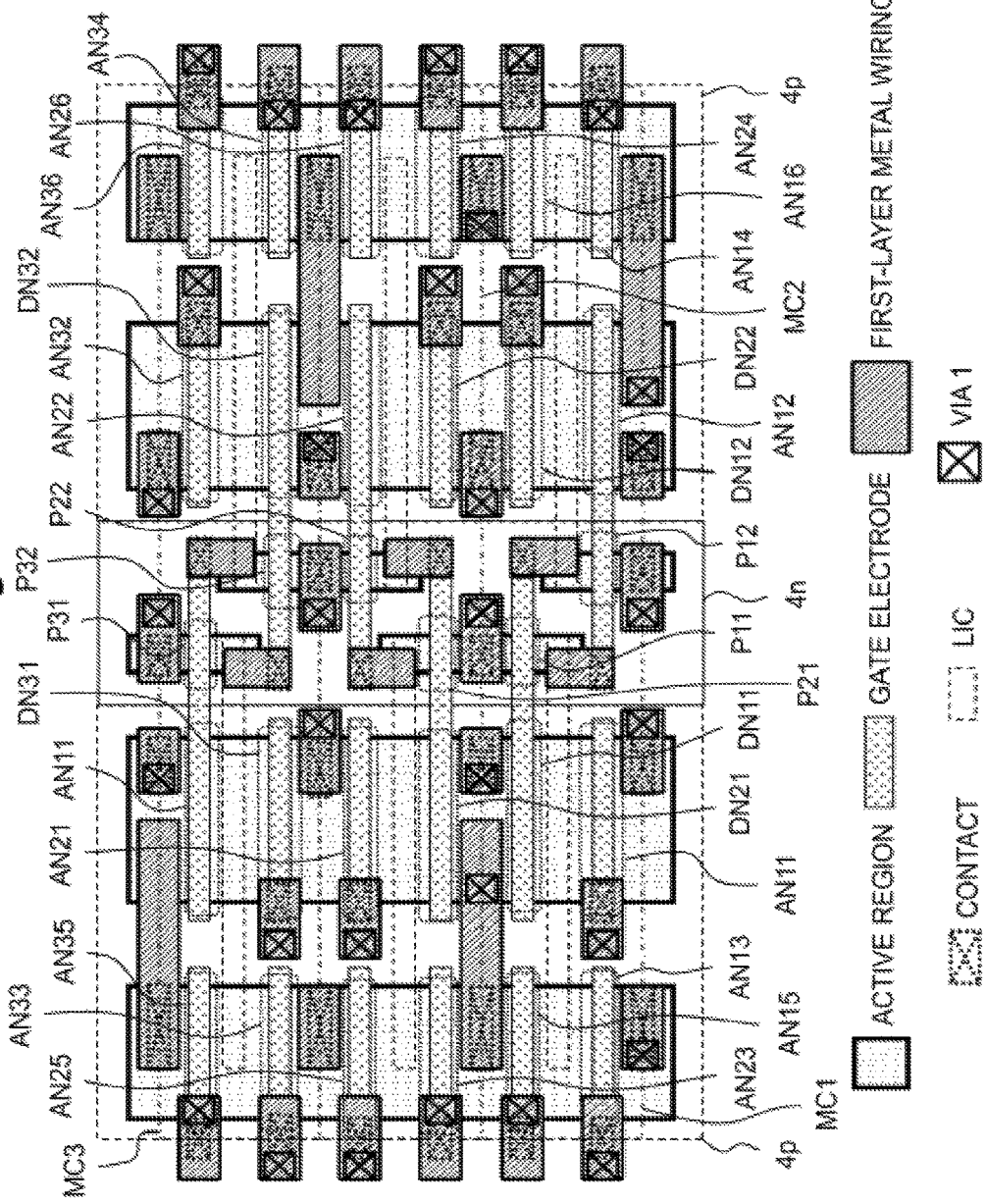
FIG. 25 is an enlarged planar layout diagram (displaying up to the 1-2 interlayer via 21) corresponding to FIG. 24.
Figure 26:
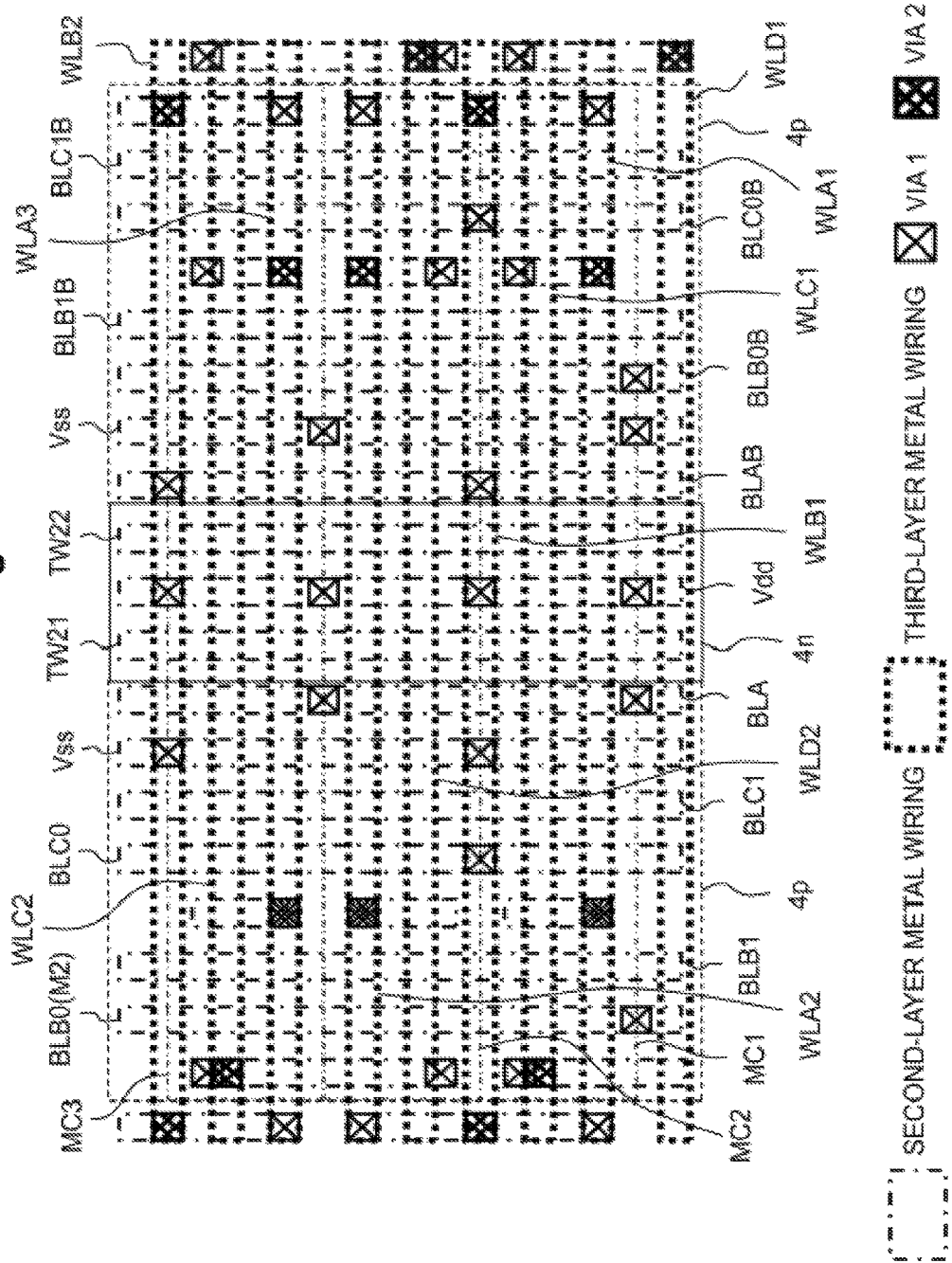
FIG. 26 is an enlarged planar layout diagram (mainly displaying the second-layer embedded wiring M2 and the third-layer embedded wiring M3) corresponding to FIG. 24.

FIG. 18 is a schematic circuit diagram (displaying three cells in a vertical direction, that is, a bit line direction) of the memory cell region MC of FIG. 1 corresponding to FIG. 11 for illustrating Modification Example 5 (partial single ended bit line configuration 4 port) relating to the cell layout of the embedded SRAM in the semiconductor integrated circuit device of the embodiment of the present application. FIG. 19 is an enlarged planar layout diagram (displaying up to the third-layer embedded wiring) of the memory cell region MC1 and the periphery thereof shown in FIG. 18. FIG. 20 is an enlarged planar layout diagram (displaying up to the 1-2 interlayer via 21) of the memory cell region MC of FIG. 1 corresponding to FIG. 19. FIG. 21 is an enlarged planar layout diagram (mainly displaying the second-layer embedded wiring M2 and the third-layer embedded wiring M3) of the memory cell region MC of FIG. 1 corresponding to FIG. 19. FIG. 22 is a schematic circuit diagram (C port-based single ended bit line) illustrating an example of a readout circuit corresponding to FIG. 18. FIG. 23 is a schematic circuit diagram (D port-based single ended bit line) illustrating an example of the readout circuit corresponding to FIG. 18. FIG. 24 is an enlarged planar layout diagram (however, displaying up to the second-layer embedded wiring) shown in a state where the range of FIG. 19 is expanded to three cells adjacent to each other in an upward direction. FIG. 25 is an enlarged planar layout diagram (displaying up to the 1-2 interlayer via 21) corresponding to FIG. 24. FIG. 26 is an enlarged planar layout diagram (mainly displaying the second-layer embedded wiring M2 and the third-layer embedded wiring M3) corresponding to FIG. 24. Modification Example 5 (partial single ended bit line configuration 4 port) relating to the cell layout of the embedded SRAM in the semiconductor integrated circuit device of the embodiment of the present application will be described with reference to these drawings.

This example is basically the same as that illustrated in FIG. 11, but is different therefrom, in that, as shown in FIG. 18, the C port true bit lines BLC0 and BLC1 (positive logic) in FIG. 11 are single-ended, and the C port complementary bit lines BLC0B and BLC1B are single-ended, which leads to a change to D port complementary bit lines BLD0B and BLD1B (negative logic). Here, the single ended ports (C port and D port) serve as readout dedicated ports.

In other words, in this example, the A port-based bit lines (first and second bit lines) and the B port-based bit lines (third and fourth bit lines) are bit line pairs forming a pair mutually, respectively. On the other hand, the C port-based bit line (fifth bit line) and the D port-based bit line (sixth bit line) are bit lines which do not form a pair mutually, respectively.

Next, the planar layout of a unit memory cell region MC in this example is illustrated in FIG. 19 (corresponding to FIG. 12) to FIG. 21 and FIGS. 24 to 26. Similarly to other sections, as for the memory cell, an up-and-down direction, up or down indicates an extending direction of the bit line.

As shown in FIGS. 19 to 21, unlike FIGS. 12 to 14 or the like, for example, regarding the memory cell region MC1, the word lines WLA1 and WLC1 (corresponding to the first word line and the second word line, respectively) are traversed, and the word line WLB1 (third word line) extends along the boundary in the vicinity of the upper cell boundary. Here, the word line WLA1 controls an A port-based access transistor within the memory cell region MC1, and the word line WLC1 controls a C port-based access transistor of this memory cell and the lower memory cell. On the other hand, the word line WLB1 controls a B port-based access transistor of this memory cell and the upper memory cell. Further, a word line WLD1 (fourth word line) is provided within the lower memory cell region so as to traverse the cells in parallel to these word lines. Here, the word line WLD1 controls a D port-based access transistor of this memory cell and the lower memory cell. That is, the access transistors within the memory cell region MC1 are controlled by these four word lines.

Similarly, for example, regarding the memory cell region MC2, the word lines WLA2 and WLD2 (corresponding to the first word line and the second word line, respectively) are traversed, and the word line WLB1 (third word line) extends along the boundary in the vicinity of the lower cell boundary. Here, the word line WLA2 controls the A port-based access transistor within the memory cell region MC2, and the word line WLD2 controls the D port-based access transistor of this memory cell and the upper memory cell. On the other hand, the word line WLB1 controls the B port-based access transistor of this memory cell and the lower memory cell. Further, the word line WLC2 (fourth word line) is provided within the upper memory cell region MC3 so as to traverse the cells in parallel to these word lines. Here, the word line WLC2 controls the C port-based access transistor of this memory cell and the upper memory cell. That is, the access transistors within the memory cell region MC2 are controlled by these four word lines.

Similarly, for example, regarding the memory cell region MC3, the word lines WLA3 and WLC2 (corresponding to the first word line and the second word line, respectively) are traversed, and the word line WLB2 (third word line) extends along the boundary in the vicinity of the upper cell boundary. Here, the word line WLA3 controls the A port-based access transistor within the memory cell region MC3, and the word line WLC2 controls the C port-based access transistor of this memory cell and the lower memory cell. On the other hand, the word line WLB2 controls the B port-based access transistor of this memory cell and the upper memory cell. Further, the word line WLD2 (fourth word line) is provided within the lower memory cell region MC2 so as to traverse the cells in parallel to these word lines. Here, the word line WLD2 controls the D port-based access transistor of this memory cell and the lower memory cell. That is, the access transistors within the memory cell region MC3 are controlled by these four word lines.

Next, readout operations will be simply described. The operations are basically the same as those described in FIG. 15, and thus portions different therefrom will be mainly described. That is, a port A and a port B which are differential ports are completely the same as those described in FIG. 15. The differences therefrom are a port C and a port D which are single ended ports as shown in FIGS. 22 and 23.

As shown in FIG. 22, regarding the readout operation of the port C, the column control circuit region CD selects any of the C port true bit lines BLC0 and BLC1 on the basis of the address signal AD. The information which is read out to the true data line DL is amplified by a single ended sense amplifier SAS, and is output to the data output control circuit RB. Consequently, the information is latched or the like, and is output to the outside of the embedded SRAM region EM (FIG. 1), as the readout signal RS.

Similarly, as shown in FIG. 23, regarding the readout operation of the port D, the column control circuit region CD selects any of the D port complementary bit lines BLD0B and BLD1B on the basis of the address signal AD. The information which is read out to the complementary data line DLB is amplified by the single ended sense amplifier SAS, and is output to the data output control circuit RB. Consequently, the information is latched or the like and reversed, and then is output to the outside of the embedded SRAM region EM (FIG. 1), as the readout signal RS.

As described above, since the C port-based bit line and the D port-based bit line having a single ended bit line configuration are formed by multiplexing of the B and C port-based bit lines and interleaved connection between the B and C port-based word lines, and further the division of the C port-based bit line pair, the number of word lines is 2.5 per cell. Therefore, as compared to Section (2-6), it is possible to add two single ended ports (readout dedicated ports) while securing two fast differential ports (write and readout ports) in return for a slight increase in cell area.

2-8. Description of Modification Example 6 (First-Layer Power Supply Vertical Wiring Configuration 3 Ports) Relating to Cell Layout of Embedded SRAM in Semiconductor Integrated Circuit Device of the Embodiment of the Present Application (Mainly FIGS. 27 and 28)

The description in this section belongs to the modification example relating to the cell layout of the examples described in Sections (2-1) and (2-2), but can also be regarded as the modification example of the example described directly in Section (2-4).

This example is basically the same as that illustrated in Section (2-4), and thus in principle, only different portions will be described below.

In addition, this example can be combined with various types of example, but can be combined with, for example, one or a plurality of Sections (2-3) to (2-7) and Sections (2-9) to (2-12).

Figure 27:
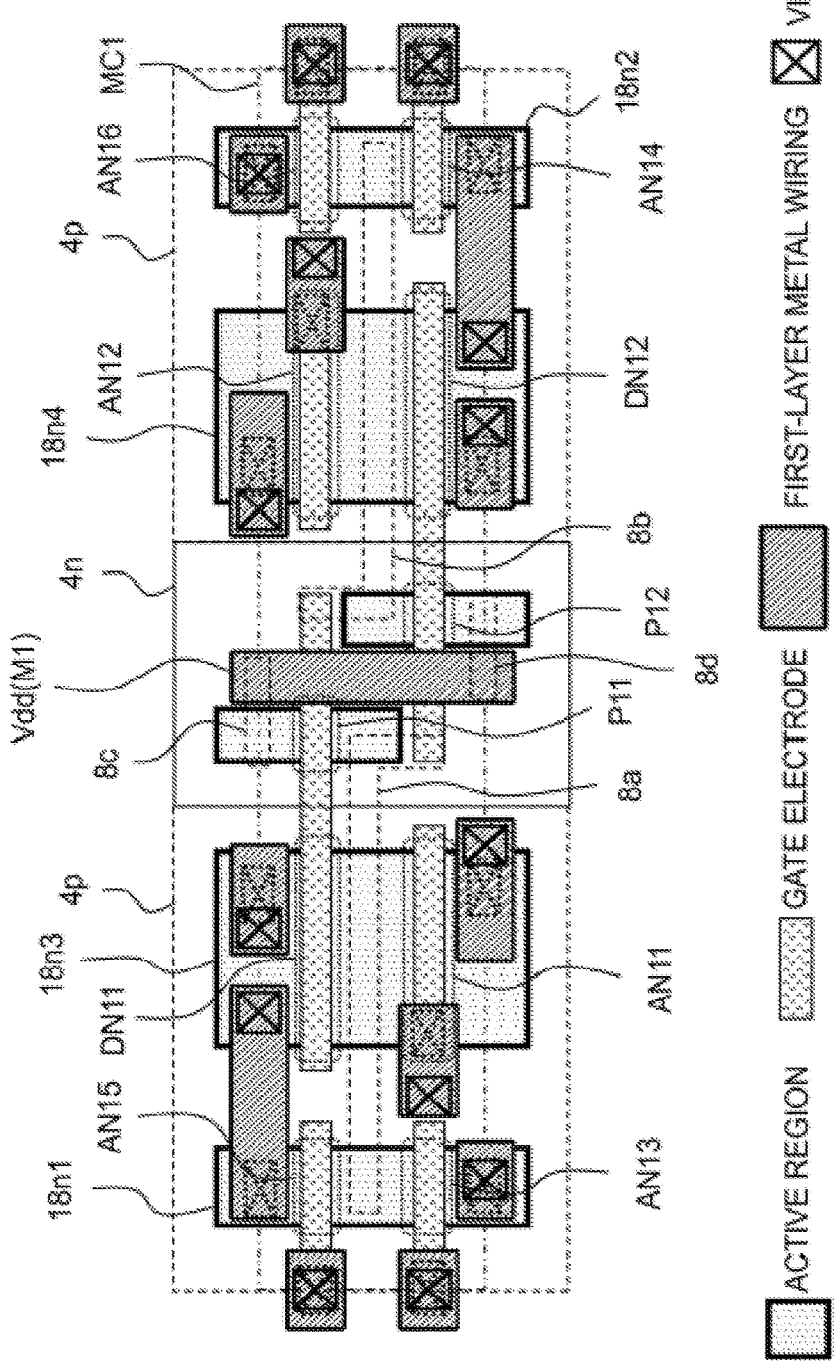
FIG. 27 is an enlarged planar layout diagram (displaying up to the 1-2 interlayer via 21) of the memory cell region MC of FIG. 1 for illustrating Modification Example 6 (first-layer power supply vertical wiring configuration 3 port) relating to the cell layout of the embedded SRAM in the semiconductor integrated circuit device of the embodiment of the present application.
Figure 28:
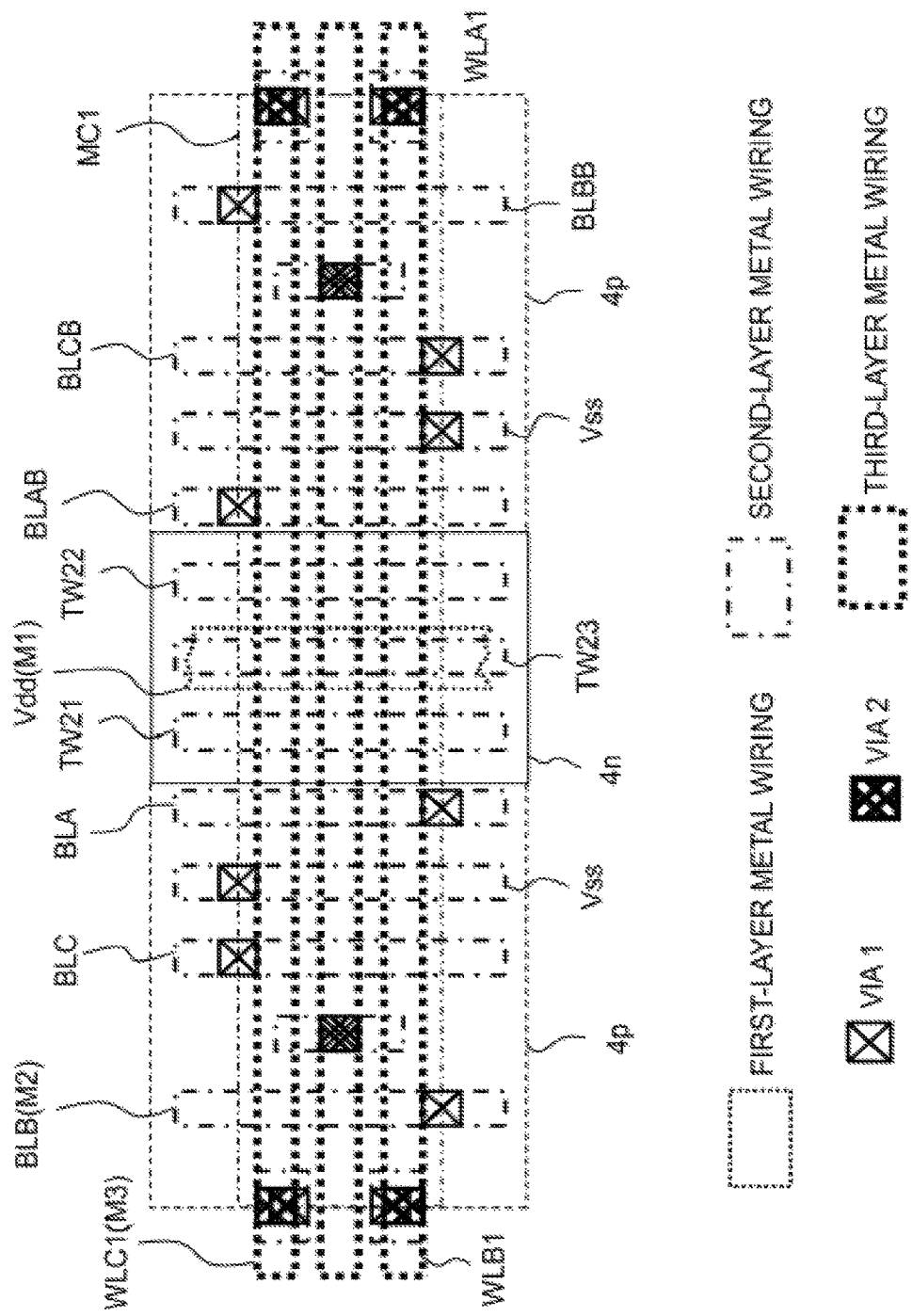
FIG. 28 is an enlarged planar layout diagram (mainly displaying the second-layer embedded wiring M2 and the third-layer embedded wiring M3) of the memory cell region MC of FIG. 1 corresponding to FIG. 27.

FIG. 27 is an enlarged planar layout diagram (displaying up to the 1-2 interlayer via 21) of the memory cell region MC of FIG. 1 for illustrating Modification Example 6 (first-layer power supply vertical wiring configuration 3 port) relating to the cell layout of the embedded SRAM in the semiconductor integrated circuit device of the embodiment of the present application. FIG. 28 is an enlarged planar layout diagram (mainly displaying the second-layer embedded wiring M2 and the third-layer embedded wiring M3) of the memory cell region MC of FIG. 1 corresponding to FIG. 27. Modification Example 6 (first-layer power supply vertical wiring configuration 3 port) relating to the cell layout of the embedded SRAM in the semiconductor integrated circuit device of the embodiment of the present application will be described with reference to these drawings.

This example is basically the same as that illustrated in FIG. 9, but as shown in FIGS. 27 and 28, has a feature that the power supply wiring Vdd (power supply wiring) at the central portion of each memory cell region MC1 is constituted by the first embedded wiring M1 by replacing some of portions interconnected by the first embedded wiring M1 with LICs (8a, 8b, 8c, 8d).

As described above, the power supply wiring constituted by the first embedded wiring is passed longitudinally through the central portion of the N-type well region 4n (first conductivity type well region), and thus there is an advantage that the second-layer embedded wiring can be freely used in a signal wiring or the like in the peripheral portion thereof.

2-9. Description of Modification Example 7 (B&C Port-Based Access MISFET Mutual Upside-Down 3 Ports) Relating to Cell Layout of Embedded SRAM in Semiconductor Integrated Circuit Device of the Embodiment of the Present Application (Mainly FIGS. 29 to 31)

The description in this section is the modification example relating to the cell layout of the examples described in Sections (2-1) and (2-2).

This example is basically the same as those illustrated in Sections (2-1) and (2-2), and thus in principle, only different portions will be described below.

In addition, this example can be combined with various types of example, but can be combined with, for example, one or a plurality of Sections (2-2) to (2-8) and Sections (2-10) to (2-12).

Figure 29:
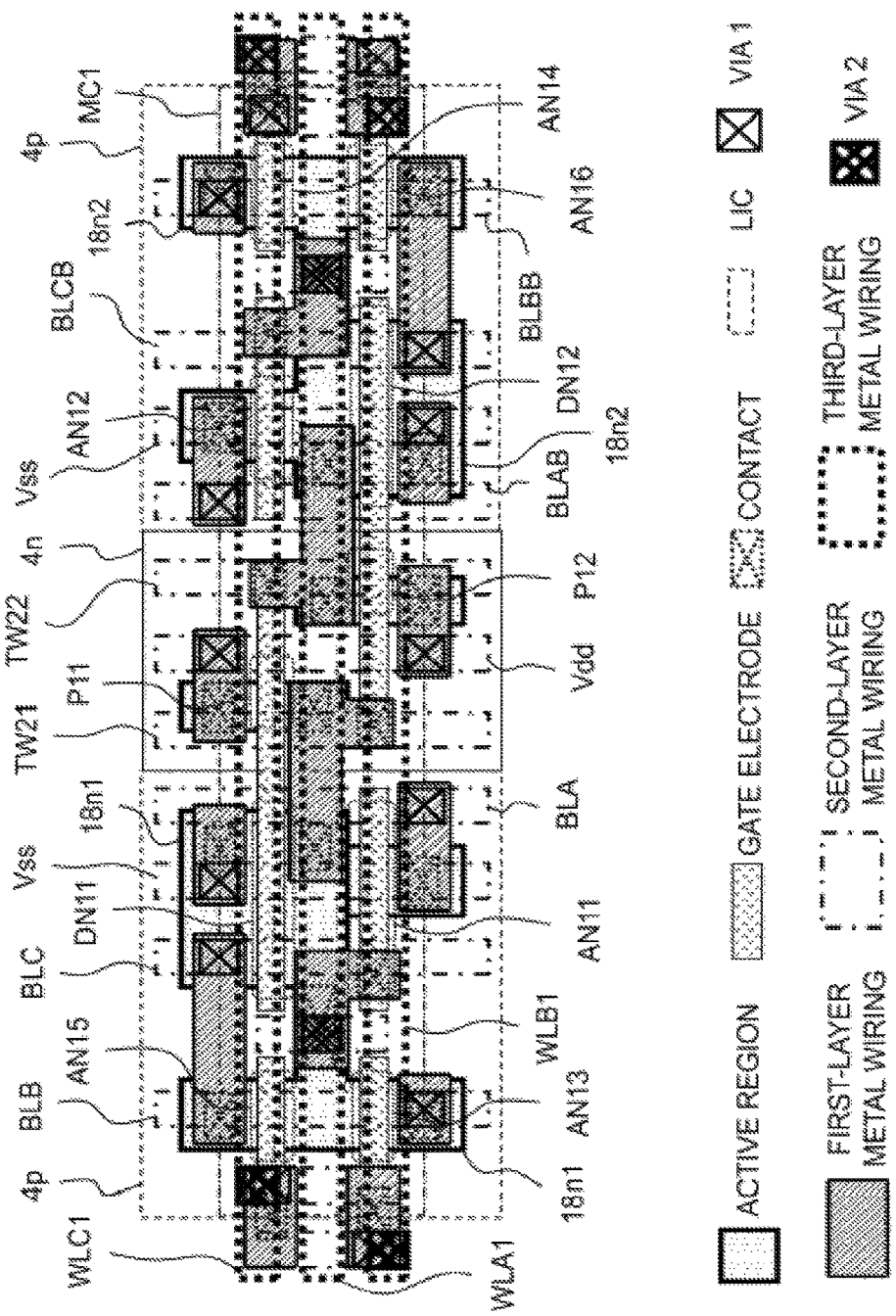
FIG. 29 is an enlarged planar layout diagram (displaying up to the third-layer embedded wiring) of the memory cell region MC of FIG. 1 for illustrating Modification Example 7 (B&C port-based access MISFET mutual upside-down 3 port) relating to the cell layout of the embedded SRAM in the semiconductor integrated circuit device of the embodiment of the present application.
Figure 30:
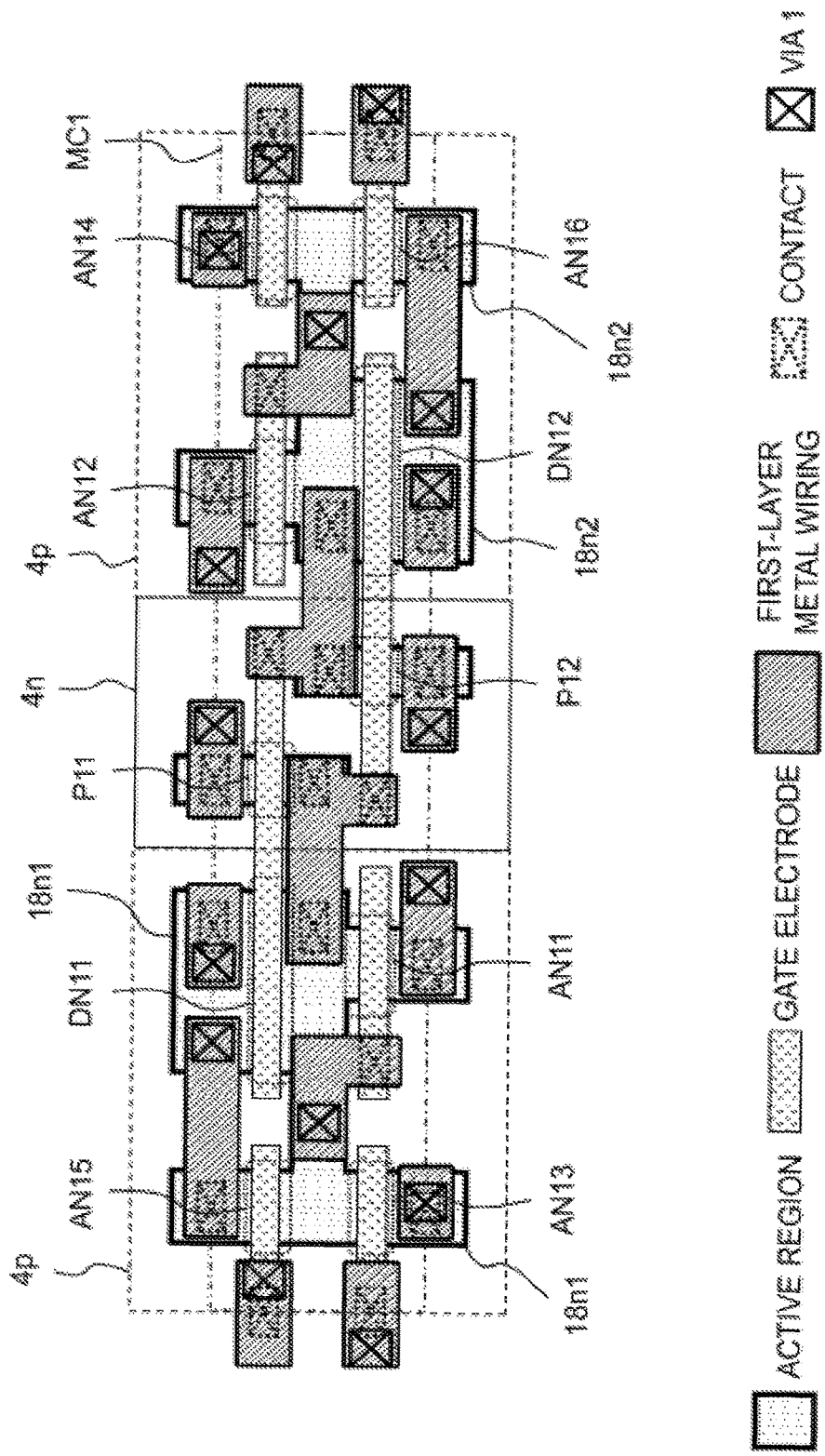
FIG. 30 is an enlarged planar layout diagram (displaying up to the 1-2 interlayer via 21) of the memory cell region MC of FIG. 1 corresponding to FIG. 29.
Figure 31:
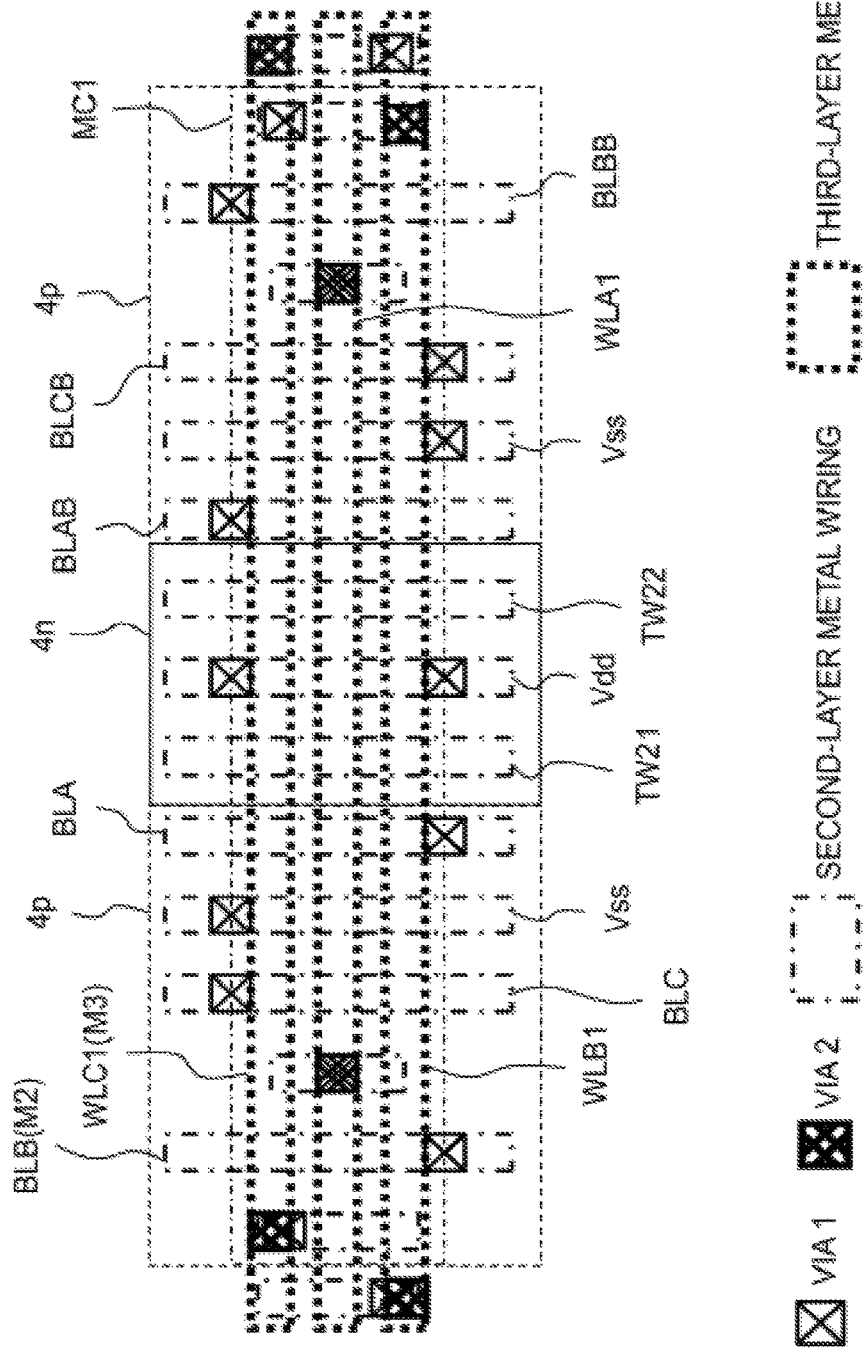
FIG. 31 is an enlarged planar layout diagram (mainly displaying the second-layer embedded wiring M2 and the third-layer embedded wiring M3) of the memory cell region MC of FIG. 1 corresponding to FIG. 29.

FIG. 29 is an enlarged planar layout diagram (displaying up to the third-layer embedded wiring) of the memory cell region MC of FIG. 1 for illustrating Modification Example 7 (B&C port-based access MISFET mutual upside-down 3 port) relating to the cell layout of the embedded SRAM in the semiconductor integrated circuit device of the embodiment of the present application. FIG. 30 is an enlarged planar layout diagram (displaying up to the 1-2 interlayer via 21) of the memory cell region MC of FIG. 1 corresponding to FIG. 29. FIG. 31 is an enlarged planar layout diagram (mainly displaying the second-layer embedded wiring M2 and the third-layer embedded wiring M3) of the memory cell region MC of FIG. 1 corresponding to FIG. 29. Modification Example 7 (B&C port-based access MISFET mutual upside-down 3 port) relating to the cell layout of the embedded SRAM in the semiconductor integrated circuit device of the embodiment of the present application will be described with reference to these drawings.

This example is basically the same as those illustrated in FIGS. 4 to 6, but as shown in FIGS. 29 to 31, has a feature that, regarding each memory cell region MC1, vertical positional relationships between the N-channel type access MISFETs (AN13, AN15) and the N-channel type access MISFETs (AN14, AN16) are mutually reversed.

As described above, the positions of the B port-based and C port-based access transistors are vertically reversed in one P-type well region (second conductivity type well region), and thus a load capacity balance between the B port-based and C port-based bit line pairs can be made satisfactory.

2-10. Description of Modification Example 8 (Fin Basic Type 3 Ports) Relating to Cell Layout of Embedded SRAM in Semiconductor Integrated Circuit Device of the Embodiment of the Present Application (Mainly FIGS. 32 and 33)

The description in this section belongs to the modification example relating to the cell layout of the examples described in Sections (2-1) and (2-2), but can also be regarded as the modification example of the example described directly in Section (2-3).

This example is basically the same as that illustrated in Section (2-3), and thus in principle, only different portions will be described below.

Meanwhile, in this example, the fin type MISFET will be specifically described byway of example of a bulk system, but it goes without saying that an SOI system or the like may be used. However, the bulk system has an advantage that a process is simple. This is also the same as in the following section.

In addition, this example can be combined with various types of example, but can be combined with, for example, one or a plurality of Sections (2-2) to (2-9).

Figure 32:
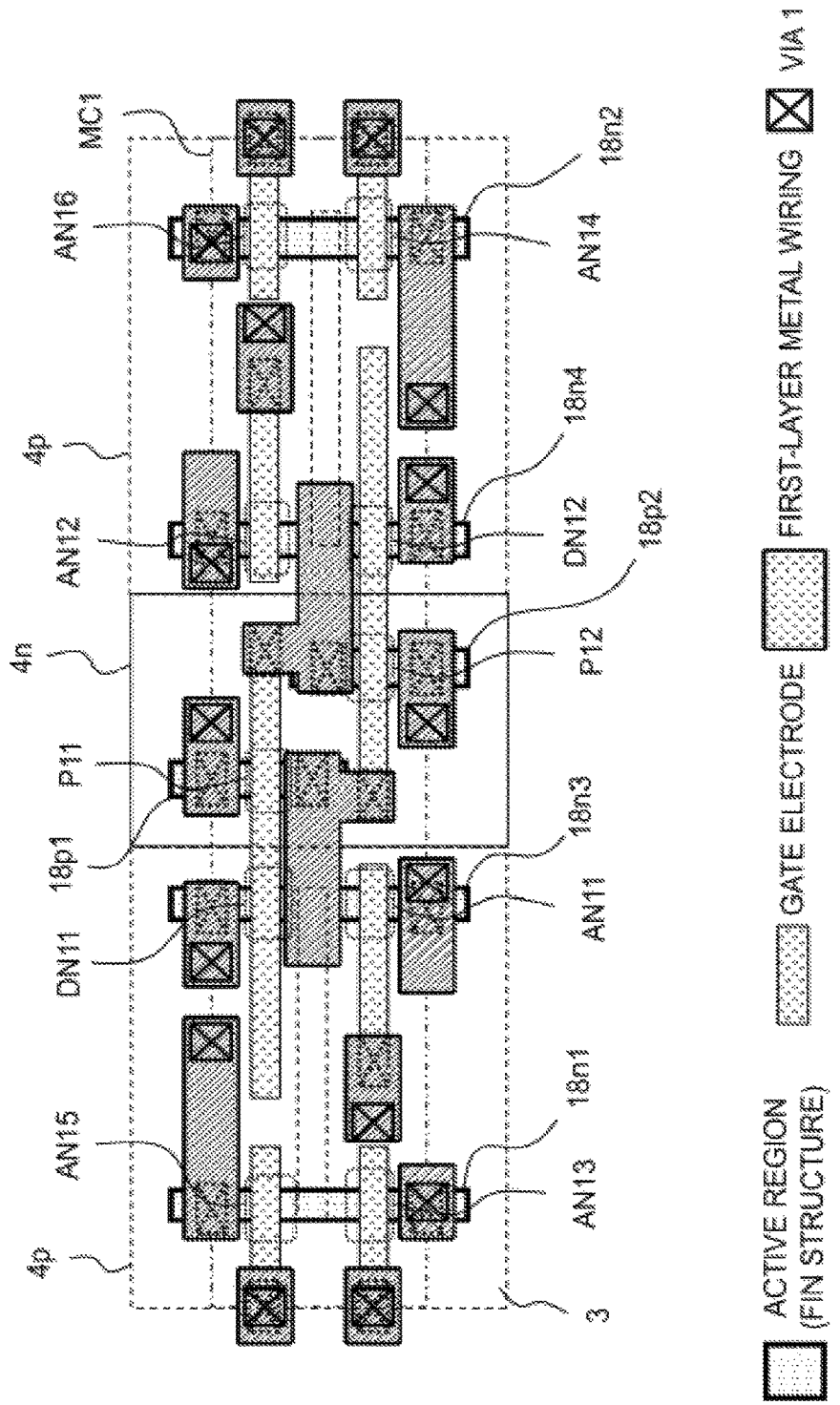
FIG. 32 is an enlarged planar layout diagram (displaying up to the 1-2 interlayer via 21) of the memory cell region MC of FIG. 1 for illustrating Modification Example 8 (fin basic type 3 port) relating to the cell layout of the embedded SRAM in the semiconductor integrated circuit device of the embodiment of the present application.
Figure 33:
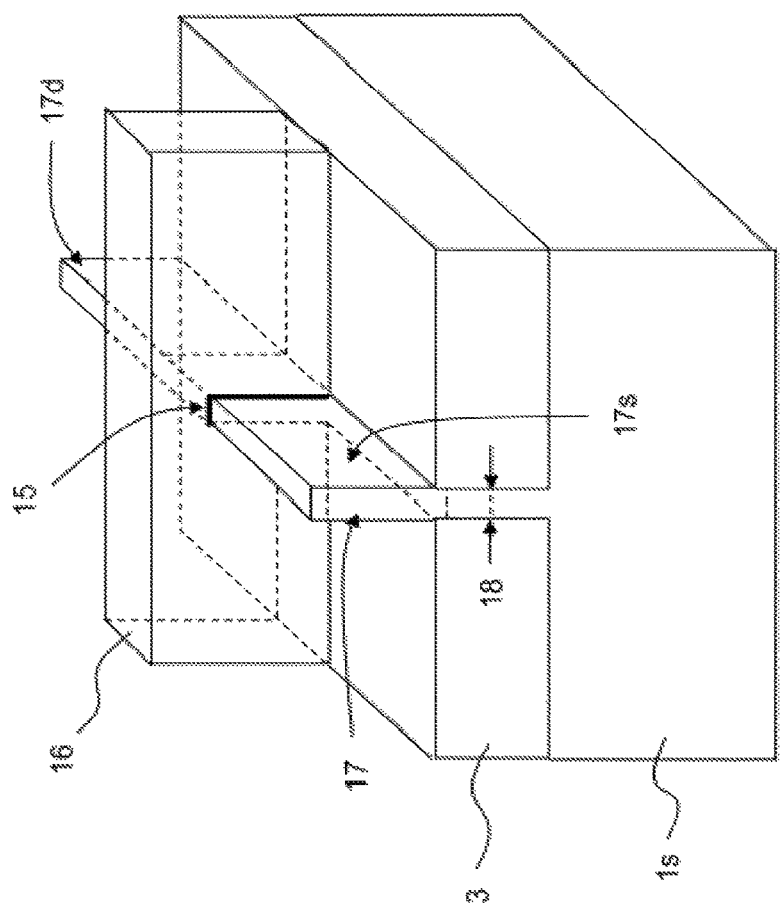
FIG. 33 is a device perspective view illustrating an example of the three-dimensional shape of a fin type MISFET of FIG. 32.

FIG. 32 is an enlarged planar layout diagram (displaying up to the 1-2 interlayer via 21) of the memory cell region MC of FIG. 1 for illustrating Modification Example 8 (fin basic type 3 port) relating to the cell layout of the embedded SRAM in the semiconductor integrated circuit device of the embodiment of the present application. FIG. 33 is a device perspective view illustrating an example of a three-dimensional shape of a fin type MISFET of FIG. 32. Modification Example 8 (fin basic type 3 port) relating to the cell layout of the embedded SRAM in the semiconductor integrated circuit device of the embodiment of the present application will be described with reference to these drawings.

In this example, as shown in FIG. 32, similarly to FIG. 7, the active regions 18n1, 18n2, 18n3, and 18n4 having the N-type source drain region and the like formed therein have vertically-long rectangular shapes, respectively, are geometrically isolated from each other by the STI region 3 (element isolation region), and are arranged vertically long within the P-type well region 4p. In this example, the planar widths of the respective active regions 18n1, 18n2, 18n3, and 18n4 become equal to each other. Thereby, lithography is facilitated.

Further, as shown in FIG. 33, an additional feature is that each of the N-channel type MISFETs (DN11, DN12, AN11, AN12, AN13, AN14, AN15, AN16) and each of the P-channel type MISFETs (P11, P12) are constituted by a fin type MISFET. Here, the P-channel type MISFETs (P11, P12) are first and second pull-up MISFETs, respectively. As shown in FIG. 33, in a typical fin type MISFET (bulk system in this example), an active region 18 partitioned by, for example, the STI region 3 (element isolation region) is located on the surface of the single-crystal silicon substrate is, and the upper portion thereof is formed as a fin 17. A gate electrode 16 is laid over through a gate insulating film 15 in a direction perpendicular to the fin 17, and portions of the fin 17 on both sides are formed as a source region 17s and a drain region 17d, respectively.

In this manner, in the fin type MISFET, the apparent width of the active region becomes smaller, but both sides also contribute to effectiveness, and thus it is possible to secure a relatively wide and effective width (that is, gate width) of the active region. Meanwhile, in this example, in case that the "width of the active region" is simply referred to, this indicates the "apparent width", that is, the "planar width of the active region".

In this example, the width of the active region and the height of the fin are the same as each other in both the N-channel type MISFET and the P-channel type pull-up MISFET. This is because fine processing is facilitated in terms of the structure of the fin type transistor.

In addition, this is because the application of SiGe or the like to the source drain region of the P-channel type pull-up MISFET does not cause any defect in drive capability even in case that the width of the active region and the height of the fin are made to be the same as those of the N-channel type MISFET. In addition, as in the following description, in case that the drive capability of the P-channel type pull-up MISFET is enhanced, parallelization can also be performed.

Meanwhile, it goes without saying that the width of the active region and the height of the fin may be made different from each other in each of the N-channel type MISFET and the P-channel type pull-up MISFET.

As described above, since the N-channel type MISFET and the P-channel type MISFET (which are not limited to the pull-up MISFET) constituting each memory cell are constituted by the fin type MISFET, drive capability is secured, and then a reduction in size can be achieved.

2-11. Description of Modification Example 8 (Data Storage Unit N-Channel Type MISFET Total Parallel Fin Type 3 Ports) Relating to Cell Layout of Embedded SRAM in Semiconductor Integrated Circuit Device of the Embodiment of the Present Application (Mainly FIGS. 34 and 35)

The description in this section belongs to the modification example relating to the cell layout of the examples described in Sections (2-1) and (2-2), but can also be regarded as the modification example of the example described directly in Section (2-10).

This example is basically the same as that illustrated in Section (2-10), and thus in principle, only different portions will be described below.

In addition, this example can be combined with various types of example, but can be combined with, for example, one or a plurality of Sections (2-2) to (2-9).

Further, in this example, an example will be described in which all the A port-based N-channel type MISFETs (meanwhile, a driver is common to all the ports) are parallelized, but as shown in the next section, parallelization may be performed on some of the A port-based N-channel type MISFETs, and may be performed on all or some of the N-channel type MISFETs belonging to ports of other systems. In addition, the P-channel type MISFETs may be parallelized.

In addition, the number of columns of parallelization will be specifically described herein by way of example of a case of two columns, but may be three or more without being limited to two columns.

Figure 34:
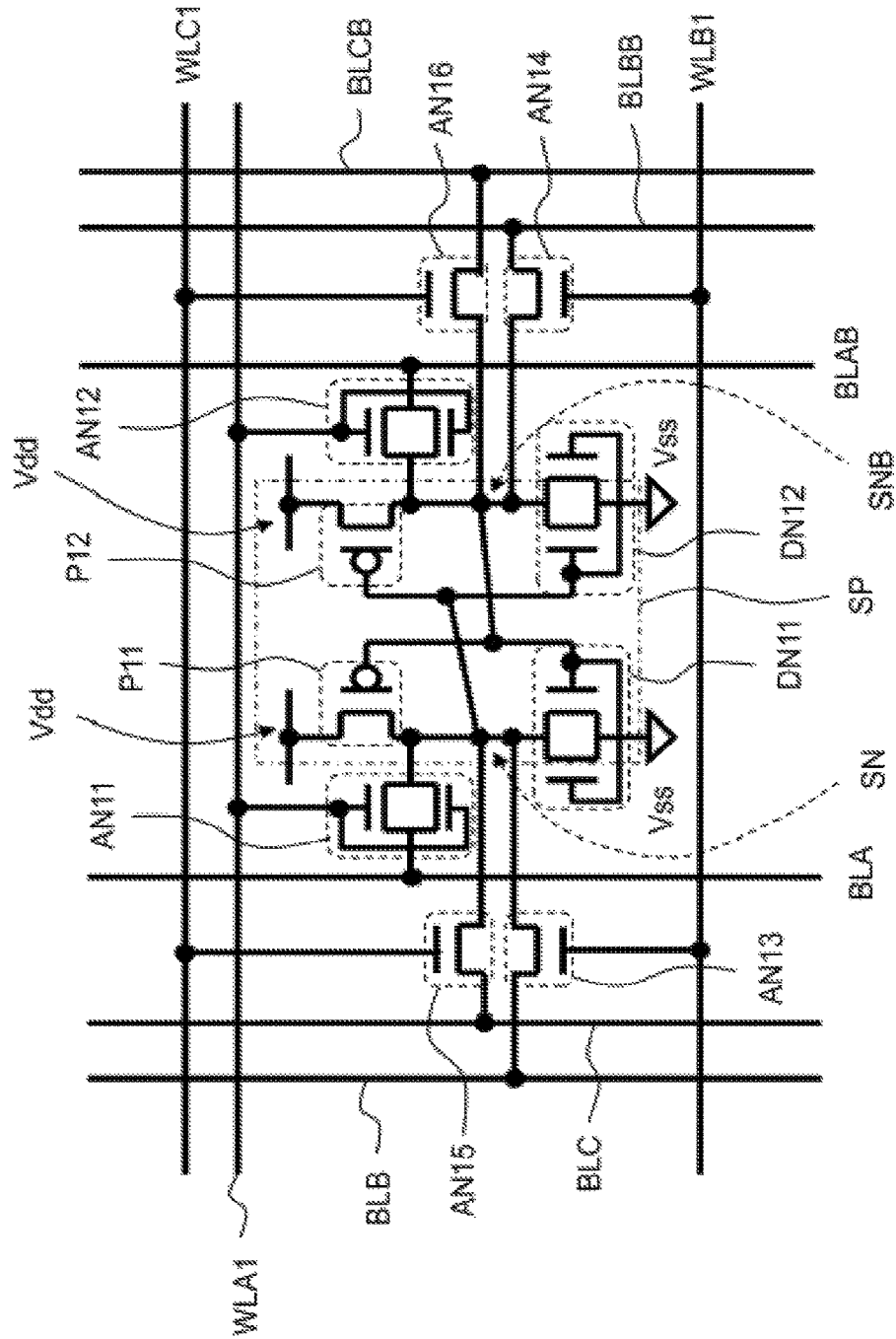
FIG. 34 is a schematic circuit diagram of the memory cell region MC of FIG. 1 corresponding to FIG. 3 for illustrating Modification Example 8 (data storage unit N-channel type MISFET total parallel fin type 3 port) relating to the cell layout of the embedded SRAM in the semiconductor integrated circuit device of the embodiment of the present application.
Figure 35:
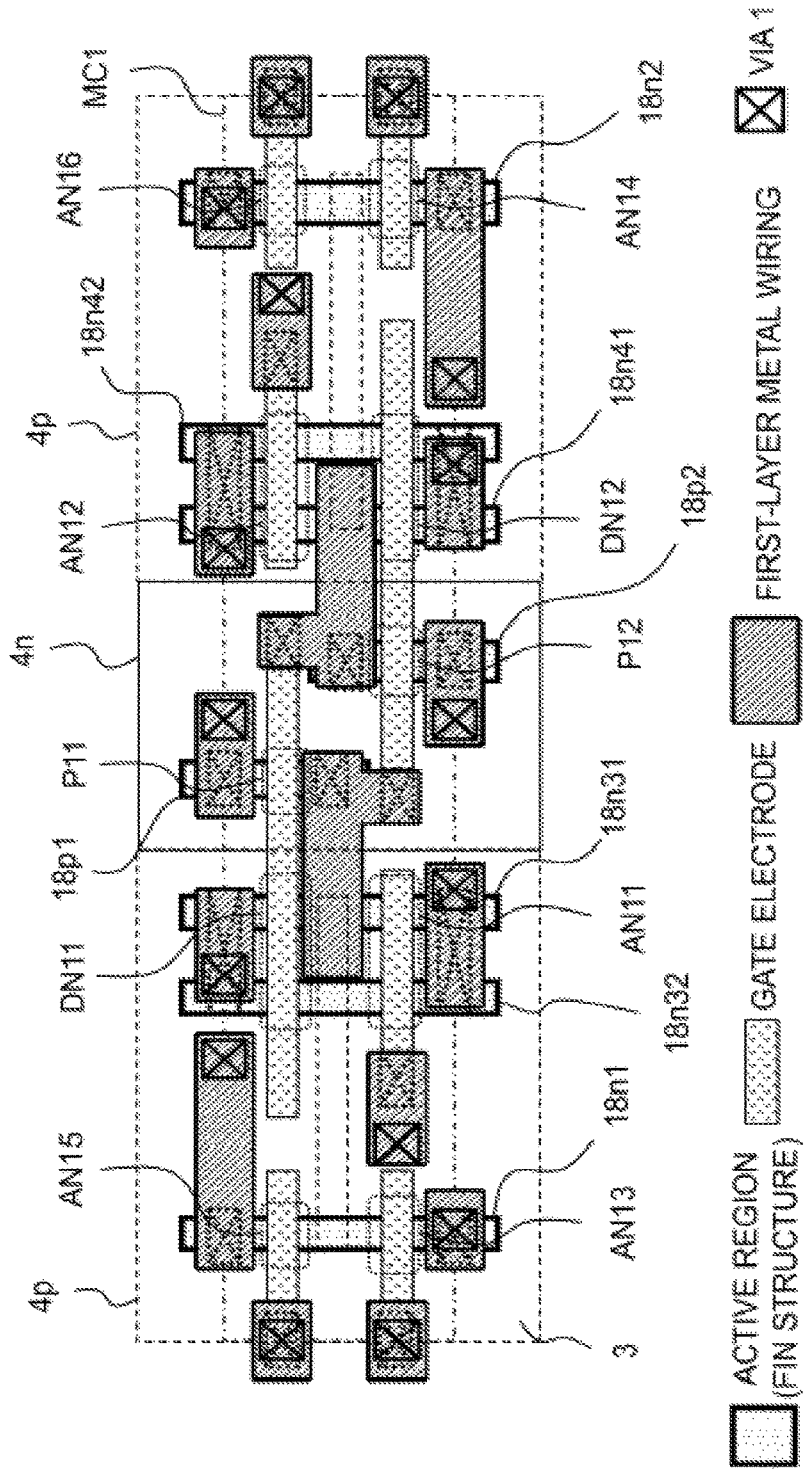
FIG. 35 is an enlarged planar layout diagram (displaying up to the 1-2 interlayer via 21) of the memory cell region MC of FIG. 1 corresponding to FIG. 34.

FIG. 34 is a schematic circuit diagram of the memory cell region MC of FIG. 1 corresponding to FIG. 3 for illustrating Modification Example 8 (data storage unit N-channel type MISFET total parallel fin type 3 port) relating to the cell layout of the embedded SRAM in the semiconductor integrated circuit device of the embodiment of the present application. FIG. 35 is an enlarged planar layout diagram (displaying up to the 1-2 interlayer via 21) of the memory cell region MC of FIG. 1 corresponding to FIG. 34. Modification Example 8 (data storage unit N-channel type MISFET total parallel fin type 3 port) relating to the cell layout of the embedded SRAM in the semiconductor integrated circuit device of the embodiment of the present application will be described with reference to these drawings.

This example is basically the same as that of FIG. 32, but as shown in FIGS. 34 and 35, has an additional feature that each of the N-channel type MISFETs (DN11, DN12, AN11, AN12) is constituted by a parallel type MISFET.

In addition, in this example, similarly to FIG. 32, active regions 18n1 and 18n2, 18n31, 18n32, 18n41, 18n42 having the N-type source drain region and the like formed therein also have vertically-long rectangular shapes, respectively, are geometrically isolated from each other by the STI region 3 (element isolation region), and are arranged vertically long within the P-type well region 4p. In this example, the planar widths of the active regions 18n1, 18n2, 18n3, and 18n4 become equal to each other. Thereby, lithography is facilitated.

As described above, since all the A port-based N-channel type MISFETs constituting each memory cell are parallelized (multiple parallelization, two in this example), it is possible to improve the drive capability of the A port-based N-channel type MISFET while securing consistency with a fin process. Thereby, it is possible to perform further speeding up of A port-based write and readout. In addition, it is possible to improve a write margin from the A port base.

2-12. Description of Modification Example 9 (a Port-Based Access MISFET Parallel Fin Type 3 Ports) Relating to Cell Layout of Embedded SRAM in Semiconductor Integrated Circuit Device of the Embodiment of the Present Application (Mainly FIGS. 36 and 37)

The description in this section belongs to the modification example relating to the cell layout of the examples described in Sections (2-1) and (2-2), but can also be regarded as the modification example of the example described directly in Section (2-11).

This example is basically the same as that illustrated in Section (2-11), and thus in principle, only different portions will be described below.

In addition, this example can be combined with various types of example, but can be combined with, for example, one or a plurality of Sections (2-2) to (2-9).

Figure 36:
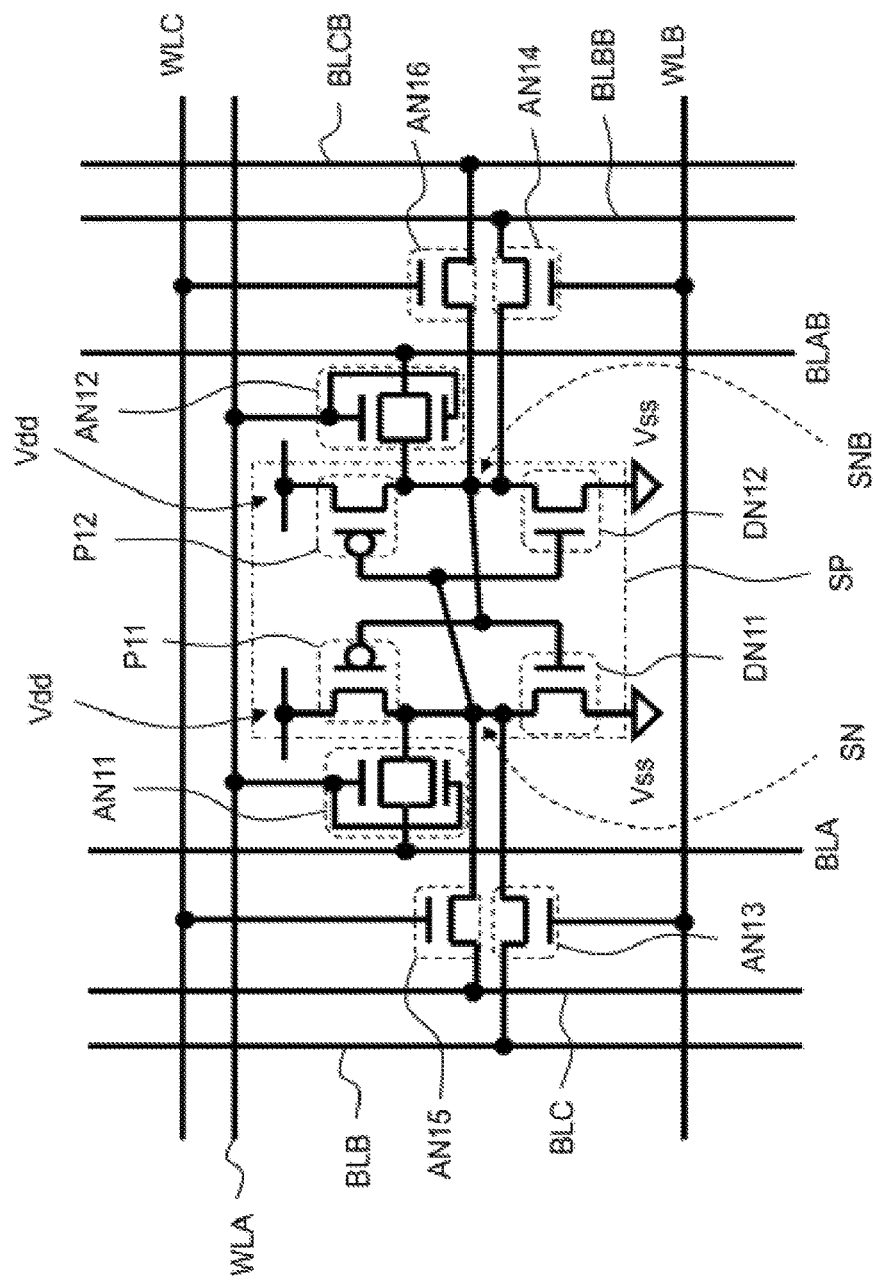
FIG. 36 is a schematic circuit diagram of the memory cell region MC of FIG. 1 corresponding to FIG. 34 for illustrating Modification Example 9 (A port-based access MISFET parallel fin type 3 port) relating to the cell layout of the embedded SRAM in the semiconductor integrated circuit device of the embodiment of the present application.
Figure 37:
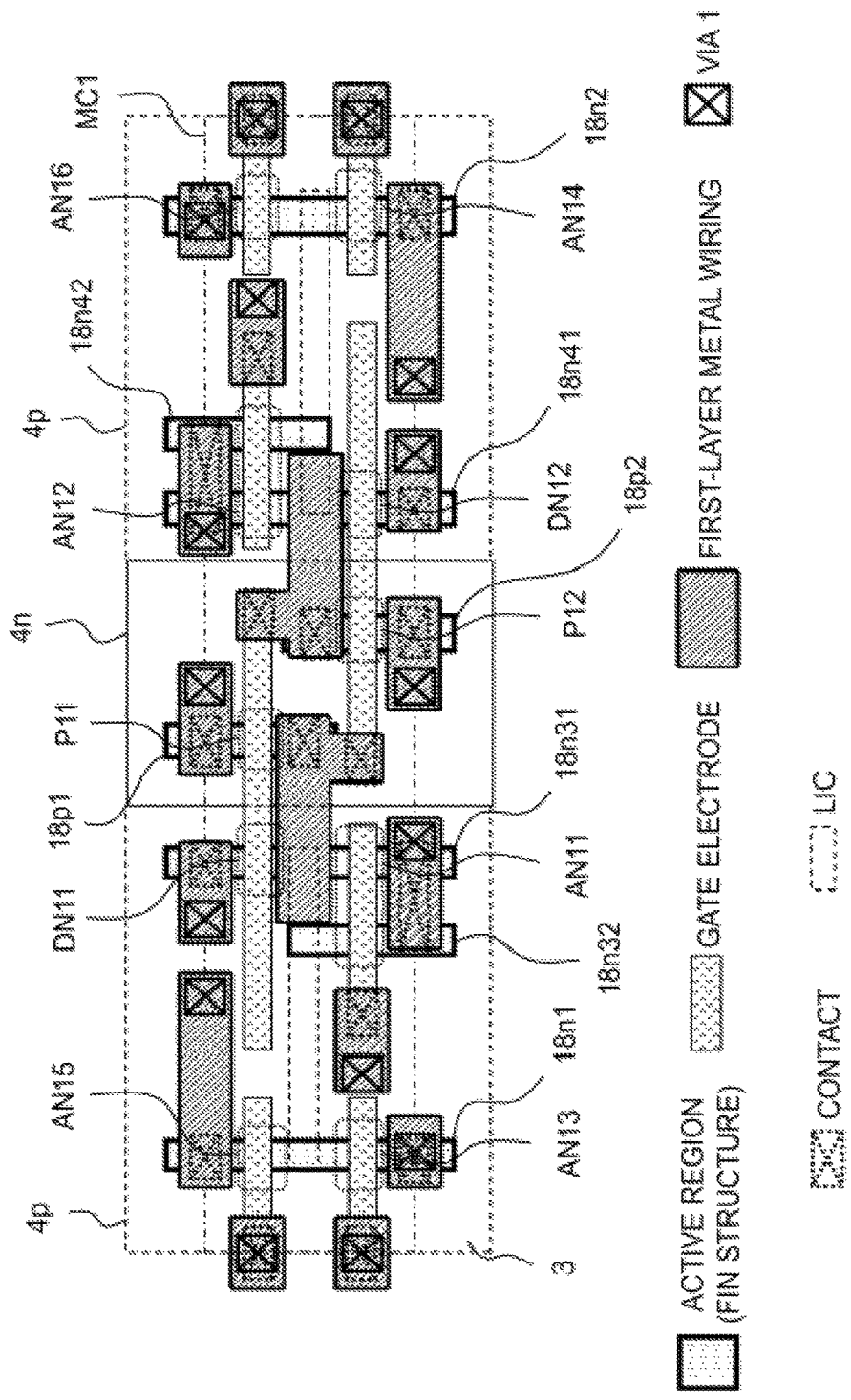
FIG. 37 is an enlarged planar layout diagram (displaying up to the 1-2 interlayer via 21) of the memory cell region MC of FIG. 1 corresponding to FIG. 36.

FIG. 36 is a schematic circuit diagram of the memory cell region MC of FIG. 1 corresponding to FIG. 34 for illustrating Modification Example 9 (A port-based access MISFET parallel fin type 3 port) relating to the cell layout of the embedded SRAM in the semiconductor integrated circuit device of the embodiment of the present application. FIG. 37 is an enlarged planar layout diagram (displaying up to the 1-2 interlayer via 21) of the memory cell region MC of FIG. 1 corresponding to FIG. 36. Modification Example 9 (A port-based access MISFET parallel fin type 3 port) relating to the cell layout of the embedded SRAM in the semiconductor integrated circuit device of the embodiment of the present application will be described with reference to these drawings.

This example is basically the same as those of FIGS. 34 and 35, but as shown in FIGS. 36 and 37, has an additional feature that each of the N-channel type MISFETs (AN11, AN12) is constituted by a parallel type MISFET.

In addition, in this example, similarly to FIG. 35, active regions 18n1 and 18n2, 18n31, 18n32, 18n41, 18n42 having the N-type source drain region and the like formed therein also have vertically-long rectangular shapes, respectively, are geometrically isolated from each other by the STI region 3 (element isolation region), and are arranged vertically long within the P-type well region 4p. In this example, the planar widths of the active regions 18n1, 18n2, 18n3, and 18n4 become equal to each other. Thereby, lithography is facilitated.

As described above, since only the A port-based N-channel type access MISFETs constituting each memory cell are parallelized (multiple parallelization, two in this example), it is possible to improve a write margin from the A port base. In addition, parallelization is performed on only the N-channel type access MISFETs, and it is possible to suppress an increase in a standby leakage current as compared to the example of Section (2-11).

2-13. Consideration to Supplementary Description Relating to the Embodiment (Including Modification Example) and the Whole (Mainly FIG. 38)

Figure 38:
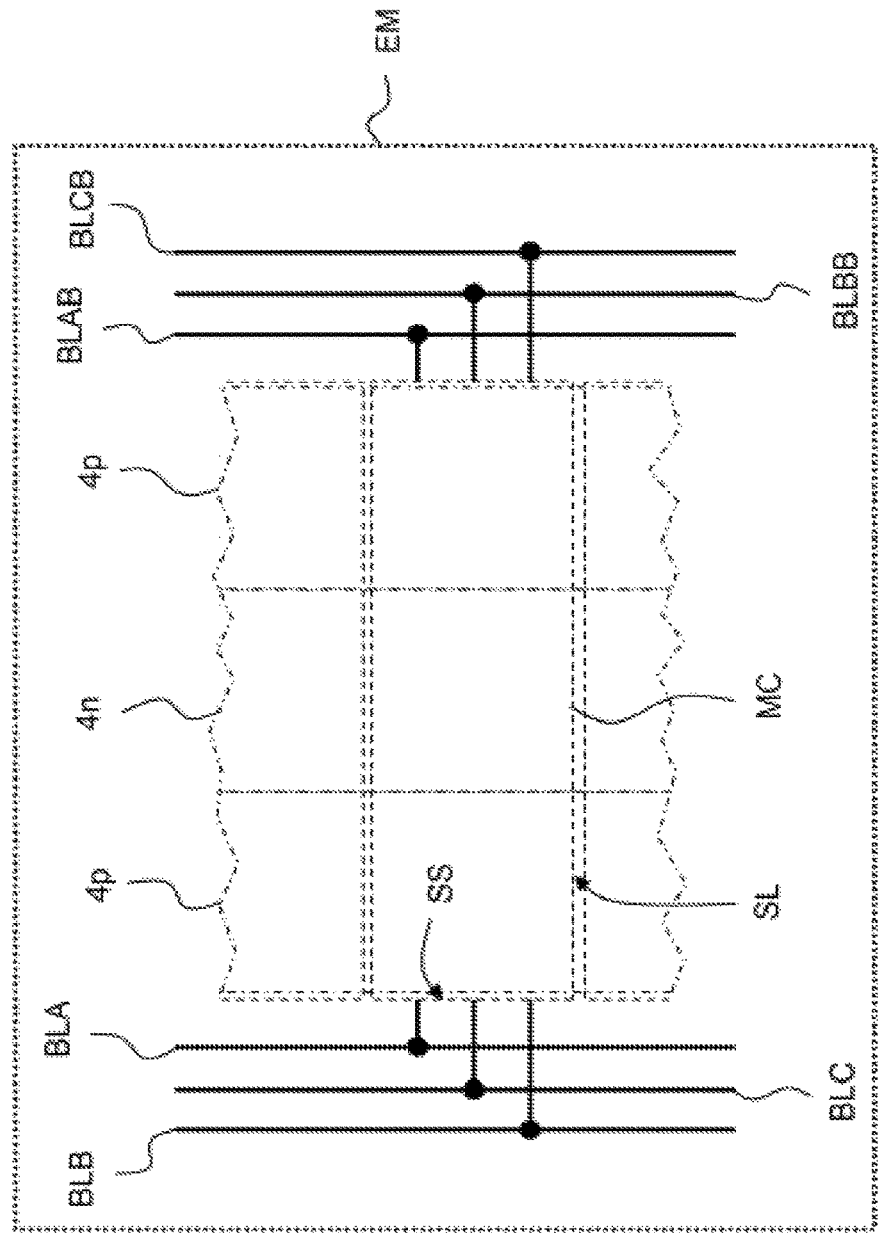
FIG. 38 is a schematic circuit configuration diagram of the embedded SRAM region EM for illustrating the outline of the embedded SRAM in the semiconductor integrated circuit device of the embodiment of the present application.

FIG. 38 is a schematic circuit configuration diagram of the embedded SRAM region EM illustrating the outline of the embedded SRAM in the semiconductor integrated circuit device of the embodiment of the present application. Consideration will be given to a supplementary description relating to the embodiment (including the modification example) and the whole with reference to the drawing.

(1) Technical Problem of Embedded Multi-Port SRAM and the Like

As first described above, in a chip that processes image information or the like, a multi-port SRAM is mixed together with a logic circuit such as a digital signal processing circuit. In that case, for example, in case that the 3 port is used, the 1 port may serve as a differential write and readout port, and the 2 port may serve as a single ended readout dedicated port. However, according to examination by the present application inventor, in this configuration, it is obvious that there is a problem, in that while the occupied area of an embedded SRAM is reduced, the number of write and readout ports is limited to only one, and readout characteristics as fast as differential readout cannot be expected in single ended readout.

(2) Description of Outline of Semiconductor Integrated Circuit Device of the Embodiment (See Mainly FIG. 38)

Consequently, the memory cell of the multi-port embedded SRAM of the semiconductor integrated circuit device of the embodiment has a configuration as shown in FIG. 38. That is, three differential write and readout ports are included in the memory cell structure of the embedded SRAM, an N-well region, for example, (or, first conductivity type well region) is arranged at the center of a cell, and a P-well region (or, second conductivity type well region) is arranged on both sides thereof. Specifically, as shown in FIG. 38, three pairs of bit lines BLA, BLAB, BLB, BLBB, BLC, and BLCB are provided for each column within the embedded SRAM region EM. In addition, a large number of memory cell regions MC are arranged in a matrix in the memory cell arrangement region MA within the embedded SRAM region EM so that the extending direction of the bit lines BLA, BLAB, BLB, BLBB, BLC, and BLCB is perpendicular to the long side (SL) thereof. That is, three pairs of bit lines BLA, BLAB, BLB, BLBB, BLC, and BLCB extend so as to be along the short side SS of the memory cell region MC. The central portion of each memory cell region MC is formed as, for example, the N-type well region 4n (first conductivity type well region), and both sides thereof are formed as the P-type well region 4*p* (second conductivity type well region).

Thereby, it is possible to secure a plurality of fast write and readout ports without considerably increasing the occupied area of a cell.

2-14. Summary

As stated above, while the invention devised by the inventor has been described specifically based on the embodiments thereof, the invention is not limited to the above-mentioned embodiments, and it goes without saying that various changes and modifications may be made without departing from the scope of the invention.

For example, in the embodiment, regarding the vertical structure of a device (mainly structure other than the planar layout) in order to secure simplicity, the planar gate (except Sections (2-10) to (2-12)) has been specifically described on the assumption of a gate first process, but it goes without saying that a gate last process and these intermediate processes may be used.

In addition, a source drain structure is also simplified and shown, but it goes without saying that an elevated source drain region may be included.

Further, the P-channel type MISFET has been described on the assumption that a Si-based source drain region is included in order to secure simplicity, but it goes without saying that the Si-based source drain region may be included, and a SiGe-based source drain region may be included.

In addition, in the embodiment, the semiconductor substrate has been specifically described by way of example of a P-type single-crystal silicon substrate, but it goes without saying that an N-type single-crystal silicon substrate may be used, as necessary, and a single-crystal silicon substrate of a P-type, an N-type an intrinsic type, or the like may be used.

Further, it goes without saying that the semiconductor substrate may be an SOI substrate without being limited to a single-crystal substrate.

Meanwhile, in the embodiment, mainly, 3 port (differential 3 port) and 4 port (differential 2 port+single ended 2 port) have been specifically described by way of example, but it goes without saying that multi-port embedded SRAMs having other port configurations can also be applied. However, according to the configuration shown herein, particularly, there is an advantage capable of forming a multi-port embedded SRAM having a plurality of fast ports appropriate to processing of an image or the like without extremely increasing the occupied area of a chip.

INDUSTRIAL APPLICABILITY

A technique described in the embodiment can be widely applied to a semiconductor integrated circuit device, an electronic device using the same, and the like.

EXPLANATION OF REFERENCE NUMERALS

1*a*: first main surface or surface (device surface) (of integrated circuit chip or semiconductor substrate)
1*b*: first main surface or rear surface (of integrated circuit chip or semiconductor substrate)
1*s*: P-type single crystal silicon region (substrate region of semiconductor substrate)
2: semiconductor chip (integrated circuit chip or semiconductor substrate)
3: STI region (element isolation region)
4*n*: N-type well region (first conductivity type well region)
4*p*: P-type well region (second conductivity type well region)
5*n*: high-concentration N-type source drain region
6: contact portion (with substrate or gate electrode)
7: premetal insulating film
8, 8*a*, 8*b*, 8*c*, 8*d*: local interconnect (LIC)
9: tungsten plug
10: first-layer interlayer insulating film
12: upper multilayer interconnect layer
15: gate insulating film
16: gate electrode
17: fin
17*d*: drain region of fin
17*s*: source region of fin
18: active region
18*n*1, 18*n*2, 18*n*3, 18*n*31, 18*n*32, 18*n*4, 18*n*41, 18*n*42: active region in which N-type source drain region and the like are formed
18*p*1, 18*p*2: active region in which P-type source drain region and the like are formed
21: 1-2 interlayer via
22: 2-3 interlayer via
AD: address data (address signal)
AN11, AN12, AN13, AN14, AN15, AN16, AN21, AN22, AN23, AN24, AN25, AN26, AN31, AN32, AN33, AN34, AN35, AN36: N-channel type access MISFET
AR: analog circuit region
BL: bit line
BLA: A port true bit line
BLAB: A port complementary bit line
BLB, BLB0, BLB1: B port true bit line
BLB0B, BLB1B, BLBB: B port complementary bit line
BLC, BLC0, BLC1: C port true bit line
BLC0B, BLC1B, BLCB: C port complementary bit line
BLD0B, BLD1B: D port complementary bit line
CC: column control circuit region
CD: column decoder circuit region (or column decoder circuit)
DL: true data line
DLB: complementary data line
DN11, DN12, DN21, DN22, DN31, DN32: N-channel type driver MISFET
DSP: digital signal processing circuit region
EM: embedded SRAM region (or, SRAM circuit)
HVth1, HVth2: high Vth region
LR: logic circuit region
LVth1, LVth2: low Vth region
M1: first embedded wiring
M2: second-layer embedded wiring
M3: third-layer embedded wiring
MA: memory array region (memory cell arrangement region)
MC, MC1, MC2, MC3: memory cell region (memory cell)
MS2: second-layer wiring metal spacer
P11, P12, P21, P22, P31, P32: P-channel type pull-up MISFET
PA: A port
PB: B port
PC: C port
PR: memory peripheral circuit region
RB: data output control circuit
RC: row control circuit
RS: readout data (readout signal)

SAL: latching sense amplifier
SAS: single ended type sense amplifier
SL: long side of rectangular memory cell region
SN: true storage node
SNB: complementary storage node
SP: data storage unit of memory cell region
SS: short side of rectangular memory cell region
TW21, TW22, TW23: second-layer through wiring
Vdd: power supply wiring, power supply or power supply potential
Vss: ground wiring, ground or ground potential
WB: data input control circuit
WD: write drive circuit
WL: word line
WLA1, WLA2, WLA3: A port word line
WLB1, WLB2: B port word line
WLC1, WLC2: C port word line
WLD1, WLD2: D port word line
WS: input data

What is claimed is:

1. A semiconductor integrated circuit device comprising:
a semiconductor substrate; and
a plurality of memory cell regions which are provided in a matrix on the semiconductor substrate;
wherein each memory cell region has a rectangular shape including a first side extending in a first direction and a second side extending in a second direction in a plan view, wherein the first direction is perpendicular to the second direction;
wherein each memory cell region includes:
a first well region which is provided at a central portion of the memory cell region with respect to the first direction; and
a second and third well regions which are provided on both sides of the first well region with respect to the first direction;
wherein first to fourth word lines extending in the first direction are provided for each memory cell region;
wherein the plurality of memory cell regions include a first memory cell region having a first memory cell, a second memory cell region having a second memory cell, and a third memory cell region having a third memory cell;
wherein the first and second memory cell regions are arranged adjacent to each other in the second direction;
wherein the first and third memory cell regions are arranged adjacent to each other in the second direction;
wherein the first memory cell is disposed between the second and third memory cells;
wherein first to sixth bit lines extend in the second direction in each of the first to third memory cell regions;
wherein each of the first to third memory cells includes:
a first storage node;
a second storage node;
a first driver MISFET provided in the second well region such that one of a source terminal and a drain terminal thereof is electrically connected to the first storage node, and a gate electrode thereof is electrically connected to the second storage node;
a second driver MISFET provided in the third well region such that one of a source terminal and a drain terminal thereof is electrically connected to the second storage node, and a gate electrode thereof is electrically connected to the first storage node;
a first access MISFET provided in the second well region such that one of a source terminal and a drain terminal thereof is electrically connected to the first storage node, the other terminal thereof is electrically connected to the first bit line, and a gate electrode thereof is electrically connected to the corresponding first word line;
a second access MISFET provided in the third well region such that one of a source terminal and a drain terminal thereof is electrically connected to the second storage node, the other terminal thereof is electrically connected to the second bit line, and a gate electrode thereof is electrically connected to the corresponding first word line;
a third access MISFET, provided in the second well region such that one of a source terminal and a drain terminal thereof is electrically connected to the first storage node, the other terminal thereof is electrically connected to the third bit line, and a gate electrode thereof is electrically connected to the corresponding third word line;
a fourth access MISFET provided in the third well region such that one of a source terminal and a drain terminal thereof is electrically connected to the second storage node, the other terminal thereof is electrically connected to the fourth bit line, and a gate electrode thereof is electrically connected to the corresponding second word line;
a fifth access MISFET provided in the second well region such that one of a source terminal and a drain terminal thereof is electrically connected to the first storage node, the other terminal thereof is electrically connected to the fifth bit line, and a gate electrode thereof is electrically connected to the corresponding second word line; and
a sixth access MISFET provided in the third well region such that one of a source terminal and a drain terminal thereof is electrically connected to the second storage node, the other terminal thereof is electrically connected to the sixth bit line, and a gate electrode thereof is electrically connected to the corresponding fourth word line.

2. The semiconductor integrated circuit device according to claim 1,
wherein the first side is longer than the second side.

3. The semiconductor integrated circuit device according to claim 1,
wherein the first and second bit lines form a mutually complementary pair, and
wherein the third and fourth bit lines form a mutually complementary pair.

4. The semiconductor integrated circuit device according to claim 1,
wherein the first, third and fourth word lines for the first memory cell region extend between the first and second memory cells, and
wherein the second word line for the first memory cell region extends between the first and third memory cells.

5. The semiconductor integrated circuit device according to claim 1,
wherein each memory cell region further includes:
a first active region that has the first driver MISFET and the first access MISFET formed therein, and has a rectangular shape extending in the second well region in the second direction;

a second active region that has the third access MISFET and the fifth access MISFET formed therein, and has a rectangular shape extending in the second well region in the second direction;

a third active region that has the second driver MISFET and the second access MISFET formed therein, and has a rectangular shape extending in the third well region in the second direction; and a fourth active region that has the fourth access MISFET and the sixth access MISFET formed therein, and has a rectangular shape extending in the third well region in the second direction.

6. The semiconductor integrated circuit device according to claim 5, wherein each memory cell region further includes:

a first local interconnect that interconnects impurity regions of the first active region and the second active region; and a second local interconnect that interconnects impurity regions of the third active region and the fourth active region.

7. The semiconductor integrated circuit device according to claim 6, wherein a width of the first active region in the first direction is larger than a width of the second active region in the first direction, and a width of the third active region in the first direction is larger than a width of the fourth active region in the first direction.

* * * * *